United States Patent
Nagai et al.

(10) Patent No.: US 7,479,213 B2
(45) Date of Patent: Jan. 20, 2009

(54) PLATING METHOD AND PLATING APPARATUS

(75) Inventors: Mizuki Nagai, Tokyo (JP); Hiroyuki Kanda, Tokyo (JP); Keiichi Kurashina, Tokyo (JP); Satoru Yamamoto, Tokyo (JP); Hidenao Suzuki, Tokyo (JP); Koji Mishima, Tokyo (JP); Brett C. Baker-O'Neal, Sleepy Hollow, NY (US); Hariklia Deligianni, Tenafly, NJ (US); Keith Kwietniak, Highland Falls, NY (US)

(73) Assignee: Ebara Corporation, Tokyo (JP)

( * ) Notice: Subject to any disclaimer, the term of this patent is extended or adjusted under 35 U.S.C. 154(b) by 659 days.

(21) Appl. No.: 11/020,068

(22) Filed: Dec. 23, 2004

(65) Prior Publication Data

US 2005/0139482 A1  Jun. 30, 2005

(30) Foreign Application Priority Data

Dec. 25, 2003 (JP) ............................... 2003-431448
Mar. 22, 2004 (JP) ............................... 2004-082102

(51) Int. Cl.
*C25D 5/10* (2006.01)

(52) U.S. Cl. ...................... 205/170; 205/157; 205/171; 205/173; 205/174; 205/182

(58) Field of Classification Search .................. 204/224, 204/242; 205/157, 171, 173, 174, 175, 182
See application file for complete search history.

(56) References Cited

U.S. PATENT DOCUMENTS

| 3,790,377 | A   | * | 2/1974  | Smets et al.     | 430/331  |
|-----------|-----|---|---------|------------------|----------|
| 6,176,992 | B1  |   | 1/2001  | Talieh           |          |
| 6,402,925 | B2  |   | 6/2002  | Talieh           |          |
| 6,632,335 | B2  |   | 10/2003 | Kunisawa et al.  |          |
| 7,128,823 | B2  | * | 10/2006 | Yang et al.      | 205/296  |
| 2002/0027081 | A1 | * | 3/2002  | Nagai et al.    | 205/157  |
| 2002/0130046 | A1 | * | 9/2002  | Cheung et al.   | 205/104  |
| 2004/0031690 | A1 | * | 2/2004  | Tanaka et al.   | 205/74   |
| 2004/0084319 | A1 | * | 5/2004  | Cohen           | 205/118  |
| 2004/0222101 | A1 | * | 11/2004 | Ajmera et al.   | 205/99   |

* cited by examiner

*Primary Examiner*—Bruce F Bell
(74) *Attorney, Agent, or Firm*—Wenderoth, Lind & Ponack, L.L.P.

(57) ABSTRACT

A plating method is capable of preferentially precipitating a plated film fully and uniformly in trenches and via holes according to a mechanical and electrochemical process, and of easily forming a plated film having higher flatness surface without being affected by variations in the shape of trenches and via holes. The plating method includes a first plating process and a second plating process. The second plating process is performed by filling a plating solution between an anode and a substrate, with a porous member placed in the plating solution, repeatedly bringing the porous member and the substrate into and out of contact with each other, passing a current between the anode and the substrate while the porous member is being held in contact with the substrate.

23 Claims, 40 Drawing Sheets

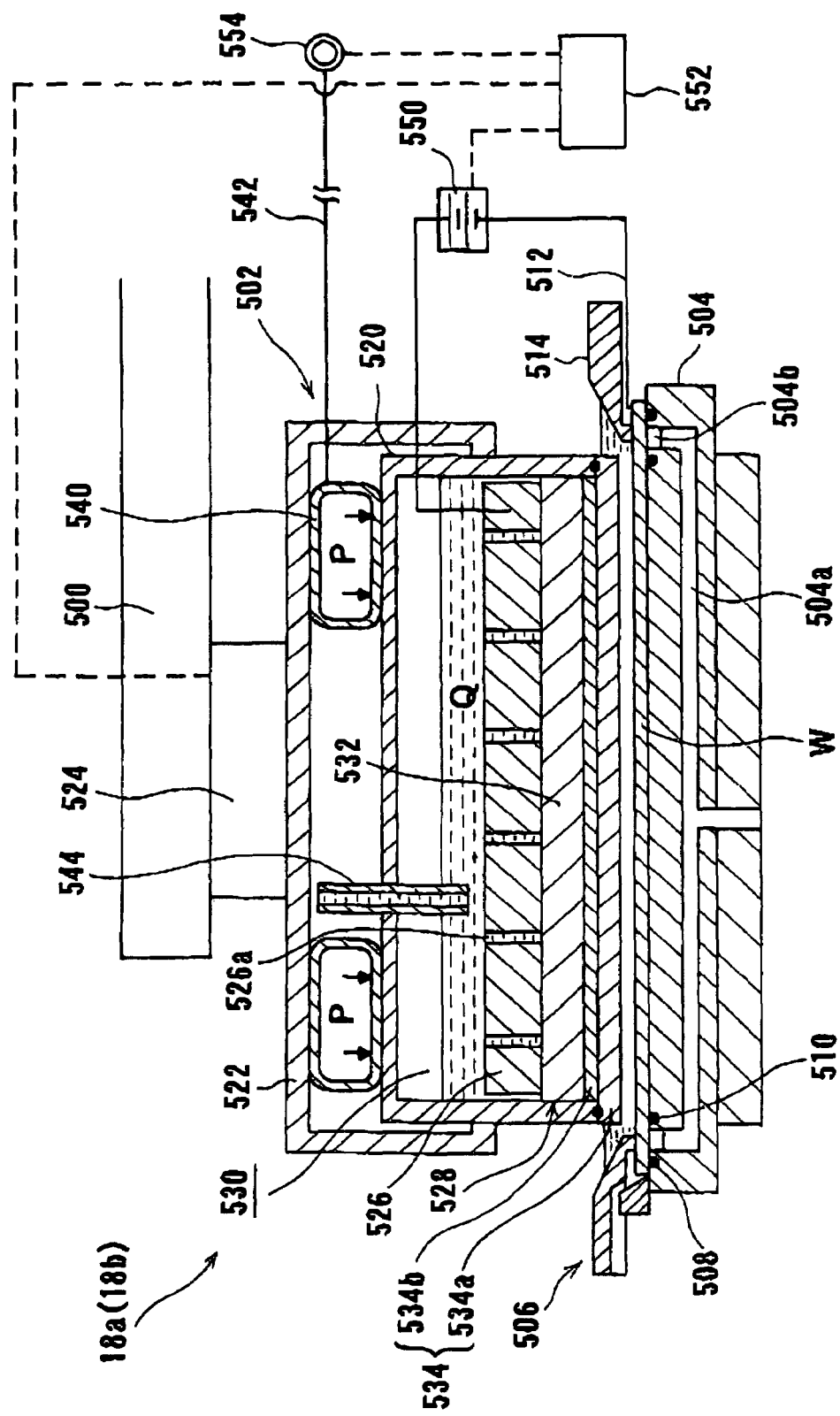

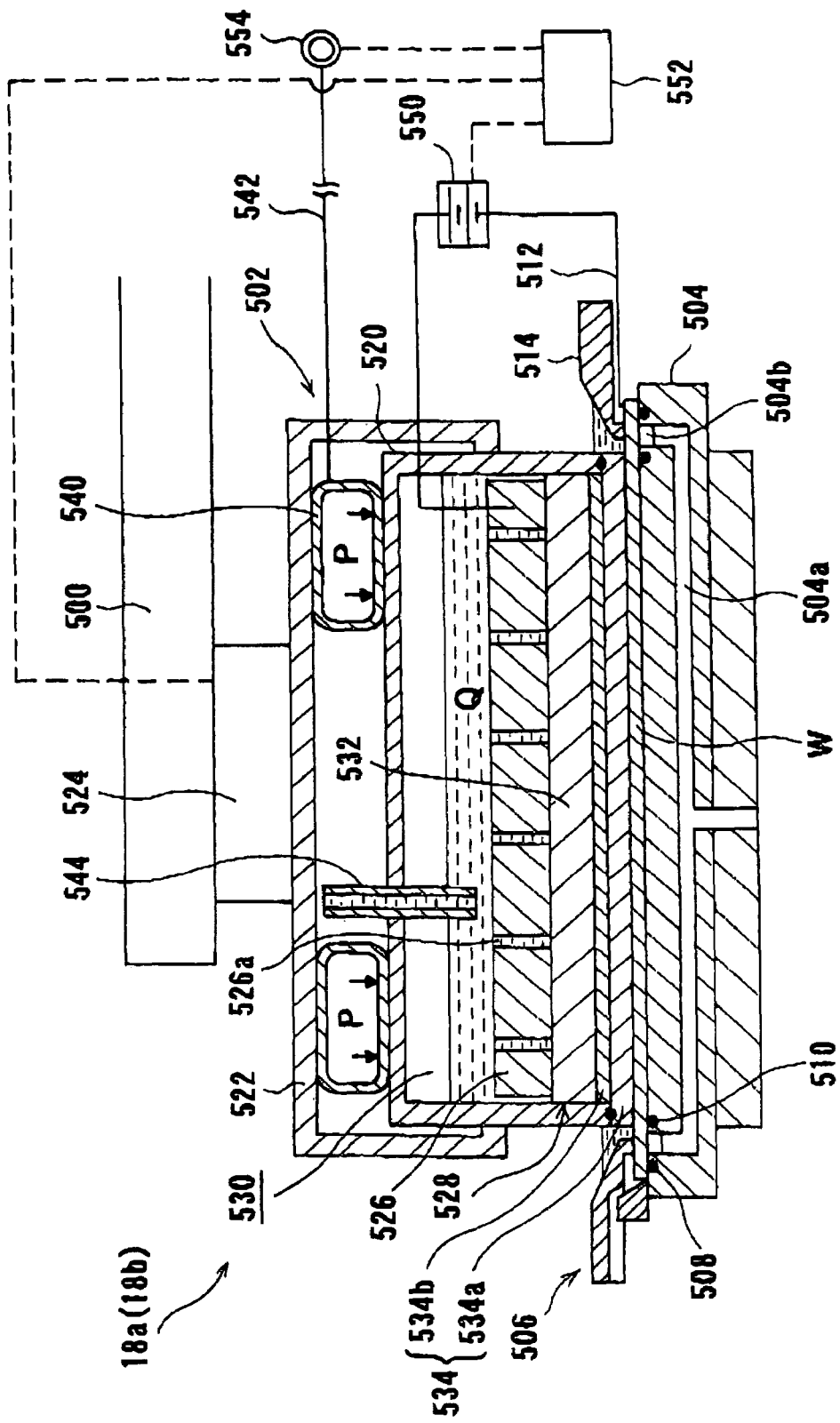

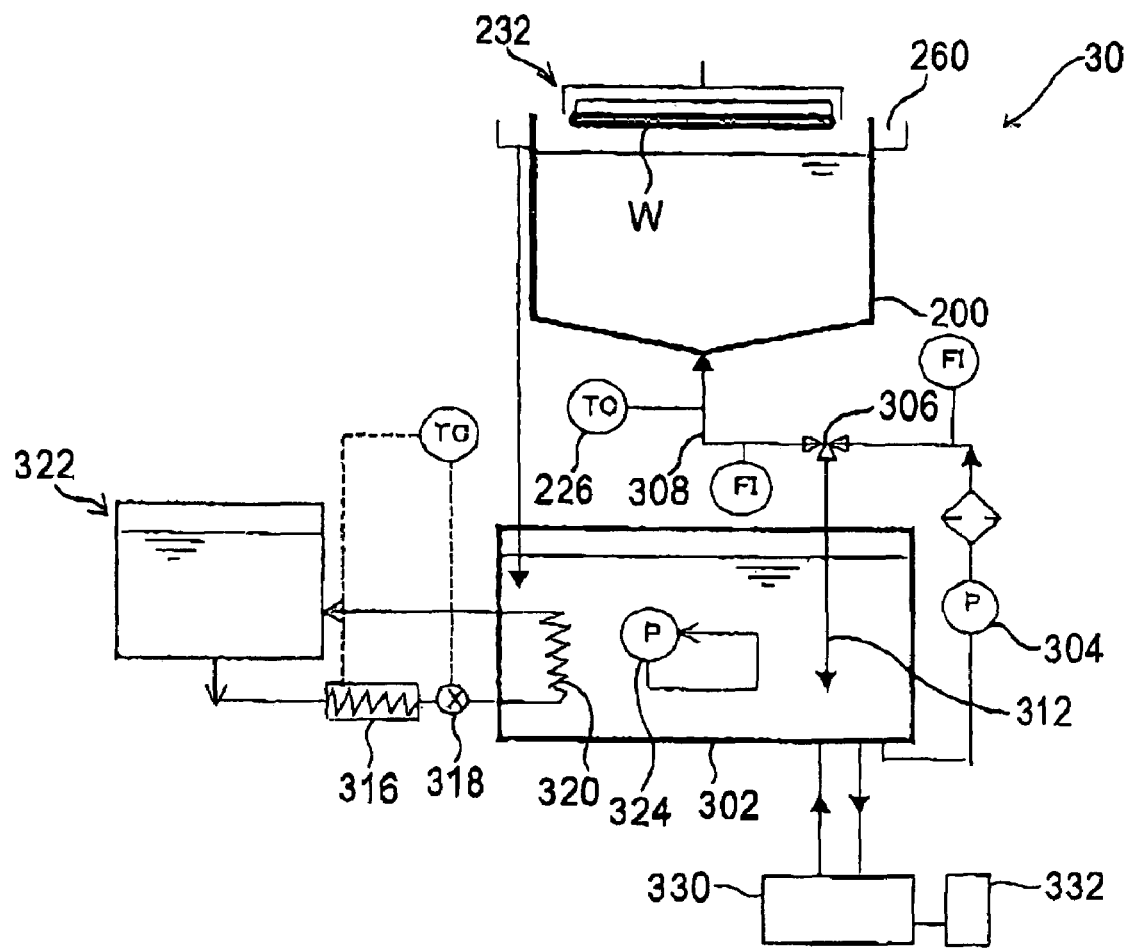
F I G. 24

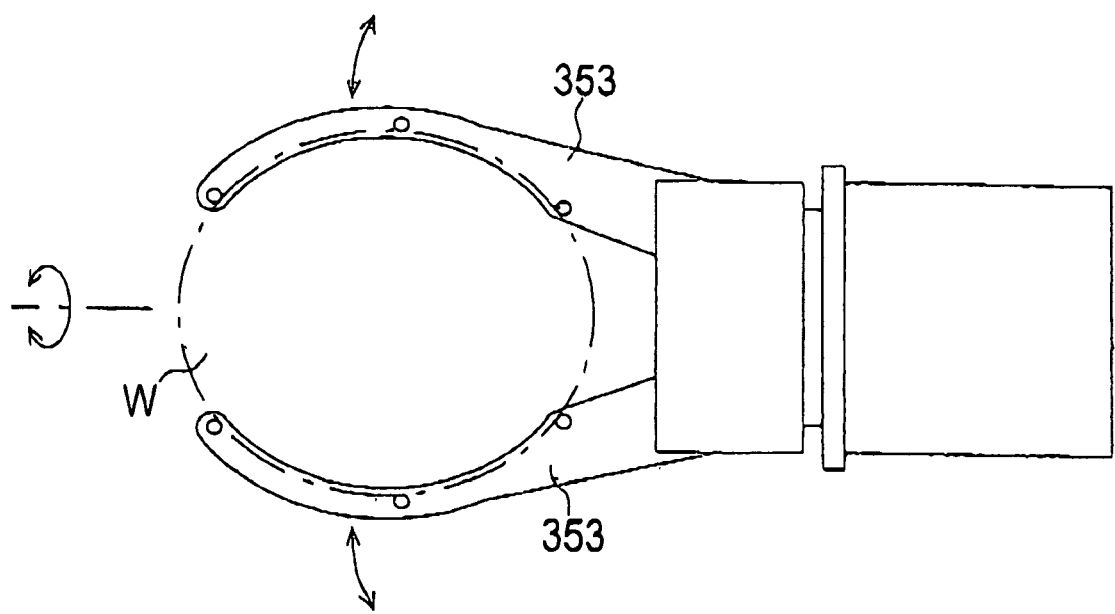
F I G. 2 7

F I G. 4 1
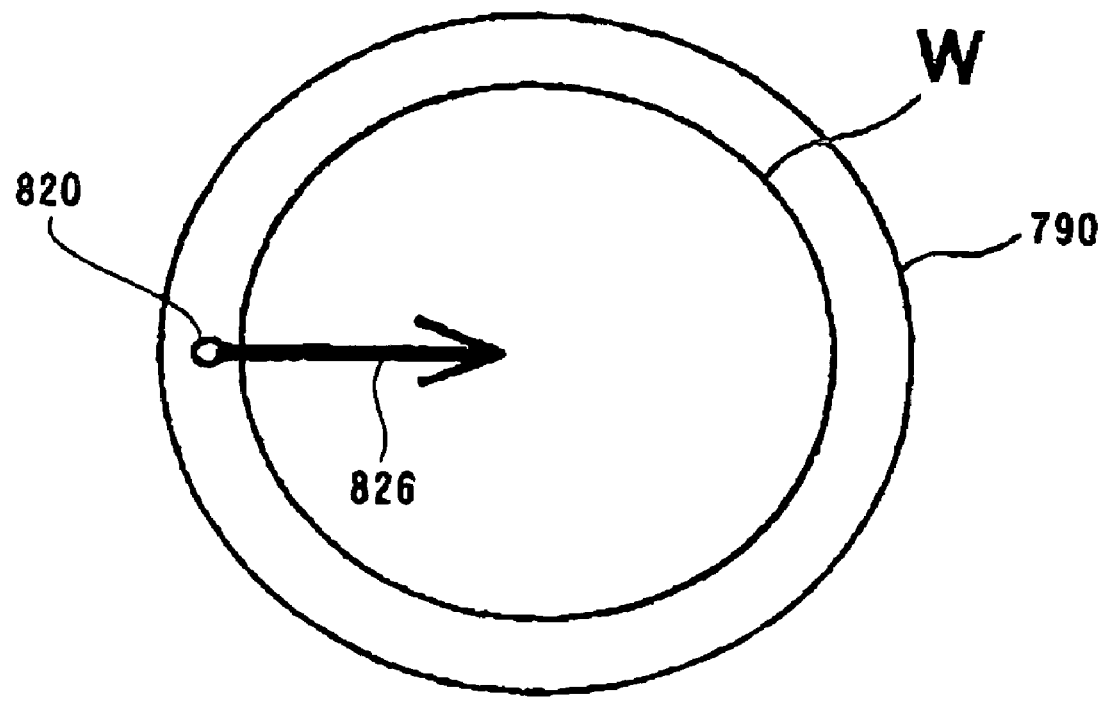

PLATING METHOD AND PLATING APPARATUS

BACKGROUND OF THE INVENTION

1. Field of the Invention

The present invention relates to a plating apparatus and a plating method, and more particularly to a plating apparatus and a plating method used for filling a fine interconnect pattern formed in a substrate, such as a semiconductor wafer, with metal (interconnect material), such as copper, so as to form interconnects.

2. Description of the Related Art

Recently, there has been employed a circuit forming method comprising forming fine recesses for interconnects, such as trenches or via holes in a circuit form, in a semiconductor substrate, embedding the fine recesses with copper (interconnect material) by copper plating, and removing a copper film (plated film) at portions other than the fine recesses by CMP means or the like. In this method, from the viewpoint of reducing loads on subsequent CMP, it is desirable that a copper plated film be deposited selectively in trenches or via holes in a circuit form, and that the amount of copper plated film deposited on portions other than the trenches or via holes be small. In order to achieve such an object, there have heretofore been proposed various ideas regarding a plating solution, such as composition in a bath of a plating solution or a brightener used in a plating solution.

A plating apparatus having the following configuration has been known as this type of plating apparatus used for plating to form fine interconnects having high aspect ratios. A substrate is held in such a state that a surface (surface to be plated) of the substrate faces upward (in a face-up manner). A cathode is brought into contact with a peripheral portion of the substrate so that the surface of the substrate serves as a cathode. An anode is disposed above the substrate. While a region between the substrate and the anode is filled with a plating solution, a plating voltage is applied between the substrate (cathode) and the anode to plate a surface (surface to be plated) of a substrate (for example, see Japanese laid-open patent publication No. 2002-506489).

In a plating apparatus in which a substrate is held and plated in single wafer processing while a surface of the substrate faces upward, a distribution of a plating current can be made more uniform over an entire surface of the substrate to improve uniformity of a plated film over the surface of the substrate. Generally, the substrate is transferred and subjected to various processes in such a state that a surface of the substrate faces upward. Accordingly, it is not necessary to turn the substrate at the time of plating.

Meanwhile, in order to deposit a copper plated film selectively in trenches in a circuit form or the like, there has been known a method of bringing a porous member into contact with a substrate such as a semiconductor wafer, and plating the substrate while relatively moving the porous member in a contact direction (for example, see Japanese laid-open patent publication No. 2000-232078).

In the prior art, however, when plating is performed, the amount of plated material is different in regions of the surface of the substrate depending on the shape of the interconnect pattern, such as trenches and via holes, under the influence of distribution of current density or the influence of additives, and hence it is difficult to form a plated film having a uniform thickness over the entire surface of the substrate. For example, a plated film deposited on an interconnect section having a dense fine interconnect pattern (trenches) is thicker than a plated film deposited on other portions, and a phenomenon called an overplating phenomenon generally occurs. On the other hand, the amount of plated material deposited on an interconnect section having a wide interconnect pattern (trenches) is generally smaller than that on other portions. As a result, in a case where an interconnect pattern is filled entirely with interconnect material such as copper by plating, the thickness of a plated film differs depending on the locations, causing irregularities of the surface of the plated film. When plating is performed according to such method, a greater amount of plated material than necessary is deposited, and hence raw material cost increases and a longer period of plating time is required. Further, loads on a polishing process, such as CMP or the like, after plating increase, and in the next generation in which a low-k material is used as an interlevel dielectric layer, a polishing apparatus will require a considerably high performance. Therefore, it is desirable that the plated film having higher surface flatness is deposited without being affected by variations in the shape of interconnect patterns.

It is desirable to fill up all interconnect patterns (trenches and via holes) uniformly with an interconnect material such as copper or the like, thereby forming interconnects that are free of voids therein. However, it is generally difficult to fill up trenches, particularly for interconnects that are fine and have a high aspect ratio, uniformly with an interconnect material such as copper or the like. It is more difficult to meet the above requirement for depositing a plated film having higher surface flatness without being affected by variations in the shape of interconnect patterns.

In order to solve the above problems, efforts have been made to improve plating solution details such as the composition of a plating bath, a brightener used in the plating solution, etc., and also to improve current conditions. Though these improvements are effective to a certain extent, they are not sufficient to solve the problems, and there are certain limits placed thereon at present.

If finer interconnects are to be formed, then it is preferable to individually perform plating which employs a plating solution suitable for filling finer interconnect patterns and plating which employs a plating solution suitable for reducing overplating. To meet such a need, two plating cells are generally required. Therefore, the plating apparatus not only needs a larger footprint, but also has an increased processing period as it is necessary to transfer substrates between the two cells.

SUMMARY OF THE INVENTION

The present invention has been made in view of the above situation in the background art. It is therefore a first object of the present invention to provide a plating method and a plating apparatus which are capable of preferentially precipitating a plated film fully and uniformly in trenches and via holes according to a mechanical and electrochemical process, and of easily forming a plated film having higher flatness surface without being affected by variations in the shape of trenches and via holes.

It is a second object of the present invention to provide a plating apparatus and a plating method which are capable of forming a plated film having good embedding properties and surface flatness efficiently within a small space regardless of interconnect pattern shape differences.

In order to achieve the above objects, the present invention provides a method of embedding an interconnect material in an interconnect recess formed in a surface of a substrate by electroplating, comprising: filling a plating solution between an anode and the surface of the substrate which is disposed so as to face the anode, and passing a current between the anode and the surface of the substrate, thereby performing a first plating process on the surface of the substrate; and filling a plating solution between the anode and the surface of the substrate which is disposed so as to face the anode, with a porous member placed in the plating solution, repeatedly bringing the porous member and the surface of the substrate into and out of contact with each other, passing a current between the anode and the surface of the substrate while the porous member is being held in contact with the surface of the substrate, thereby performing a second plating process on the surface of the substrate.

According to the above method, the first plating process is performed on the surface of the substrate to fill a plated film fully and uniformly in interconnect recesses, e.g., trenches and via holes, formed in the surface of the substrate, and then the second plating process is performed on the surface of the substrate to grow a plated film on the surface of the substrate while controlling the surface of the plated film to be flattened. Therefore, a plated film is preferentially precipitated fully and uniformly in the trenches and the via holes, and a plated film which has a flatter surface is easily deposited without being affected by variations in the shape of the trenches and the via holes.

Preferably, the interconnect material comprises copper, and the plating solution used in the first plating process is of the same composition as the plating solution used in the second plating process. Therefore, a common plating solution can be used as the plating solutions to simplify the plating processes.

The interconnect material comprises copper, the first plating process may be performed using a plating solution having better embedding properties, and the second plating process may be performed using a plating solution having better leveling capability.

For example, the first plating process may be performed using an ordinary copper sulfate plating solution (general bath) which has excellent embedding properties, and the second plating process may be performed using a copper sulfate plating solution (low-concentration copper bath) having a lower copper sulfate concentration and a higher sulfuric acid concentration than the general bath, and having excellent levering capability, for thereby preventing voids from being formed in interconnects and increasing the flatness of the surface of the plated film.

In the first plating process, the current passed between the anode and the surface of the substrate is preferably changed stepwise. The current density of the current flowing between the anode and the surface of the substrate may be in a range preferable for embedding a plated film in the interconnect recess, e.g., in the range from 1 to 50 $mA/cm^2$, and preferably in the range from 3 to 30 $mA/cm^2$.

Preferably, in the second plating process, a process of passing a current having a current density ranging from 1 to 50 $mA/cm^2$ between the surface of the substrate and the anode for a period of time ranging from 0.1 to 100 seconds while the surface of the substrate is being held in contact with the porous member, and a process of stopping the current from flowing between the surface of the substrate and the anode and releasing the surface of the substrate from the porous member for a period of time ranging from 0.1 to 100 seconds are alternately repeated.

In the second plating process, a process of passing a current having a current density ranging from 1 to 50 $mA/cm^2$ between the surface of the substrate and the anode for a period of time ranging from 0.1 to 100 seconds while the surface of the substrate is being held in contact with the porous member, and a process of stopping the current from flowing between the surface of the substrate and the anode and releasing the surface of the substrate from the porous member for a period of time ranging from 0.1 to 100 seconds are alternately repeated, and the current density of the current flowing between the surface of the substrate and the anode may be increased with time.

Preferably, after the surface of the substrate and the porous member are moved relatively to each other while being held in contact with each other, the current is passed between the surface of the substrate and the anode.

The surface of the substrate may be cleaned between the first plating process and the second plating process.

The present invention also provides a plating apparatus comprising: a apparatus frame; a first plating apparatus disposed in the apparatus frame for filling a plating solution between an anode and a surface of a substrate which is disposed so as to face the anode, and passing a current between the anode and the surface of the substrate, thereby performing a first plating process on the surface of the substrate; and a second plating apparatus disposed in the apparatus frame for filling a plating solution between the anode and the surface of the substrate which is disposed so as to face the anode, with a porous member placed in the plating solution, repeatedly bringing the porous member and the surface of the substrate into and out of contact with each other, passing a current between the anode and the surface of the substrate while the porous member is being held in contact with the surface of the substrate, thereby performing a second plating process on the surface of the substrate.

For example, the second plating apparatus comprises: a substrate holder for holding the substrate; a cathode portion having a sealing member for abutting against a peripheral portion of a surface, to be plated, of the substrate held by the substrate holder thereby to seal the peripheral portion in a watertight manner, and a cathode which is brought into contact with the substrate to supply current to the substrate; an electrode head vertically movably disposed above the cathode portion, and having an anode and a porous member made of a water-retentive material disposed upwardly of the anode; a plating solution introducing portion for introducing a plating solution containing metal ions, a supporting electrolyte, halogen ions, and at least one of an organic sulfur compound, a polymeric compound, and an organic nitrogen compound into a region between the anode and the surface, to be plated, of the substrate held by the substrate holder; a pressing/releasing mechanism for pressing the porous member against the surface, to be plated, of the substrate held by the substrate holder, and releasing the porous member from the surface, to be plated, of the substrate held by the substrate holder; a power source for applying a plating voltage between the cathode and the anode; and a controller for controlling the pressing/releasing mechanism and the power source.

The present invention also provides another plating apparatus comprising: a substrate holder for holding a substrate; a cathode portion having a sealing member for abutting against a peripheral portion of a surface, to be plated, of the substrate held by the substrate holder, and a cathode which is brought into contact with the substrate to supply current to the substrate; an anode disposed so as to face the surface, to be plated, of the substrate; a porous member made of a water-retentive material disposed between the anode and the surface, to be plated, of the substrate; a plating solution-pouring portion for pouring a plating solution into a region between the substrate held by the substrate holder and the porous member; and a basic plating solution-pouring portion for pouring a basic plating solution into the region between the substrate held by the substrate holder and the porous member.

According to the present invention, a plating process which uses the plating solution poured into the region between the substrate held by the substrate holder and the porous member, and a plating process which uses the plating solution having lower additive concentrations that is prepared by pouring a basic plating solution into the plating solution poured into the region between the substrate held by the substrate holder and the porous member are successively performed in the same plating cell. Since the plating process which uses the plating solution having higher additive concentrations for better embedding properties with respect to fine interconnect patterns, and the plating process which uses the plating solution having lower additive concentrations for better flatness are successively performed in the same plating cell, the footprint is reduced and the processing period is shortened for forming a plated film having good embedding properties and a flat surface efficiently within a small space.

The present invention provides still another plating apparatus comprising: a substrate holder for holding a substrate; a cathode portion having a sealing member for abutting against a peripheral portion of a surface, to be plated, of the substrate held by the substrate holder, and a cathode which is brought into contact with the substrate to supply current to the substrate; an anode disposed so as to face the surface, to be plated, of the substrate; a porous member made of a water-retentive material disposed between the anode and the surface, to be plated, of the substrate; a first plating solution-pouring portion for pouring a first plating solution into a region between the substrate held by the substrate holder and the porous member; and a second plating solution-pouring portion for pouring a second plating solution, which has a composition different from the first plating solution, into the region between the substrate held by the substrate holder and the porous member.

According to the present invention, a first plating process which uses the first plating solution poured into the region between the substrate held by the substrate holder and the porous member, and a second plating process which uses the second plating solution, which has a composition different from the first plating solution, poured into the region between the substrate held by the substrate holder and the porous member are successively performed in the same plating cell. Since the first plating process which uses the first plating solution for better embedding properties with respect to fine interconnect patterns, and the second plating process which uses the second plating solution for better flatness are successively performed in the same plating cell, the footprint is reduced and the processing period is shortened for forming a plated film having good embedding properties and a flat surface efficiently within a small space. In addition, plating solutions of different compositions which are suited to the characteristics of the first and second plating processes, respectively, can be used as desired in the first and second plating processes, respectively.

In a preferred embodiment of the present invention, the plating apparatus further comprises a pressing actuator mechanism for changing a pressed state of the porous member against the surface to be plated of the substrate held by the substrate holder.

When the second plating process is performed using the plating solution with the basic plating solution poured thereinto for lower additive concentrations, for example, or the second plating process is performed using the second plating solution, the flatness of the surface of a plated film can further be increased by bringing the porous member into contact with the surface to be plated of the substrate held by the substrate holder.

In a preferred embodiment of the present invention, the plating apparatus further comprises a relative movement mechanism for moving the porous member and the substrate held by the substrate holder relatively to each other.

The substrate is plated while moving the porous member and the substrate held by the substrate holder relatively to each other. When the porous member and the substrate held by the substrate holder are spaced from each other, the plating solution is stirred to disperse the components of the plating solution more uniformly while the substrate is being plated. When the porous member is brought into contact with the surface to be plated of the substrate held by the substrate holder, the substrate is plated while the porous member is in close contact with the surface to be plated of the substrate.

The present invention also provides another plating method comprising: plating a substrate in a first plating process with a first plating solution while spacing a substrate and a porous member made of a water-retentive material from each other by a predetermined distance; and plating the substrate in a second plating process with a second plating solution, which has a composition different from the first plating solution, while bringing the substrate and the porous member into contact with each other.

By performing the first plating process while spacing the substrate and the porous member a predetermined distance from each other, the embedding properties of a plated film deposited on the substrate is increased. By performing the second plating process while holding the substrate and the water-retentive material in contact with each other, the flatness of a plated film deposited on the substrate is enhanced. In addition, plating solutions of different compositions which are suited to the characteristics of the first and second plating processes, respectively, can be used as desired in the first and second plating processes, respectively.

Preferably, the first plating process is performed while the substrate and the porous member are being moved relatively to each other.

The first plating solution is thus stirred to disperse the components of the plating solution more uniformly while the substrate is being plated.

Preferably, the second plating process is performed while the substrate and the porous member are being moved relatively to each other.

The second plating process can be performed while the porous member is held in close contact with the surface to be plated.

Preferably, the first plating solution contains an accelerator, a suppressor, and a leveler added as additives thereto.

By adding additives such as a sulfide called an accelerator for accelerating the size reduction of deposited particles, a polymer called a suppressor for increasing an over voltage for depositing a plating metal such as copper or the like for more uniform electrodeposition, and a nitrogen compound called a leveler for retarding the deposition on raised regions to produce a flat plated film, the uniform electrode position and the leveling capability can be increased.

Preferably, the second plating solution contains an additive which comprises, at a reduced concentration, at least one of the additives added to the first plating solution, or does not contain at least one of the additives added to the first plating solution.

By using a plating solution which contains, at a reduced concentration, at least one of the additives added to the first plating solution, as the second plating solution, even if a plating solution having a composition for excellent embedding properties is used as the first plating solution, for example, a plated film having higher surface flatness can be formed by a plating process using the second plating solution.

In a preferred embodiment of the present invention, after the first plating process is finished, a basic plating solution is poured into the first plating solution, which has been used, to prepare the second plating solution.

The second plating solution whose accelerator, suppressor, and leveler concentrations are lower than the first plating solution can easily be prepared simply by pouring a basic plating solution into the first plating solution.

The first and basic plating solutions may contain a supporting electrolyte comprising sulfuric acid, sulfonic acid, pyrophosphoric acid, or chloride.

Preferably, the basic plating solution contains an optional one of the additives contained in the first plating solution.

When one of the additives, e.g., the leveler, of the accelerator, the suppressor, and the leveler is added to the basic plating solution, and the basic plating solution is poured into the first plating solution, the concentration of the additive, e.g., the leveler, in the second plating solution is prevented from being reduced, so that only the concentration of a particular additive may be reduced.

Preferably, switching the first plating solution for the second plating solution is performed between the first plating process and the second plating process.

In this manner, plating solutions of desired compositions which are suited to the characteristics of the first and second plating processes, respectively, can be used as desired as the first and second plating solutions, respectively.

A surface of the substrate is preferably washed with water and dried when switching of plating solutions is performed between the first plating process and the second plating process.

Preferably, the surface of the substrate is chemically treated after the surface of the substrate is washed with water and dried.

The chemical treatment may be a process of bringing the surface of the substrate into contact with a solution containing a surfactant to improve the wettability of the surface of the substrate, or a process of etching the surface of the substrate.

In a preferred embodiment of the present invention, the first plating process is performed for an electrolyzing time and/or at a current density which is determined based on the size and density of an interconnect pattern formed on the surface of the substrate.

From the size and density of an interconnect pattern formed on the surface of the substrate, the electrolyzing time and/or the current density is changed to plate the substrate to achieve better embedding properties and flatness.

Preferably, the second plating process is performed while monitoring the film thickness of a plated film deposited on a particular interconnect pattern on the surface of the substrate.

Better embedding properties and flatness can be achieved by thus monitoring the film thickness of a plated film deposited on a particular interconnect pattern and controlling the amount of plating electrolysis.

A plating metal may comprise copper and is made of copper sulfate, copper sulfide, copper chloride, or copper fluoride.

BRIEF DESCRIPTION OF THE DRAWINGS

FIG. 3 is a schematic view of a first plating apparatus or a second plating apparatus shown in FIG. 2, showing the manner in which it is used as the first plating apparatus to perform a first plating process.

FIG. 4 is a schematic view of the first plating apparatus or the second plating apparatus shown in FIG. 2, showing the manner in which it is used as the second plating apparatus to perform a second plating process;

FIG. 24 is a systematic diagram of the electroless plating apparatus shown in FIG. 2;

FIG. 27 is a plan view of a reversing arm section of the reversing machine shown in FIG. 2;

FIG. 41 is a view showing the positional relationship between a substrate, a sealing member, and a plating solution-pouring portion of the plating apparatus shown in FIG. 30 when a plating solution is pouring;

DETAILED DESCRIPTION OF THE PREFERRED EMBODIMENTS

Preferred embodiments of the present invention will now be described below with reference to the drawings. The following embodiments show examples in which copper as an interconnect material is embedded in fine interconnect recesses formed in a surface of a substrate, such as a semiconductor wafer, by plating so as to form interconnects composed of a copper film. However, it should be noted that other kinds of interconnect materials may be used instead of copper.

Figure 1A:
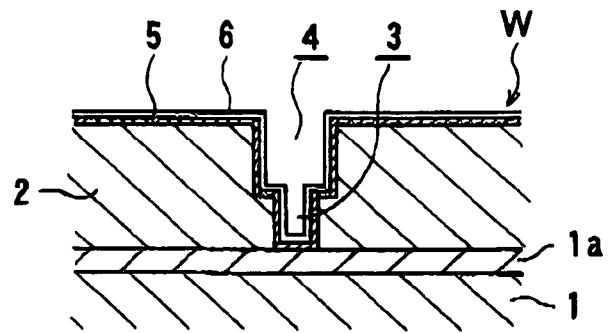
FIGS. 1A through 1D are views showing an example for forming interconnects in a semiconductor device in a sequence of steps.

FIGS. 1A through 1D illustrate an example of forming copper interconnects in a semiconductor device. As shown in FIG. 1A, an insulating film 2, such as an oxide film of $SiO_2$ or a film of low-k material, is deposited on a conductive layer 1a formed on a semiconductor base 1 having formed semiconductor devices. Via holes 3 and trenches 4 are formed in the insulating film 2 by performing a lithography/etching technique so as to provide fine interconnect recesses. Thereafter, a barrier layer 5 of TaN or the like is formed on the insulating film 2, and a seed layer 6 as a feeding layer for electroplating is formed on the barrier layer 5 by sputtering or the like.

Figure 1B:
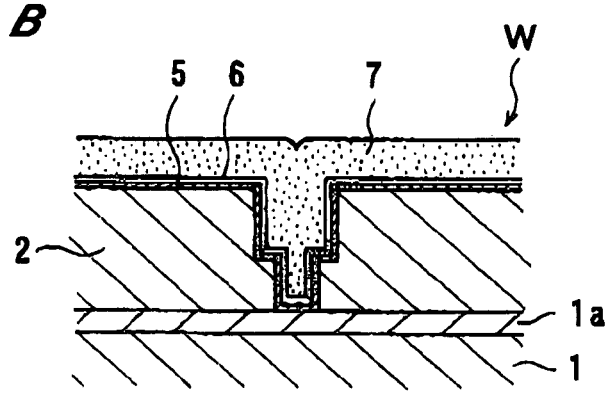
Figure 1C:
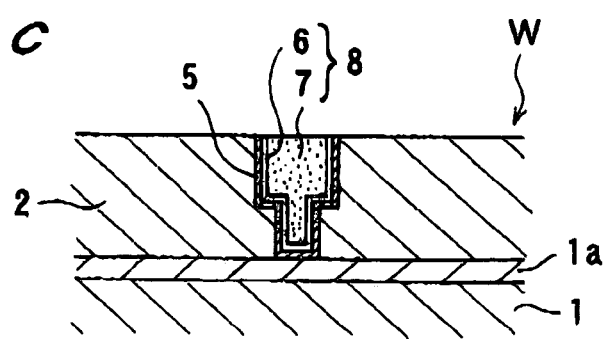

Then, as shown in FIG. 1B, copper plating is performed on the surface of the substrate W to fill the via holes 3 and the trenches 4 with copper and, at the same time, deposit a copper film 7 on the insulating film 2. Thereafter, the barrier layer 5, the seed layer 6 and the copper film 7 on the insulating film 2 are removed by chemical mechanical polishing (CMP) or the like so as to leave copper filled in the via holes 3 and the trenches 4, and have a surface of the insulating film 2 lie substantially on the same plane as this copper. Interconnects (copper interconnects) 8 composed of the seed layer 6 and the copper film 7 are thus formed in the insulating film 2, as shown in FIG. 1C.

Figure 1D:
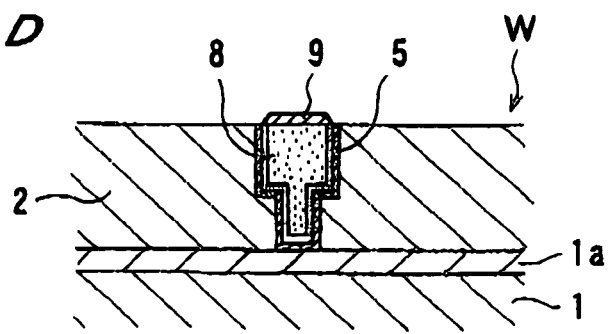

Then, as shown in FIG. 1D, electroless plating is performed on a surface of the substrate W to selectively form a protective film 9 of a Co alloy, an Ni alloy, or the like on surfaces of the interconnects 8, thereby covering and protecting the surfaces of the interconnects 8 with the protective film 9.

Figure 2:
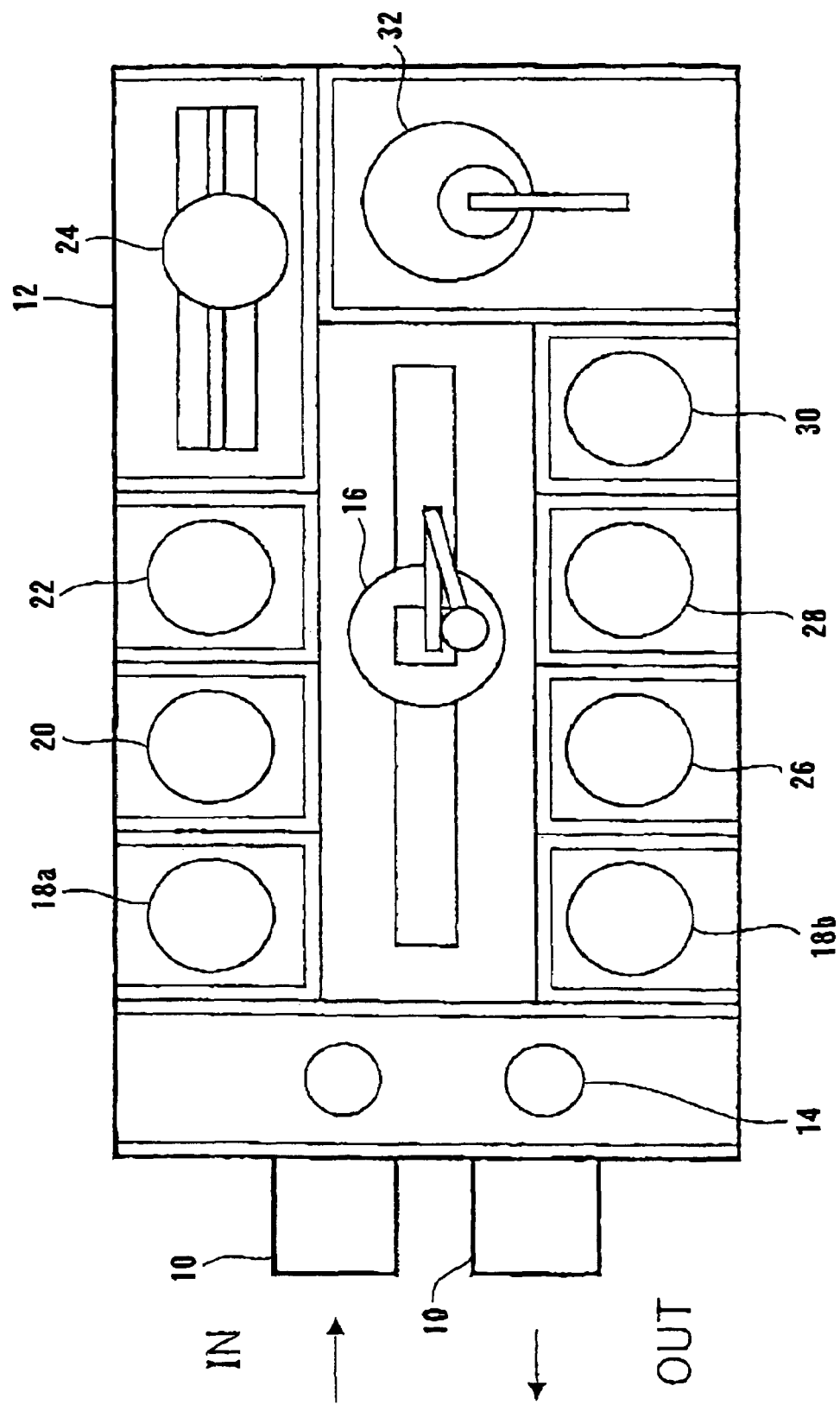
FIG. 2 is a plan view of a substrate processing apparatus incorporating a plating apparatus according to an embodiment of the present invention.

FIG. 2 is a plan view of a substrate processing apparatus incorporating a plating apparatus according to an embodiment of the present invention. As shown in FIG. 2, the substrate processing apparatus comprises a rectangular apparatus frame 12 to which transfer boxes 10 such as SMIF (Standard Mechanical Interface) boxes, which accommodate a number of substrates such as semiconductor wafers, are detachably attached. Inside of the apparatus frame 12, there are disposed a loading/unloading station 14, and a movable transfer robot 16 for transferring a substrate to and from the loading/unloading station 14. A first plating apparatuses 18a and a second plating apparatus 19b are disposed on both sides of the transfer robot 16. A cleaning and drying apparatus 20, a bevel etching and backside cleaning apparatus 22, and a film thickness measuring instrument 24 are disposed in alignment with each other on one side of the transfer robot 16. On the other side of the transfer robot 16, a heat treatment (annealing) apparatus 26, a pretreatment apparatus 28, an electroless plating apparatus 30, and a polishing apparatus 32 are disposed in alignment with each other.

The apparatus frame 12 is shielded so as not to allow a light to transmit therethrough, thereby enabling subsequent processes to be performed under a light-shielded condition in the apparatus frame 12. Specifically, the subsequent processes can be performed without irradiating the interconnects with a light such as an illuminating light. By thus preventing the interconnects from being irradiated with a light, it is possible to prevent the interconnects of copper from being corroded due to a potential difference of light that is caused by application of light to the interconnects composed of copper, for example.

FIG. 3 is a schematic view of the first plating apparatus 18a or the second plating apparatus 18b shown in FIG. 2, showing the manner in which it is used as the first plating apparatus 18a to perform a first plating process. FIG. 4 is a schematic view of the first plating apparatus 18a or the second plating apparatus 18b shown in FIG. 2, showing the manner in which it is used as the second plating apparatus 18b to perform a second plating process. In this embodiment, the first plating apparatus 18a and the second plating apparatus 18b are shown as having an identical structure which is optimum for use as the second plating apparatus 18b. However, the first plating apparatus 18a and the second plating apparatus 18b may have different structures.

Each of the plating apparatuses 18a, 18b comprise a swing arm 500 which is horizontally swingable. An electrode head 502 is rotatably supported at a tip end portion of the swing arm 500. A substrate holder 504 for holding a substrate W in such a state that a surface, to be plated, of the substrate W faces upwardly is vertically movably disposed below the electrode head 502. A cathode portion 506 is disposed above the substrate holder 504 so as to surround a peripheral portion of the substrate holder 504.

In this embodiment, the electrode head 502 whose diameter is slightly smaller than that of the substrate holder 504 is used so that plating can be performed over the substantially entire surface, to be plated, of the substrate W held by the substrate holder 504, without changing a relative position between the electrode head 502 and the substrate holder 504. In this embodiment, the present invention is applied to a so-called face-up type plating apparatus in which the substrate is held and plated in such a state that the front face of the substrate faces upwardly. However, the present invention is applicable to a so-called face-down type plating apparatus in which the substrate is held and plated in such a state that a front face of the substrate faces downwardly, or a so-called vertical-set type plating apparatus in which the substrate is held in a vertical direction and plated.

An annular vacuum attraction groove 504b communicating with a vacuum passage 504a provided in the substrate holder 504 is formed in a peripheral portion of an upper surface of the substrate holder 504. Seal rings 508, 510 are provided on inward and outward sides of the vacuum attraction groove 504b, respectively. With the above structure, the substrates is placed on the upper surface of the substrate holder 504, and the vacuum attraction groove 504b is evacuated through the vacuum passage 504a to attract the peripheral portion of the substrate W, thereby holding the substrate W.

An elevating/lowering motor (not shown) comprising a servomotor and a ball screw (not shown) are used to move the swing arm 500 vertically, and a swinging motor (not shown) is used to rotate (swing) the swing arm 500. Alternatively, a pneumatic actuator may be used instead of the motor.

In this embodiment, the cathode portion 506 has the cathodes 512 comprising six cathodes, and the annular sealing member 514 disposed above the cathodes 512 so as to cover upper surfaces of the cathodes 512. The sealing member 514 has an inner circumferential portion which is inclined inwardly and downwardly so that a thickness of the sealing member 514 is gradually reduced. The sealing member 514 has an inner circumferential edge portion extending downwardly. With this structure, when the substrate holder 504 is moved upwardly, the peripheral portion of the substrate W held by the substrate holder 504 is pressed against the cathodes 512, thus flowing current to the substrate W. At the same time, the inner circumferential edge portion of the sealing member 514 is held in close contact with the upper surface of the peripheral portion of the substrate W to seal a contact portion in a watertight manner. Accordingly, a plating solution that has been supplied onto the upper surface (surface to be plated) of the substrate W is prevented from leaking from the end portion of the substrate W, and the cathodes 512 are thus prevented from being contaminated by the plating solution.

In this embodiment, the cathode portion 506 is not movable vertically, but is rotatable together with the substrate holder 504. However, the cathode portion 506 may be designed to be movable vertically so that the sealing member 514 is brought into close contact with the surface, to be plated, of the substrate W when the cathode portion 506 is moved downwardly.

The above-mentioned electrode head 502 comprises a rotatable housing 522 and a vertically movable housing 520 which have a bottomed cylindrical shape with a downwardly open end and are disposed concentrically. The rotatable housing 522 is fixed to a lower surface of a rotating member 524 attached to a free end of the swing arm 500 so that the rotatable housing 522 is rotated together with the rotating member 524. An upper portion of the vertically movable housing 520 is positioned inside the rotatable housing 522, and the vertically movable housing 520 is rotated together with the rotatable housing 522 and is moved relative to the rotatable housing 522 in a vertical direction. The vertically movable housing 520 defines an anode chamber 530 by closing the lower open end of the vertically movable housing 520 with a porous member 528 so that a disk-shaped anode 526 is disposed in the anode chamber 530 and is immersed in a plating solution Q which is introduced to the anode chamber 530.

In this embodiment, the porous member 528 has a multi-layered structure comprising three-layer laminated porous materials. Specifically, the porous member 528 comprises a plating solution impregnated material 532 serving to hold a plating solution mainly, and a porous pad 534 attached to a lower surface of the plating solution impregnated material 532. This porous pad 534 comprises a lower pad 534a adapted to be brought into direct contact with the substrate W, and an upper pad 534b disposed between the lower pad 534a and the plating solution impregnated material 532. The plating solution impregnated material 532 and the upper pad 534b are positioned in the vertically movable housing 520, and the lower open end of the vertically movable housing 520 is closed by the lower pad 534a.

As described above, since the porous member 528 has a multi-layered structure, it is possible to use the porous pad 534 (the lower pad 534a) which contacts the substrate W, for example, and has flatness enough to flatten irregularities on the surface, to be plated, of the substrate W. The lower pad 534a is required to have the contact surface adapted to contact the surface (surface to be plated) of the substrate W and having a certain degree of flatness, and to have fine through-holes therein for allowing the plating solution to pass therethrough. It is also necessary that at least the contact surface of the lower pad 534a is made of an insulator or a material having high insulating properties. The surface of the lower pad 534a is required to have a flatness having a maximum roughness ($R_{max}$) of about several tens μm or less.

It is desirable that the fine through-holes of the lower pad 534a have a circular cross-section in order to maintain flatness of the contact surface. An optimum diameter of each of the fine through-holes and the optimum number of the fine through-holes per unit area vary depending on film properties to be plated and an interconnect pattern. However, it is desirable that both the diameter and the number are as small as possible in view of improving selectivity of a plated film which is growing in recesses. Specifically, the diameter of each of the fine through-holes may be not more than 30 μm, preferably in the range of 5 to 20 μm. The number of the fine through-holes having such diameter per unit area may be represented by a porosity of not more than 50%.

Further, it is desirable that the lower pad 534a has a certain degree of hardness. For example, the lower pad 534a may have a tensile strength ranging from 5 to 100 kg/cm$^2$ and a bend elastic strength ranging from 200 to 10000 kg/cm$^2$.

Furthermore, it is desirable that the lower pad 534a is made of hydrophilic material. For example, the following materials may be used after being subjected to hydrophilization or being introduced with a hydrophilic group by polymerization. Examples of such materials include porous polyethylene (PE), porous polypropylene (PP), porous polyamide, porous polycarbonate, and porous polyimide. The porous PE, the porous PP, the porous polyamide, and the like are produced by using fine powder of ultrahigh-molecular polyethylene, polypropylene, and polyamide, or the like as a material, squeezing the fine powder, and sintering and forming the squeezed fine powder. These materials are commercially available. For example, "Furudasu S (trade name)" manufactured by Mitsubishi Plastics, Inc, "Sunfine UH (trade name)", "Sunfine AQ (trade name)", both of which are manufactured by Asahi Kasei Corporation, and "Spacy (trade name)" manufactured by Spacy Chemical Corporation are available on the market. The porous polycarbonate may be produced by passing a high-energy heavy metal such as copper, which has been accelerated by an accelerator, through a polycarbonate film to form straight tracks, and then selectively etching the tracks.

The lower pad 534a may be produced by a flattening process in which the surface, to be brought into contact with the surface of the substrate W, of the lower pad 534a is compacted or machined to a flat finish for thereby enabling a high-preferential deposition in fine recesses.

On the other hand, the plating solution impregnated material 532 is, for example, composed of porous ceramics such as alumina, SiC, mullite, zirconia, titania or cordierite, or a hard porous member such as a sintered compact of polypropylene or polyethylene, or a composite material comprising these materials. The plating solution impregnated material 532 may be composed of a woven fiber or anon-woven fiber. In case of the alumina-based ceramics, for example, the ceramics with a pore diameter of 30 to 200=m is used. In case of the SiC, SiC with a pore diameter of not more than 30 μm, a porosity of 20 to 95%, and a thickness of about 1 to 20 mm, preferably 5 to 20 mm, more preferably 8 to 15 mm, is used. The plating solution impregnated material 532, in this embodiment, is composed of porous ceramics of alumina having a porosity of 30%, and an average pore diameter of 100 μm. The porous ceramic plate per se is an insulator, but is constructed so as to have a smaller electrical conductivity than the plating solution by causing the plating solution to enter its inner part complicatedly and follow a considerably long path in the thickness direction.

In this manner, the plating solution impregnated material 532 is disposed in the anode chamber 530, and generates high resistance. Hence, the influence of the resistance of the seed layer 6 (see FIG. 1) becomes an egligible degree. Consequently, the difference in current density over the surface of the substrate due to electrical resistance on the surface of the substrate W becomes small, and the uniformity of the plated film over the surface of the substrate improves.

The electrode head 502 has a pressing/releasing mechanism comprising an air bag 540, in this embodiment, for pressing the lower pad 534a against the surface (surface to be plated) of the substrate W held by the substrate holder 504 under a desired pressure, and releasing the lower pad 534a from the surface of the substrate W. Specifically, in this embodiment, a ring-shaped air bag (pressing/releasing mechanism) 540 is provided between the lower surface of the top wall of the rotatable housing 522 and the upper surface of the top wall of the vertically movable housing 520. This air bag 540 is connected to a pressurized fluid source 554 through a fluid introduction pipe 542.

Thus, the swing arm 500 is fixed at a predetermined position (process position) so as not to move vertically, and then the inner part of the air bag 540 is pressurized under a pressure of P, whereby the lower pad 534a is uniformly pressed against the surface (surface to be plated) of the substrate W held by the substrate holder 504 under a desired pressure. Thereafter, the pressure P is restored to an atmospheric pressure, whereby pressing of the lower pad 534a against the substrate W is released to separate the lower pad 534a from the surface of the substrate W.

In the first plating apparatus 18a, it is not necessary to uniformly press the lower pad 543a against the surface (surface to be plated) of the substrate W held by the substrate holder 504 under a desired pressure, as described below, therefore the air bag (pressing/releasing mechanism) 540 may be omitted. The pad having enough flatness may be used as the lower pad 534a.

A plating solution introduction pipe 544 is attached to the vertically movable housing 520 to introduce the plating solution into the vertically movable housing 520, and a pressurized fluid introduction pipe (not shown) is attached to the vertically movable housing 520 to introduce a pressurized fluid into the vertically movable housing 520. A number of pores 526a are formed within the anode 526. Thus, a plating solution Q is introduced from the plating solution introduction pipe 544 into the anode chamber 530, and the inner part of the anode chamber 530 is pressurized, whereby the plating solution Q reaches the upper surface of the plating solution impregnated material 532 through the pores 526a of the anode 526, and reaches the upper surface of the substrate W held by the substrate holder 504 through the inner part of the plating solution impregnated material 532 and inner part of the porous pad 534 (the upper pad 534b and the lower pad 534a).

The anode chamber 530 includes gases generated by chemical reaction therein, and hence the pressure in the anode chamber 530 may be varied. Therefore, the pressure in the anode chamber 530 is controlled to a certain set value by a feedback control in the process.

For example, in the case of performing copper plating, in order to suppress slime formation, the anode 526 is made of copper (phosphorus-containing copper) containing 0.03 to 0.05% of phosphorus. The anode 526 may comprise an insoluble metal such as platinum or titanium, or an insoluble electrode comprising metal on which platinum, iridium oxide or the like is coated or plated. Since replacement or the like is unnecessary, the insoluble metal or the insoluble electrode is preferable. Further, the anode 526 may be a net-like anode which allows a plating solution to pass therethrough easily.

The cathodes 512 are electrically connected to a cathode of a plating power source 550, and the anode 526 is electrically connected to an anode of the plating power source 550, respectively. The plating power source 550, the pressurized fluid source 554 for supplying a pressurized fluid to the air bag 540 as a pressing/releasing mechanism, and the rotating member 524 for rotating the rotatable housing 522 and the vertically movable housing 520 in unison with each other are controlled by control signals outputted from a controller 552.

According to this embodiment, a first plating process for achieving excellent embedding properties is performed onto the surface of the substrate W in the first plating apparatus 18a, thereby embedding a copper plated film fully and uniformly in via holes 3 and trenches 4 (see FIG. 1A) that are formed in the surface of the substrate W. A plating solution used in the first plating process contains, besides copper ions as highly electrically conductive metal ions, a supporting electrolyte and halogen ions. An organic additive may be added to the plating solution for improving the embedding properties. In the electroplating process, the current density of a current that flows between the surface of the substrate W and the anode 526 is in a range preferable for embedding a plated film in via holes and trenches, e.g., in the range from 1 to 50 mA/cm$^2$, and preferably in the range from 3 to 30 mA/cm$^2$. The current density of the current that flows during electroplating may be varied in the above range.

The copper ions in the plating solution should preferably have a concentration in the range from 30 to 60 g/L. The supporting electrolyte should preferably comprise sulfuric acid. The sulfuric acid in the plating solution should preferably have a concentration in the range from 10 to 100 g/L. The halogen ions should preferably comprise chlorine ions, and the chlorine ions in the plating solution should preferably have a concentration in the range from 30 to 90 mg/L. A small amount of organic additive may be added to the plating solution for improving the embedding properties.

Then, a second plating process for achieving excellent flatness is performed onto the surface of the substrate W in the second plating apparatus 8b, thereby depositing a copper plated film on the surface of the copper plated film formed in the first plating process while controlling the plated film surface to be flattened. In the second plating process, a plating solution having the same composition used in the first plating process may be used. Thus, the first and second plating processes may be performed using an ordinary copper sulfate plating solution (general bath) that has excellent embedding properties. The second plating process may be performed using a copper sulfate plating solution (low-concentration copper bath) having a lower copper sulfate concentration and a higher sulfuric acid concentration than the general bath and having an excellent flattening capability, for thereby preventing voids from being formed in interconnects and enhancing the flatness of the surface of the plated film.

Operation of the first plating apparatus 18a to carry out the first plating process will be described below with reference to FIG. 3. First, the substrate W is attracted to and held on the upper surface of the substrate holder 504. Then, the substrate holder 504 is lifted to bring the peripheral portion of the surface to be plated of the substrate W with the seed layer 6 shown in FIG. 1A formed thereon, into contact with the cathodes 512, thus flowing current to the substrate W. Further, the sealing member 514 is pressed against the upper surface of the peripheral portion of the surface to be plated of the substrate W, sealing the peripheral portion of the surface to be plated of the substrate W in a watertight manner.

The electrode head 502 is displaced from a position (idling position), where it idles to replace the plating solution and remove air bubbles in the plating solution, to a predetermined position (process position) while holding the plating solution Q therein. Specifically, the swing arm 500 is lifted and then turned to bring the electrode head 502 into a position right above the substrate holder 504. Then, the swing arm 500 is lowered to lower the electrode head 502, and then stopped to stop the electrode head 502 when the lower pad 534a reaches a position which is kept out of contact with the surface of the substrate W held by the substrate holder 504, but closely spaced therefrom by a distance ranging from 0.1 to 3 mm. The anode chamber 530 is then pressurized to eject the plating solution Q held in the electrode head 502 from the lower surface of the porous pad 534, whereby spreading the plating solution Q over the substrate W.

After the plating solution Q is spread over the substrate W, and while the lower pad 534a is being held closely to the surface of the substrate W, the cathodes 512 are connected to the cathode of the plating power source 550 and the anode 526 is connected to the anode of the plating power source 550. Now, a current having a current density in the range from 1 to 50 mA/cm², for example, preferably in the range from 3 to 30 mA/=2, flows between the surface (seed layer 6) to be plated of the substrate W and the anode 526, thereby performing the first plating process on the surface (surface of the seed layer 6) to be plated of the substrate W. At this time, if necessary, the substrate W held by the substrate holder 504 is rotated at a low speed. During the first plating process, the current density of the current that flows between the surface (seed layer 6) to be plated of the substrate W and the anode 526 may be varied in the above range.

After the copper plated film reaches a predetermined film thickness, the cathodes 512 and the anode 526 are disconnected from the plating power source 550, terminating the first plating process.

Operation of the second plating apparatus 18b to carry out the second plating process will be described below with reference to FIG. 4. As with the first plating process, the substrate holder 504, which is holding the substrate W, is lifted to bring the peripheral portion of the surface to be plated of the substrate W into contact with the cathodes 512, and the sealing member 514 is pressed against the upper surface of the peripheral portion of the surface to be plated of the substrate W.

The electrode head 502 is displaced from the idling position to the process position while holding the plating solution Q therein. Specifically, the swing arm 500 is lifted and then turned to bring the electrode head 502 into the position right above the substrate holder 504. Then, the swing arm 500 is lowered and then stopped when the electrode head 502 reaches the process position. The anode chamber 530 is pressurized to eject the plating solution Q held in the electrode head 502 from the lower surface of the porous pad 534, spreading the plating solution Q over the substrate W. Then, pressurized air is introduced into the air bag 540 to press the lower pad 534a downwardly and bring the lower pad 534a into contact with the upper surface (surface to be plated) of the substrate W held by the substrate holder 504 under a desired pressure.

After the plating solution Q is spread over the substrate W, and while the lower pad 534a is being held in contact with the surface of the substrate W, the substrate W held by the substrate holder 504 is rotated two revolutions at a speed of one revolution per second, for example, to rub the surface (lower surface) of the lower pad 534a against the surface of the substrate W. Thereafter, the substrate W is stopped against rotation. Alternatively, the substrate W may be fixed and the lower pad 534a may be rotated. Preferably within two seconds after the substrate W is stopped against rotation, the cathodes 512 are connected to the cathode of the plating power source 550 and the anode 526 is connected to the anode of the plating power source 550. Now, a current having a current density in the range from to 50 mA/cm², for example, flows between the surface to be plated of the substrate W and the anode 526, thereby performing the second plating process on the surface (surface of the plated film formed by the first plating process) to be plated of the substrate W.

As described above, the lower pad 534a composed of the porous member 528 and the surface to be plated of the substrate W held by the substrate holder 504 are held in contact with each other and moved relatively to each other, after which the electroplating process is performed. Therefore, the precipitation of the plated film in upper portions of the interconnect patterns is reduced to lower the plating rate, allowing the plated film to be precipitated preferentially in trenches 4 and via holes 3 (see FIG. 1A).

After the electroplating is continued for a predetermined period of time, e.g., in the range from 0.1 to 100 seconds, the cathodes 512 and the anode 526 are disconnected from the plating power source 550, and the pressure in the air bag 540 is returned to the atmospheric pressure. The lower pad 534a is now released from the plated surface of the substrate W, which is then left to stand for a predetermined period of time, e.g., in the range from 0.1 to 100 seconds.

The above sequence, in which the lower pad 534a is brought into contact with the surface of the substrate W, the lower pad 534a and the substrate W are moved relatively to each other, and thereafter the cathodes 512 are connected to the cathode of the plating power source 550 and the anode 526 is connected to the anode of the plating power source 550 to plate the substrate W for a predetermined period of time, after which the cathodes 512 and the anode 526 are disconnected from the plating power source 550, and the lower pad 534a is released from the plated surface of the substrate W, which is then left to stand for a predetermined period of time, is regarded as one cycle, and the cycle is repeated a predetermined number of times, e.g., fifteen times. After the copper film 7 (see FIG. 1B), which is thick enough to fill fine interconnect recesses, is deposited on the surface (surface to be plated) of the substrate W through the plating operation, the electrode head 502 is turned back to the original position, i.e., the idling position.

As described above, the first plating process is performed onto the surface of the substrate to embed a plated film fully and uniformly in fine interconnect recesses, e.g., trenches and via holes, formed in the surface of the substrate, and then the second plating process is performed onto the surface of the substrate to grow a plated film on the surface of the substrate while controlling the plated film surface to be flattened. In this manner, it is possible to preferentially precipitate a plated film fully and uniformly in trenches and via holes, and to easily form a plated film having a flatter surface without being affected by variations in the shape of trenches and via holes.

If the above cycle is repeated twelve times in the second plating process, then the current density of the current that flows between the surface (surface of the plated film) to be plated of the substrate W and the anode 526 may be set to 10 mA/cm$^2$ in the first six cycles and to 20 mA/cm$^2$ in the subsequent six cycles, so that the current density increases with time.

In this embodiment, the substrate holder 504 is rotated to move the substrate W held by the substrate holder 504 and the lower pad 534a relatively to each other. However, at least one of the lower pad 534a and the substrate W held by the substrate holder 504 may be revolved around some axis with respect to each other. In addition, at least one of the lower pad 534a and the substrate W held by the substrate holder 504 may be moved vertically and/or vibrated.

Figure 5:
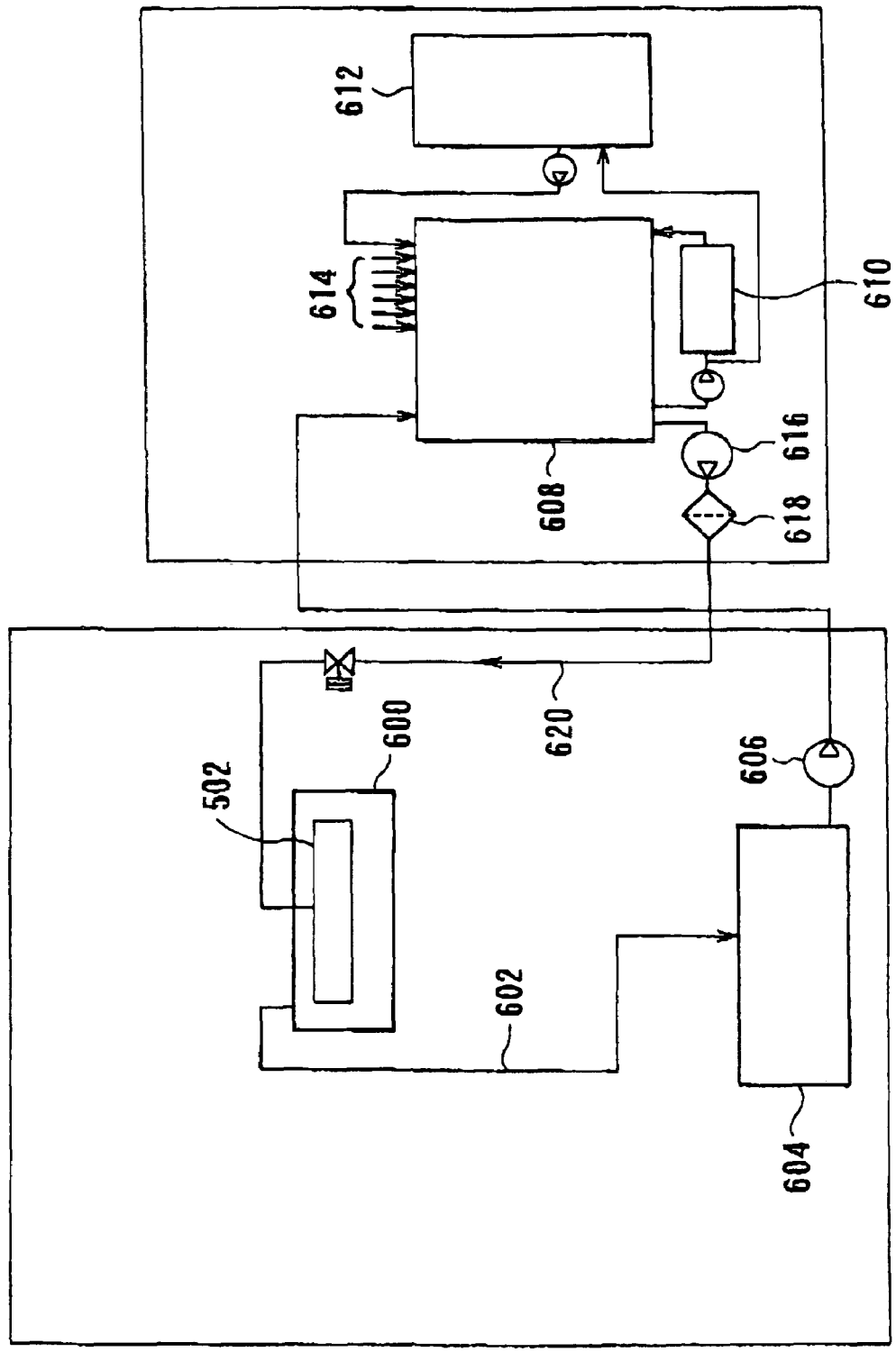
FIG. 5 is a systematic diagram showing an example of a plating solution management and supply system.

FIG. 5 shows a plating solution management and supply system for supplying a plating solution whose composition, temperature, and the like are controlled to the plating apparatuses 18a, 18b. As shown in FIG. 5, a plating solution tray 600 for allowing the electrode head 502 each of the plating apparatuses 18a, 18b to be immersed for idling is provided, and the plating solution tray 600 is connected to a reservoir 604 through a plating solution discharge pipe 602. The plating solution discharged through the plating solution discharge pipe 602 flows into the reservoir 604.

The plating solution which has flowed into the reservoir 604 is introduced into the plating solution regulating tank 608 by operating a pump 606. This plating solution regulating tank 608 is provided with a temperature controller 610, and a plating solution analyzing unit 612 for sampling the plating solution and analyzing the sample solution. Further, component replenishing pipes 614 for replenishing the plating solution with components which are found to be insufficient by an analysis performed by the plating solution analyzing unit 612 are connected to the plating solution regulating tank 608. When a pump 616 is operated, the plating solution in the plating solution regulating tank 608 flows in a plating solution supply pipe 620, passes through a filter 618, and is then returned to the plating solution tray 600.

In this manner, the composition and temperature of the plating solution is adjusted to be constant in the plating solution regulating tank 608, and the adjusted plating solution is supplied to the electrode head 502 each of the plating apparatuses 18a, 18b. Then, by holding the adjusted plating solution by the electrode head 502, the plating solution having constant composition and temperature at all times can be supplied to the electrode head 502 each of the plating apparatuses 18a, 18b.

Figure 6:
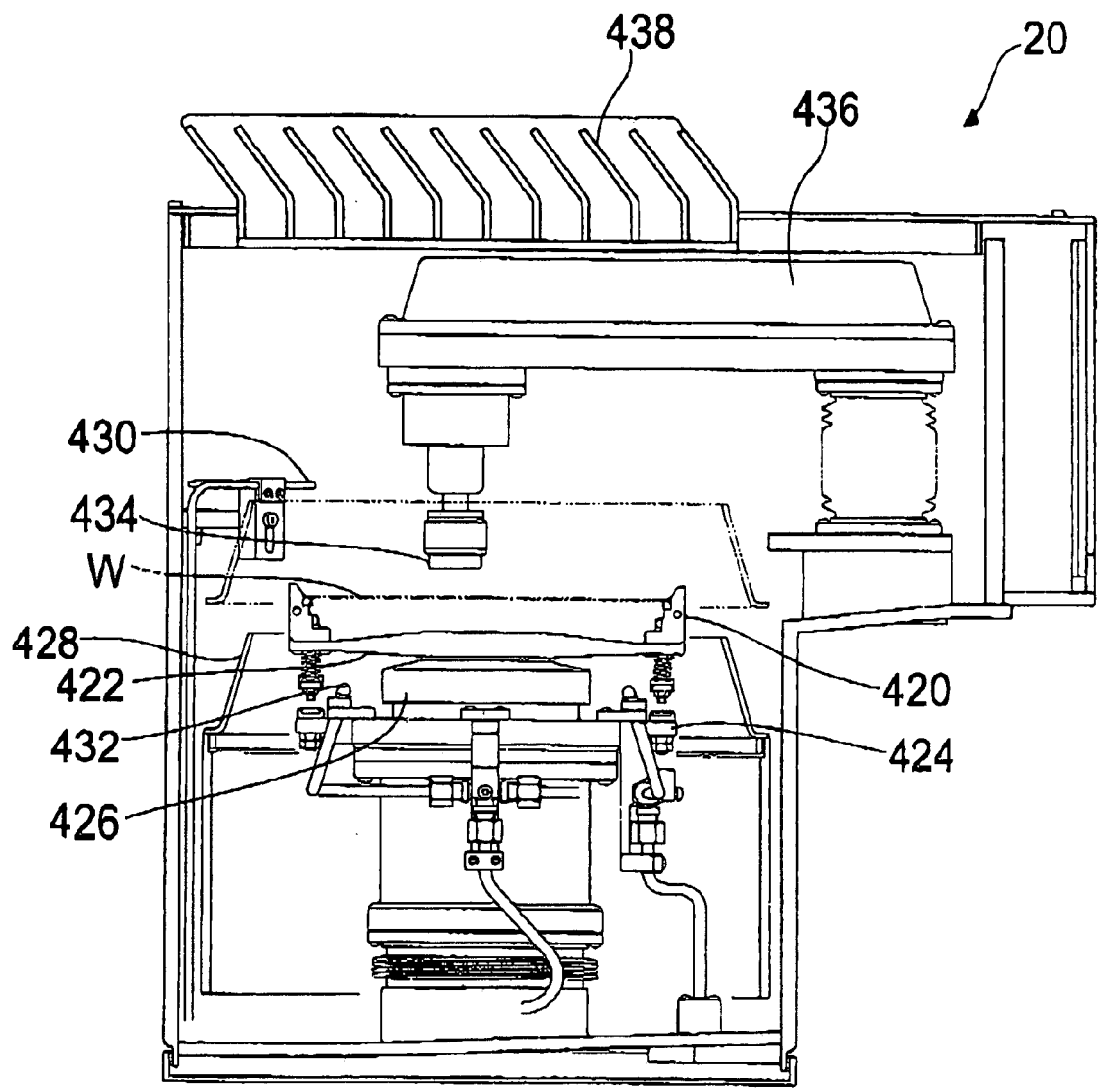
FIG. 6 is a front cross-sectional view showing an example of a cleaning and drying apparatus shown in FIG. 2.
Figure 7:
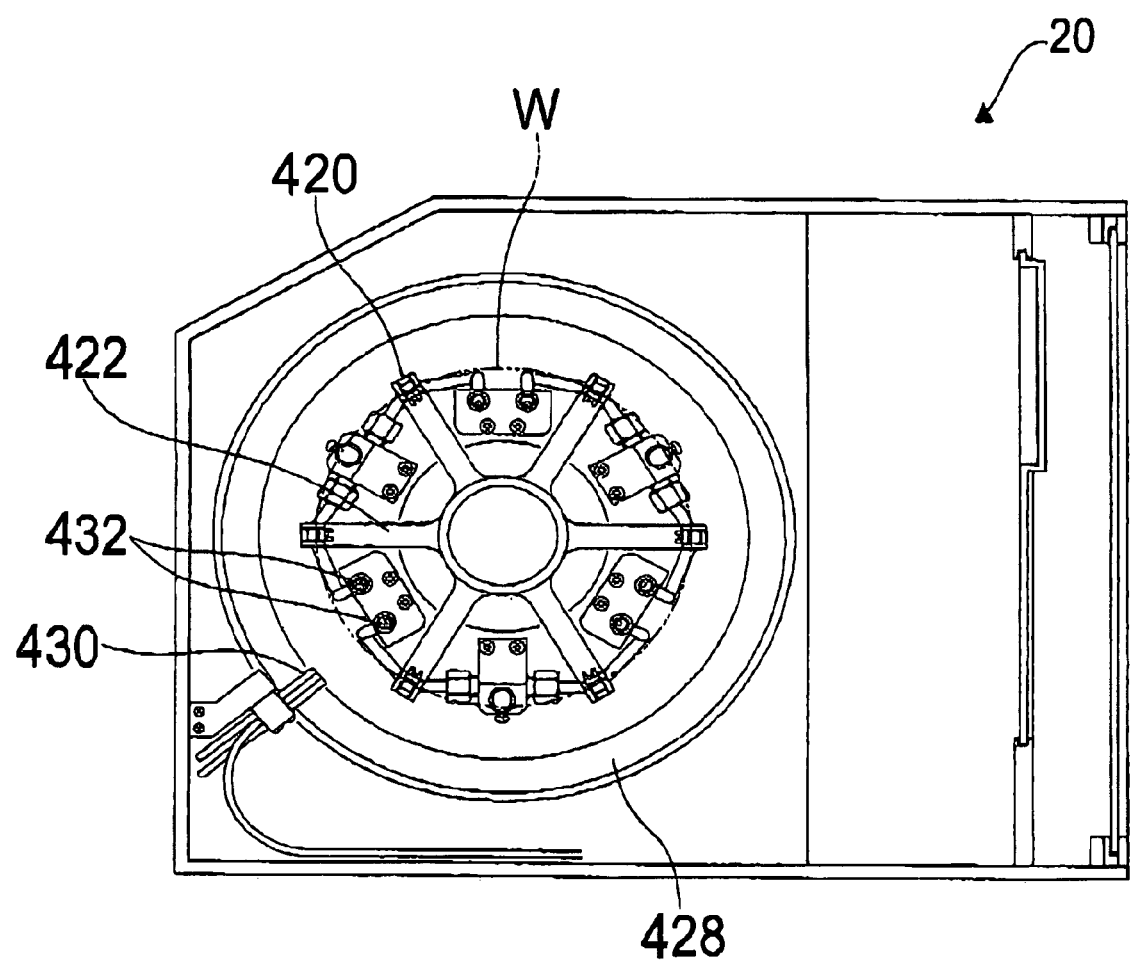
FIG. 7 is a plan view showing an example of the cleaning and drying apparatus shown in FIG. 6.

FIGS. 6 and 7 show an example of a cleaning and drying apparatus 20 for cleaning (rinsing) the substrate W and drying the substrate W. Specifically, the cleaning and drying apparatus 20 performs chemical cleaning and pure water cleaning (rinsing) first, and then completely drying the substrate W which has been cleaned by spindle rotation. The cleaning and drying apparatus 20 comprises a substrate stage 422 having a clamp mechanism 420 for clamping an edge portion of the substrate W, and a substrate mounting and removing lifting/lowering plate 424 for opening and closing the clamp mechanism 420.

The substrate stage 422 is coupled to an upper end of a spindle 426 which is rotated at a high speed by the actuation of a spindle rotating motor (not shown). Further, a cleaning cup 428 for preventing a treatment liquid from being scattered around is disposed around the substrate W held by the clamp mechanism 420, and the cleaning cup 428 is vertically moved by actuation of a cylinder (not shown).

Further, the cleaning and drying apparatus 20 comprises a chemical liquid nozzle 430 for supplying a treatment liquid to the surface of the substrate W held by the clamp mechanism 420, a plurality of pure water nozzles 432 for supplying pure water to the backside surface of the substrate W, and a pencil-type cleaning sponge 434 which is disposed above the substrate W held by the clamp mechanism 420 and is rotatable. The pencil-type cleaning sponge 434 is attached to a free end of a swing arm 436 which is swingable in a horizontal direction. Clean air introduction ports 438 for introducing clean air into the apparatus are provided at the upper part of the cleaning and drying apparatus 20.

With the cleaning and drying apparatus 20 having the above structure, the substrate W is held by the clamp mechanism 420 and is rotated by the clamp mechanism 420, and while the swing arm 436 is swung, a treatment liquid is supplied from the chemical liquid nozzle 430 to the cleaning sponge 434, and the surface of the substrate W is rubbed with the pencil-type cleaning sponge 434, thereby cleaning the surface of the substrate W. Further, pure water is supplied to the backside surface of the substrate W from the pure water nozzles 432, and the backside surface of the substrate W is simultaneously cleaned (rinsed) by the pure water ejected from the pure water nozzles 432. Thus cleaned substrate W is spin-dried by rotating the spindle 426 at a high speed.

Figure 8:
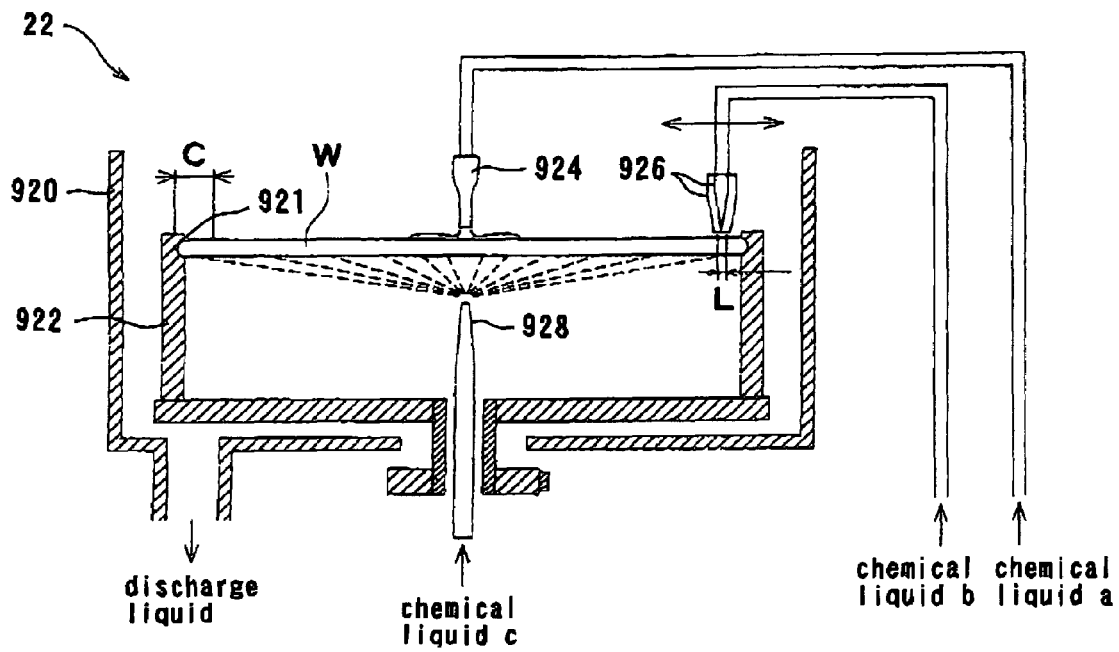
FIG. 8 is a schematic view showing an example of a bevel etching and backside cleaning apparatus shown in FIG. 2.

FIG. 8 shows an example of a bevel etching and backside cleaning apparatus 22. The bevel etching and backside cleaning apparatus 22 can perform etching of the copper film 7 (see FIG. 1B) deposited on an edge (bevel) of the substrate and backside cleaning simultaneously, and can suppress growth of a natural oxide film of copper at a circuit-formed portion on the surface of the substrate. The bevel etching and backside cleaning apparatus 22 has a substrate stage 922 positioned inside a bottomed cylindrical waterproof cover 920 and adapted to rotate the substrate W at a high speed, in such a state that the face of the substrate W faces upward, while holding the substrate W horizontally by spin chucks 921 at a plurality of locations along a circumferential direction of a peripheral portion of the substrate, a center nozzle 924 placed above a nearly central portion of the face of the substrate W held by the substrate stage 922, and an edge nozzle 926 placed above the peripheral portion of the substrate W. The center nozzle 924 and the edge nozzle 926a redirected downward. A back nozzle 928 is positioned below a nearly central portion of the backside of the substrate W, and directed upward. The edge nozzle 926 is adapted to be movable in a diametrical direction and a height direction of the substrate W.

The width of movement L of the edge nozzle 926 is set such that the edge nozzle 926 can be arbitrarily positioned in a direction toward the center from the outer peripheral end surface of the substrate, and a set value for L is inputted, according to the size, usage, or the like of the substrate W. Normally, an edge cut width C is set in the range of 2 mm to 5 mm. In the case where a rotational speed of the substrate is a certain value or higher at which the amount of liquid migration from the backside to the face is not problematic, the copper film, and the like within the edge cut width C can be removed.

Next, the method of cleaning with this bevel etching and backside cleaning apparatus 22 will be described. First, the substrate is horizontally rotated integrally with the substrate stage 922, with the substrate being held horizontally by the spin chucks 921 of the substrate stage 922. In this state, an acid solution is supplied from the center nozzle 924 to the central portion of the face of the substrate W. The acid solution may be a non-oxidizing acid, and hydrofluoric acid, hydrochloric acid, sulfuric acid, citric acid, oxalic acid, or the like is used. On the other hand, an oxidizing agent solution is supplied continuously or intermittently from the edge nozzle 926 to the peripheral portion of the substrate W. As the oxidizing agent solution, one of an aqueous solution of ozone, an aqueous solution of hydrogen peroxide, an aqueous solution of nitric acid, and an aqueous solution of sodium hypochlorite is used, or a combination of these is used.

In this manner, the copper film, or the like formed on the upper surface and end surface in the region of the edge cut width C of the substrate W is rapidly oxidized with the oxidizing agent solution, and is simultaneously etched with the acid solution supplied from the center nozzle 924 and spread on the entire face of the substrate, whereby it is dissolved and removed. By mixing the acid solution and the oxidizing agent solution at the peripheral portion of the substrate, a steep etching profile can be obtained, in comparison with an embodiment in which a mixture is produced in advance and supplied. At this time, the copper etching rate is determined by their concentrations. If a natural oxide film of copper is formed in the circuit-formed portion on the face of the substrate, this natural oxide film is immediately removed by the acid solution spreading on the entire face of the substrate according to rotation of the substrate, and does not grow any more. After the supply of the acid solution from the center nozzle 924 is stopped, the supply of the oxidizing agent solution from the edge nozzle 926 is stopped. As a result, silicon exposed on the surface is oxidized, and deposition of copper can be suppressed.

On the other hand, an oxidizing agent solution and a silicon oxide film etching agent are supplied simultaneously or alternately from the back nozzle 928 to the central portion of the backside of the substrate. Therefore, copper or the like adhering in a metal form to the backside of the substrate W can be oxidized with the oxidizing agent solution, together with silicon of the substrate, and can be etched and removed with the silicon oxide film etching agent. This oxidizing agent solution is preferably the same as the oxidizing agent solution supplied to the face, because the types of chemicals are decreased in number. Hydrofluoric acid can be used as the silicon oxide film etching agent, and if hydrofluoric acid is used as the acid solution on the face of the substrate, the types of chemicals can be decreased in number. Thus, if the supply of the oxidizing agent is stopped first, a hydrophobic surface is obtained. If the etching agent solution is stopped first, a water-saturated surface (a hydrophilic surface) is obtained, and thus the backside surface can be adjusted to a condition that will satisfy the requirements of a subsequent process.

In this manner, the acid solution, i.e., etching solution is supplied to the substrate W to remove metal ions remaining on the surface of the substrate W. Then, pure water is supplied to replace the etching solution with pure water and remove the etching solution, and then the substrate is dried by spin-drying. In this way, removal of the copper film in the edge cut width C at the peripheral portion on the face of the substrate, and removal of copper contaminants on the backside are performed simultaneously to thus allow this treatment to be completed, for example, within 80 seconds. The etching cut width of the edge can be set arbitrarily (from 2 to 5 mm), but the time required for etching does not depend on the cut width.

Figure 9:
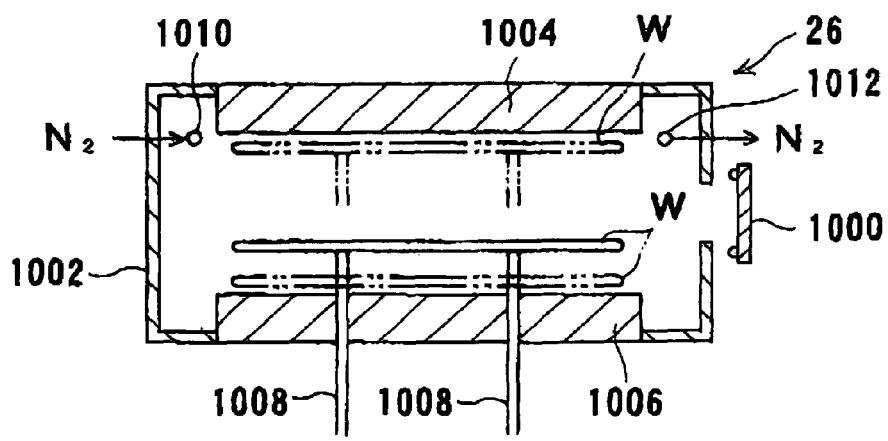
FIG. 9 is a front cross-sectional view showing an example of a heating treatment apparatus shown in FIG. 2.
Figure 10:
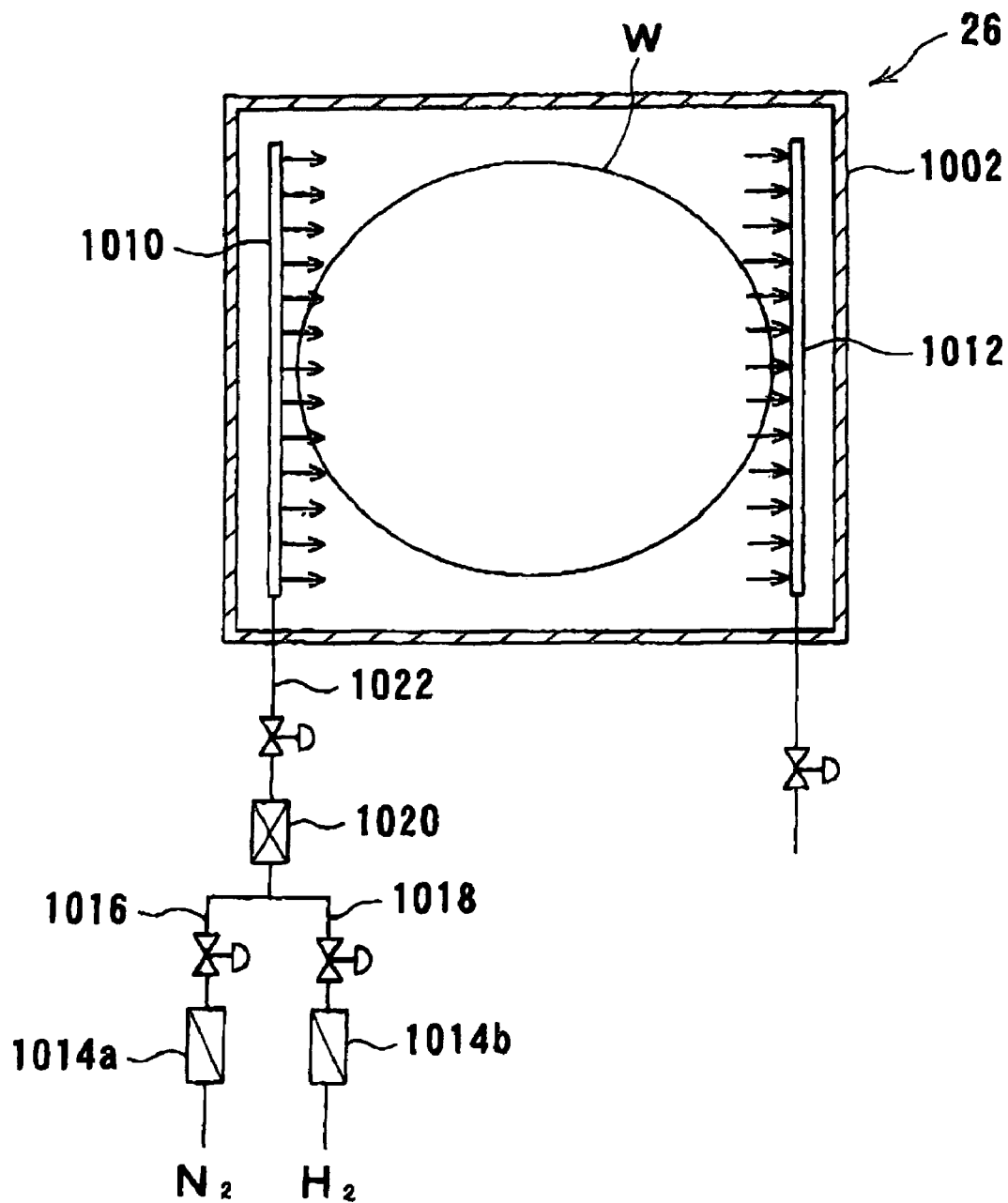
FIG. 10 is a plan cross-sectional view showing an example of the heating treatment apparatus shown in FIG. 9.

FIGS. 9 and 10 show a heat treatment (annealing) apparatus 26. The annealing apparatus 26 comprises a chamber 1002 having a gate 1000 for taking in and taking out the substrate W, a hot plate 1004 disposed at an upper position in the chamber 1002 for heating the substrate W to e.g. 400° C., and a cool plate 1006 disposed at a lower position in the chamber 1002 for cooling the substrate W by, for example, flowing cooling water inside the cool plate 1006. The annealing apparatus 26 also has a plurality of vertically movable elevating pins 1008 penetrating the cool plate 1006 and extending upward and downward therethrough for placing and holding the substrate W on them. The annealing apparatus further includes a gas introduction pipe 1010 for introducing an antioxidant gas between the substrate W and the hot plate 1004 during annealing, and a gas discharge pipe 1012 for discharging the gas which has been introduced from the gas introduction pipe 1010 and flowed between the substrate W and the hot plate 1004. The pipes 1010 and 1012 are disposed on the opposite sides of the hot plate 1004.

The gas introduction pipe 1010 is connected to a mixed gas introduction line 1022 which in turn is connected to a mixer 1020 where a $N_2$ gas introduced through a $N_2$ gas introduction line 1016 containing a filter 1014a, and a $H_2$ gas introduced through a $H_2$ gas introduction line 1018 containing a filter 1014b, are mixed to form a mixed gas which flows through the line 1022 into the gas introduction pipe 1010.

In operation, the substrate W, which has been carried in the chamber 1002 through the gate 1000, is held on the elevating pins 1008 and the elevating pins 1008 are raised up to a position at which the distance between the substrate W held on the lifting pins 1008 and the hot plate 1004 becomes about 0.1 to 1.0 mm, for example. In this state, the substrate W is then heated to e.g. 400° C. through the hot plate 1004 and, at the same time, the antioxidant gas is introduced from the gas introduction pipe 1010 and the gas is allowed to flow between the substrate W and the hot plate 1004 while the gas is discharged from the gas discharge pipe 1012, thereby annealing the substrate W while preventing its oxidation. The annealing may be completed in about several tens of seconds to 60 seconds. The heating temperature of the substrate may be, selected in the range of 100 to 600° C.

After the completion of the annealing, the elevating pins 1008 are lowered down to a position at which the distance between the substrate W held on the elevating pins 1008 and the cool plate 1006 becomes 0 to 0.5 mm, for example. In this state, by introducing cooling water into the cool plate 1006, the substrate W is cooled by the cool plate 1006 to a temperature of 100° C. or lower in about 10 to 60 seconds. The cooled substrate is transferred to the next step.

In this embodiment, a mixed gas of $N_2$ gas with several percentages of $H_2$ gas is used as the above antioxidant gas. However, $N_2$ gas may be used singly.

FIGS. 11 through 17 show a pretreatment apparatus 28 for performing a pretreatment of electroless plating of the substrate. The pretreatment apparatus 28 includes a fixed frame 52 that is mounted on the upper part of a frame 50, and a movable frame 54 that moves up and down relative to the fixed frame 52. A processing head 60, which includes a bottomed cylindrical housing portion 56, opening downwardly and a substrate holder 58, is suspended from and supported by the movable frame 54. In particular, a head-rotating servomotor 62 is mounted to the movable frame 54, and the housing portion 56 of the processing head 60 is coupled to the lower end of the downward-extending output shaft (hollow shaft) 64 of the servomotor 62.

Figure 14:
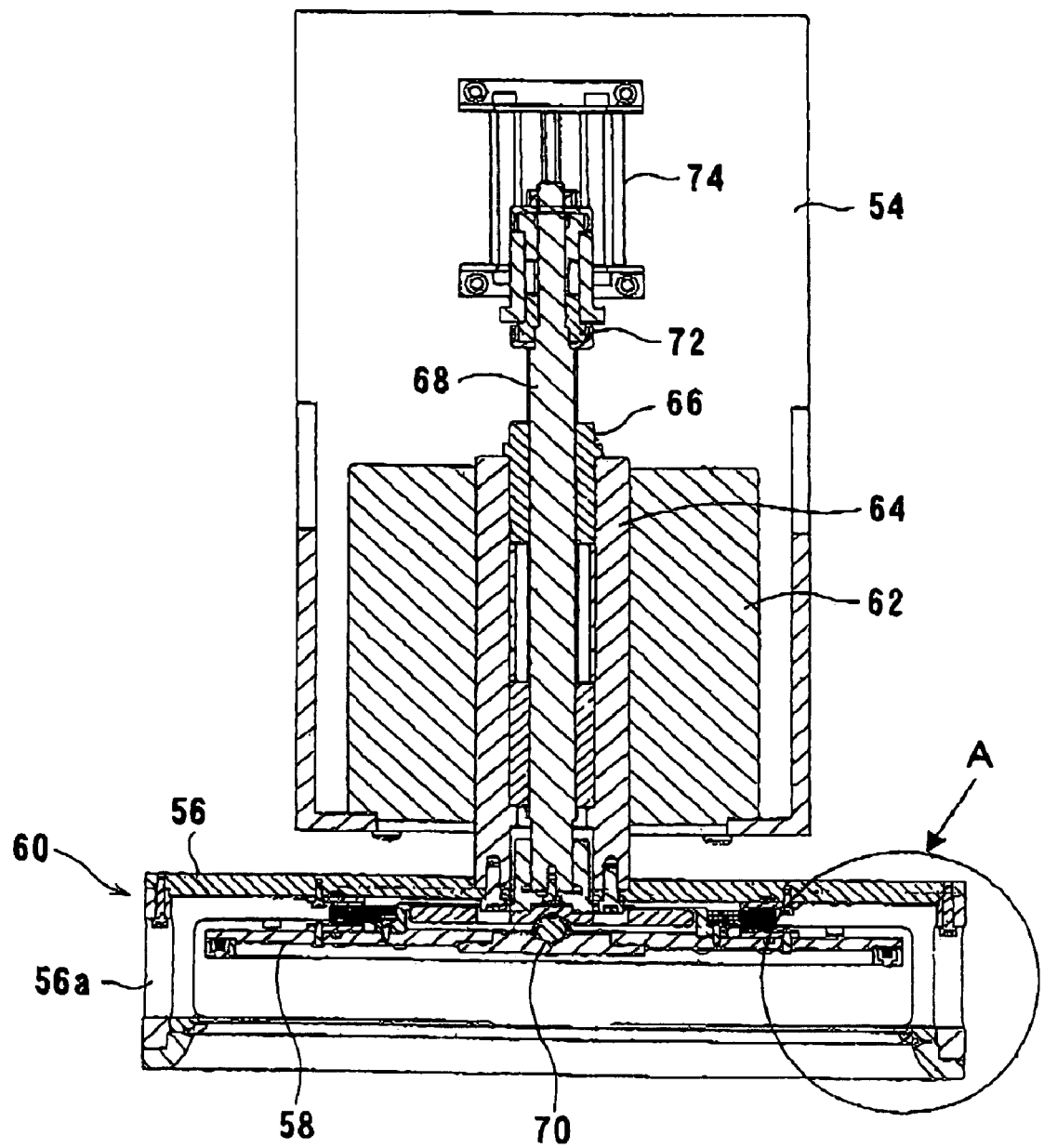
FIG. 14 is a cross-sectional view showing a processing head of the pretreatment apparatus shown in FIG. 2 at the time of substrate transfer.

As shown in FIG. 14, a vertical shaft 68, which rotates together with the output shaft 64 via a spline 66, is inserted in the output shaft 64, and the substrate holder 58 of the processing head 60 is coupled to the lower end of the vertical shaft 68 via a ball joint 70. The substrate holder 58 is positioned within the housing portion 56. The upper end of the vertical shaft 68 is coupled via a bearing 72 and a bracket to a fixed ring-elevating cylinder 74 secured to the movable frame 54. Thus, by the actuation of the cylinder 74, the vertical shaft 68 moves vertically independently of the output shaft 64.

Linear guides 76, which extend vertically and guide vertical movement of the movable frame 54, are mounted to the fixed frame 52, so that by the actuation of a head-elevating cylinder (not shown), the movable frame 54 moves vertically by the guide of the linear guides 76.

Figure 15:
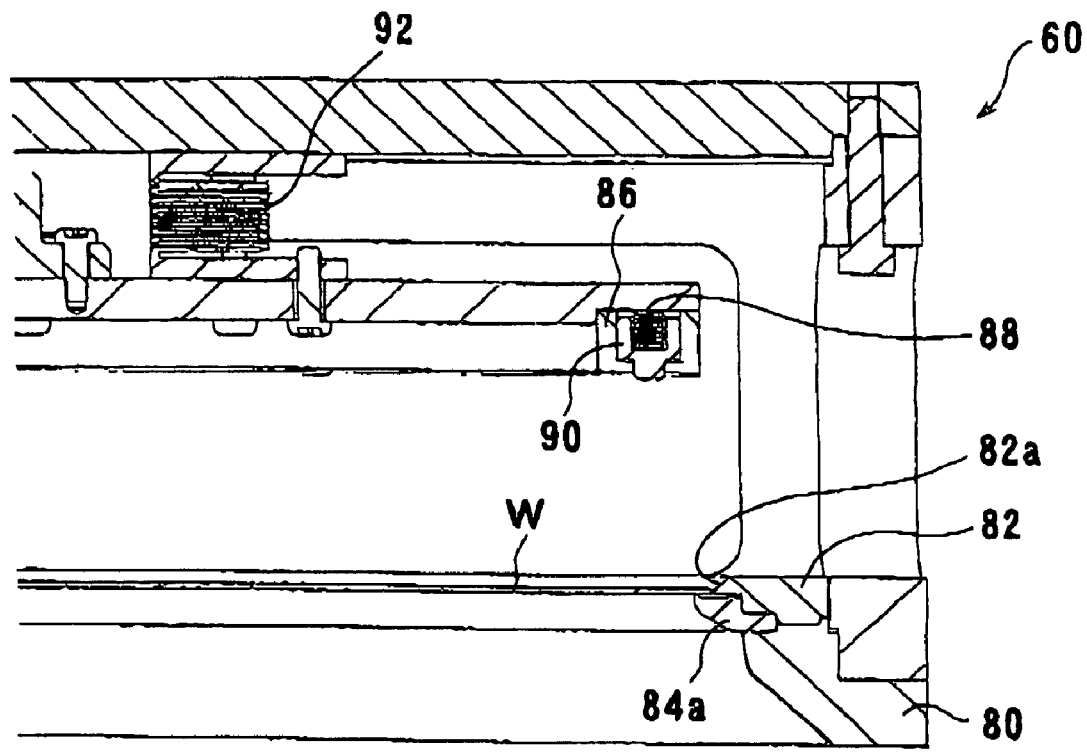
FIG. 15 is an enlarged view of A portion of FIG. 14.
Figure 16:
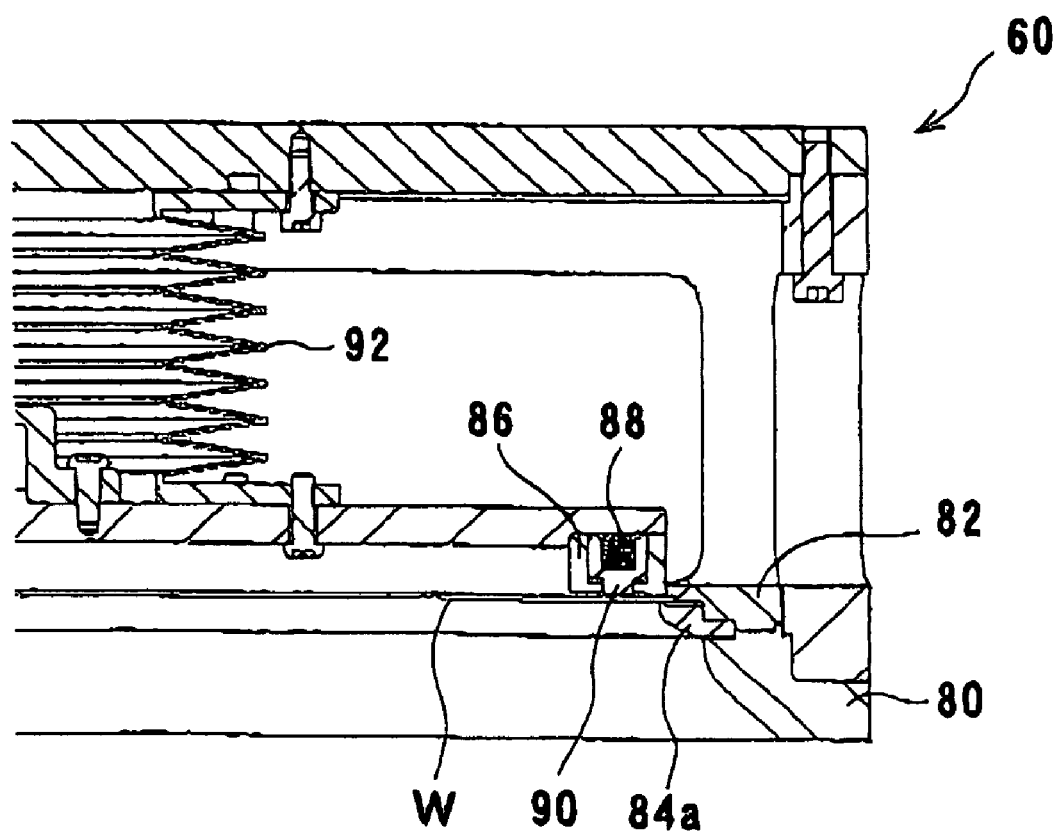
FIG. 16 is a view corresponding to FIG. 15 at the time of substrate fixing.

Substrate insertion windows 56a for inserting the substrate W into the housing portion 56 are formed in the circumferential wall of the housing portion 56 of the processing head 60. Further, as shown in FIGS. 15 and 16, a seal ring 84a is provided in the lower portion of the housing portion 56 of the processing head 60, an outer peripheral portion of the seal ring 84a being sandwiched between a main frame 80 made of e.g. PEEK and a guide frame 82 made of e.g. polyethylene. The seal ring 84a is provided to make contact with a peripheral portion of the lower surface of the substrate W to seal the peripheral portion.

On the other hand, a substrate fixing ring 86 is fixed to a peripheral portion of the lower surface of the substrate holder 58. Columnar pushers 90 each protrudes downwardly from the lower surface of the substrate fixing ring 86 by the elastic force of a spring 88 disposed within the substrate fixing ring 86 of the substrate holder 58. Further, a flexible cylindrical bellows-like plate 92 made of e.g. Teflon (registered trademark) is disposed between the upper surface of the substrate holder 58 and the upper wall of the housing portion 56 to hermetically seal therein.

When the substrate holder 58 is in a raised position, a substrate W is inserted from the substrate insertion window 56a into the housing portion 56. The substrate W is then guided by a tapered surface 82a provided in the inner circumferential surface of the guide frame 82, and positioned and placed at a predetermined position on the upper surface of the seal ring 84a. In this state, the substrate holder 58 is lowered so as to bring the pushers 90 of the substrate fixing ring 86 into contact with the upper surface of the substrate W. The substrate holder 58 is further lowered so as to press the substrate W downwardly by the elastic forces of the springs 88, thereby forcing the seal ring 84a to make pressure contact with a peripheral portion of the front surface (lower surface) of the substrate W to seal the peripheral portion while nipping the substrate W between the housing portion 56 and the substrate holder 58 to hold the substrate W.

When the head-rotating servomotor 62 is driven while the substrate W is thus held by the substrate holder 58, the output shaft 64 and the vertical shaft 68 inserted in the output shaft 64 rotate together via the spline 66, whereby the substrate holder 58 rotates together with the housing portion 56.

At a position below the processing head 60, there is provided an upward-open treatment tank 100 comprising an outer tank 100a and an inner tank 100b which have a slightly larger inner diameter than the outer diameter of the processing head 60. A pair of leg portions 104, which is mounted to a lid 102, is rotatably supported on the outer circumferential portion of the treatment tank 100. Further, a crank 106 is integrally coupled to each leg portion 106, and the free end of the crank 106 is rotatably coupled to the rod 110 of a lid-moving cylinder 108. Thus, by the actuation of the lid-moving cylinder 108, the lid 102 moves between a treatment position at which the lid 102 covers the top opening of the inner tank 100b of the treatment tank 100 and a retreat position beside the treatment tank 100. In the surface (upper surface) of the lid 102, there is provided a nozzle plate 112 having a large number of jet nozzles 112a for jetting outwardly (upwardly), for example, electrolytic ionic water having reducing power.

Figure 17:
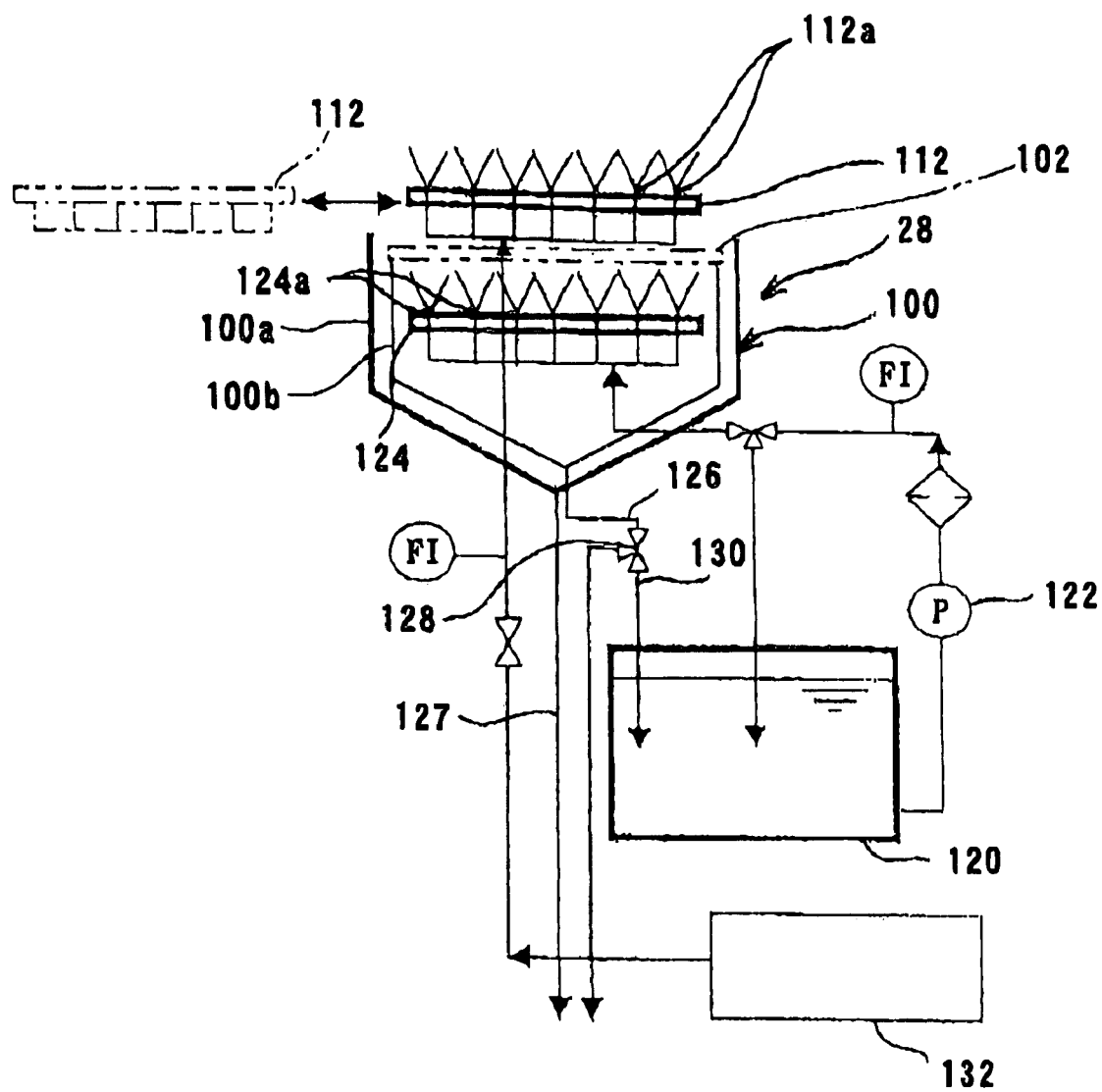
FIG. 17 is a systematic diagram of the pretreatment apparatus shown in FIG. 2.

Further, as shown in FIG. 17, a nozzle plate 124 having a plurality of jet nozzles 124a for jetting upwardly a chemical liquid supplied from a chemical liquid tank 120 by driving the chemical liquid pump 122 is provided in the inner tank 100b of the treatment tank 100 in such a manner that the jet nozzles 124a are equally distributed over the entire surface of the cross section of the inner tank 100b. A drainpipe 126 for draining a chemical liquid (waste liquid) to the outside is connected to the bottom of the inner tank 100b. A three-way valve 128 is provided in the drainpipe 126, and the chemical liquid (waste liquid) is returned to the chemical liquid tank 120 through a return pipe 130 connected to one of ports of the three-way valve 128 to recycle the chemical liquid, as needed. Further, in this embodiment, the nozzle plate 112 provided on the surface (upper surface) of the lid 102 is connected to a rinsing liquid supply source 132 for supplying a rinsing liquid such as pure water. Further, a drainpipe 127 is connected to the bottom of the outer tank 100a.

By lowering the processing head 60 holding the substrate W so as to cover or close the top opening of the inner tank 100b of the treatment tank 100 with the processing head 60 and then jetting a chemical liquid from the jet nozzles 124a of the nozzle plate 124 disposed in the inner tank 100b of the treatment tank 100 toward the substrate W, the chemical liquid can be jetted uniformly onto the entire lower surface (surface to be processed) of the substrate W and the chemical liquid can be discharged out from the discharge pipe 126 while preventing scattering of the chemical liquid to the outside. Further, by raising the processing head 60 and closing the top opening of the inner tank 100b of the treatment tank 100 with the lid 102, and then jetting a rinsing liquid from the jet nozzles 112a of the nozzle plate 112 disposed on the upper surface of the lid 102 toward the substrate W held in the processing head 60, the rinsing treatment (cleaning treatment) is carried out to remove the chemical liquid from the surface of the substrate W. Because the rinsing liquid passes through the clearance between the outer tank 100a and the inner tank 100b and is discharged through the drainpipe 127, the rinsing liquid is prevented from flowing into the inner tank 100b and from being mixed with the chemical liquid.

Figure 11:
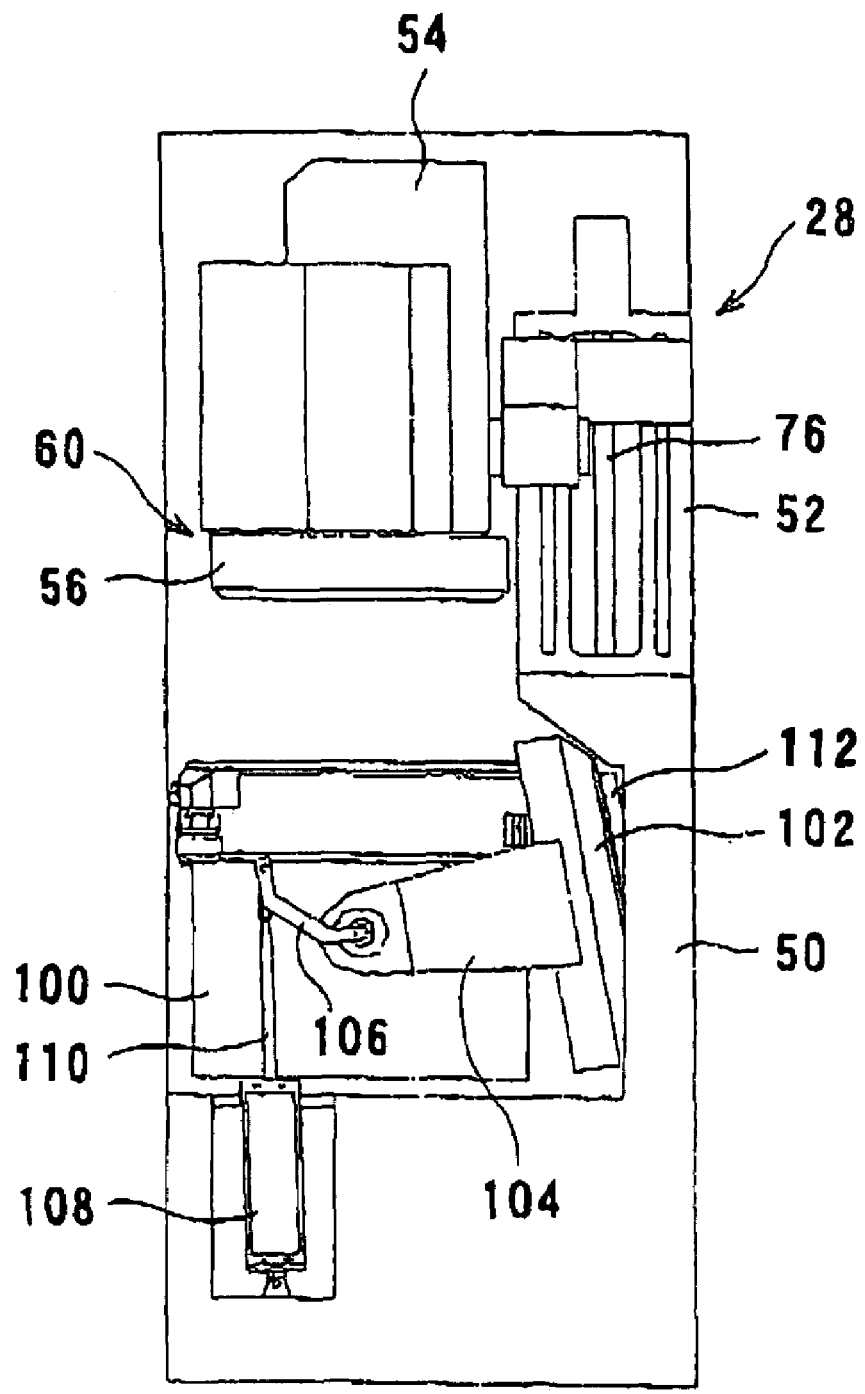
FIG. 11 is a front view of a pretreatment apparatus shown in FIG. 2 at the time of substrate transfer.
Figure 12:
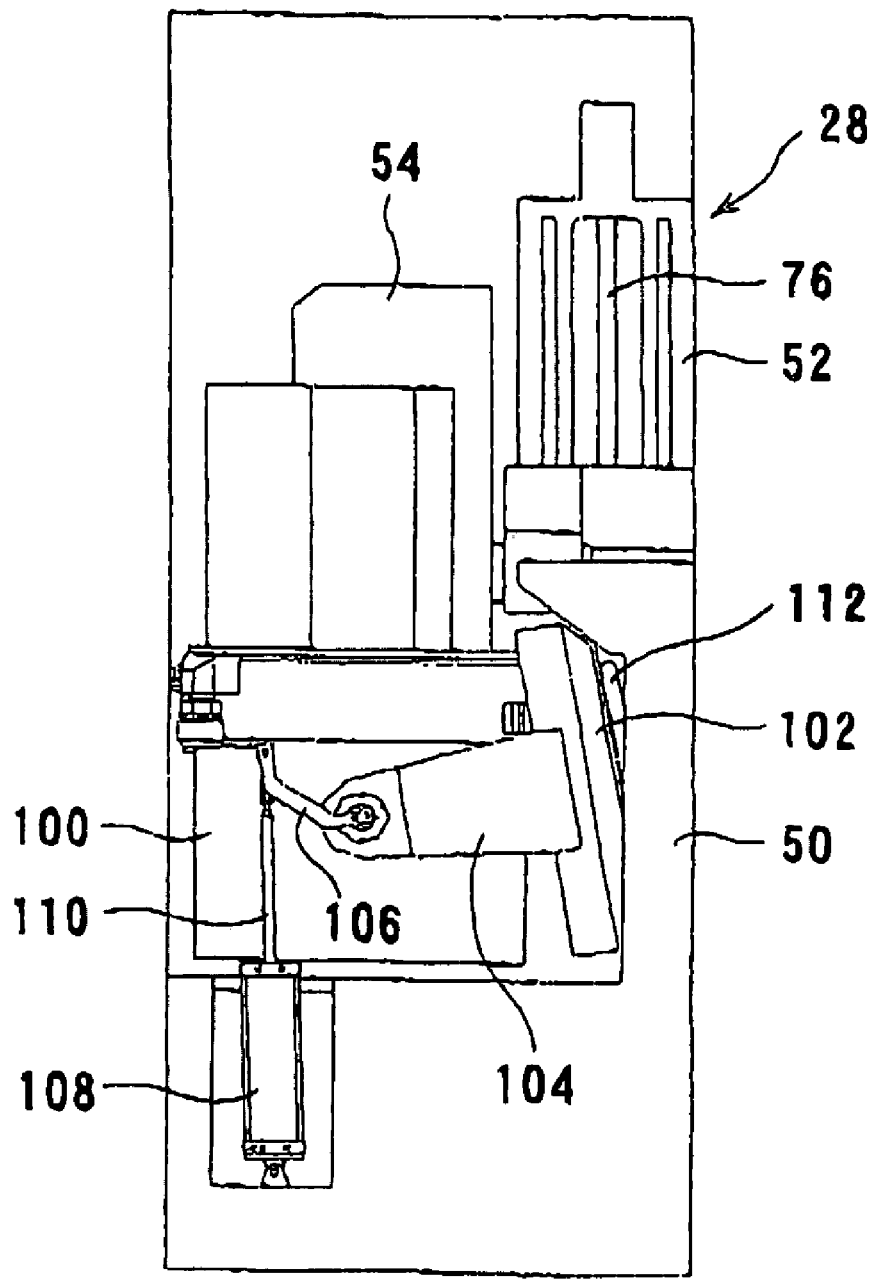
FIG. 12 is a front view of the pretreatment apparatus shown in FIG. 2 at the time of chemical treatment.
Figure 13:
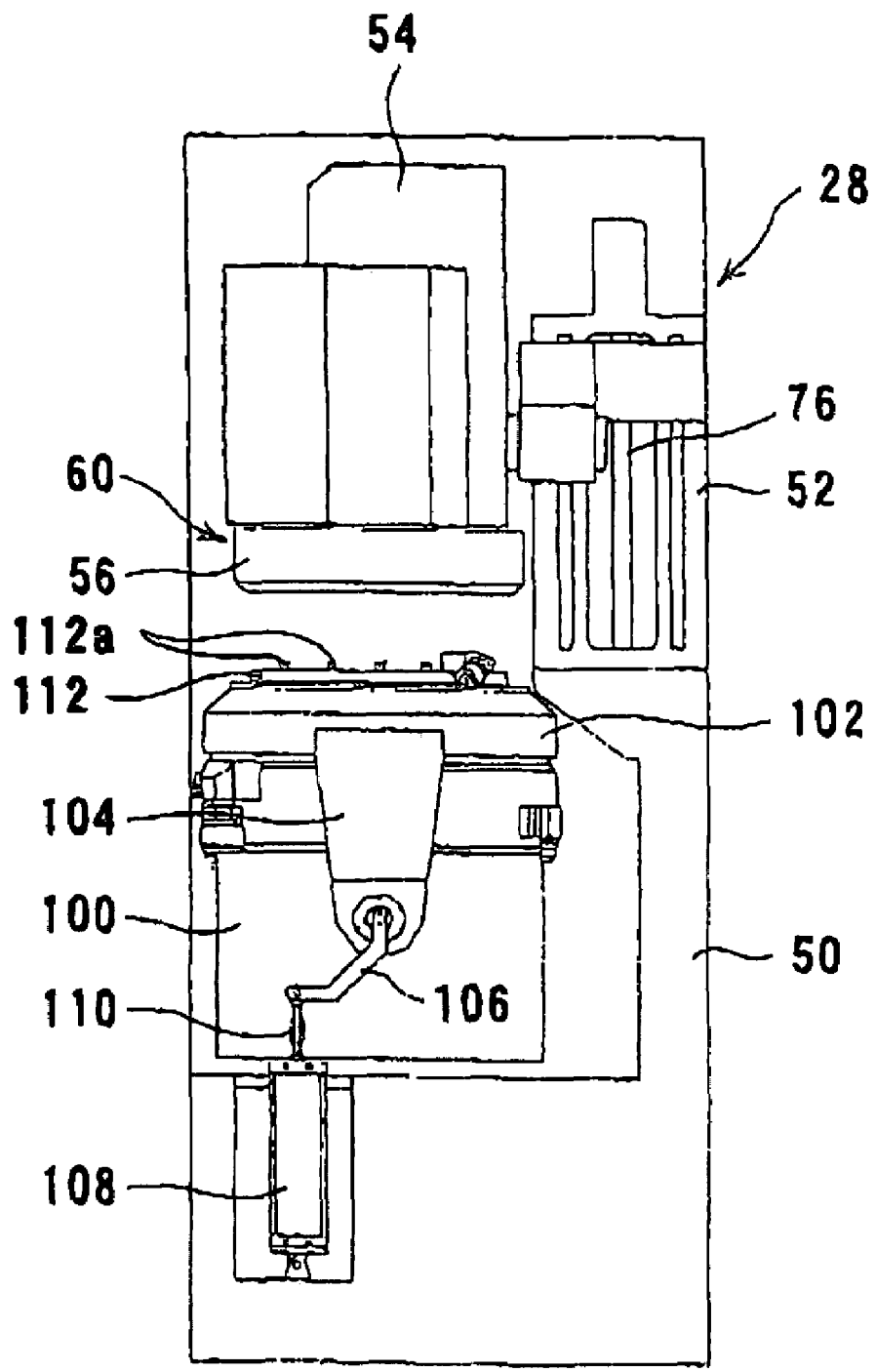
FIG. 13 is a front view of the pretreatment apparatus shown in FIG. 2 at the time of rinsing.

According to the pretreatment apparatus 28, the substrate W is inserted into the processing head 60 and held therein when the processing head 60 is in the raised position, as shown in FIG. 11. Thereafter, as shown in FIG. 12, the processing head 60 is lowered to the position at which it covers the top opening of the inner tank 100b of the treatment tank 100. While rotating the processing head 60 and thereby rotating the substrate W held in the processing head 60, a chemical liquid is jetted from the jet nozzles 124a of the nozzle plate 124 disposed in the inner tank 100b of the treatment tank 100 toward the substrate W, thereby jetting the chemical liquid uniformly onto the entire surface of the substrate W. The processing head 60 is raised and stopped at a predetermined position and, as shown in FIG. 13, the lid 102 in the retreat position is moved to the position at which it covers the top opening of the inner tank 100b of the treatment tank 100. A rinsing liquid is then jetted from the jet nozzles 112a of the nozzle plate 112 disposed on the upper surface of the lid 102 toward the rotating substrate W held in the processing head 60. The chemical treatment by the chemical liquid and the rinsing treatment by the rinsing liquid of the substrate W can thus be carried out successively while avoiding mixing of the two liquids.

The lowermost position of the processing head 60 may be adjusted to adjust the distance between the substrate W held in the processing head 60 and the nozzle plate 124, whereby the region of the substrate W onto which the chemical liquid is jetted from the jet nozzles 124a of the nozzle plate 124 and the jetting pressure can be adjusted as desired. Here, when the pretreatment liquid such as a chemical liquid is circulated and reused, active components are reduced by progress of the treatment, and the pretreatment liquid (chemical liquid) is taken out due to attachment of the treatment liquid to the substrate. Therefore, it is desirable to provide a pretreatment liquid management unit (not shown) for analyzing composition of the pretreatment liquid and adding insufficient components. Specifically, a chemical liquid used for cleaning is mainly composed of acid or alkali. Therefore, for example, a pH of the chemical liquid is measured, a decreased content is replenished from the difference between a preset value and the measured pH, and a decreased amount is replenished using a liquid level meter provided in the chemical storage tank. Further, with respect to a catalytic liquid, for example, in the case of acid palladium solution, the amount of acid is measured by its pH, and the amount of palladium is measured by a titration method or nephelometry, and a decreased amount can be replenished in the same manner as the above.

FIGS. 18 through 24 show an electroless plating apparatus 30. This electroless plating apparatus 30, which is provided to form the protective film 9 shown in FIG. 1D, includes a plating tank 200 (see FIGS. 22 and 24) and a substrate head 204, disposed above the plating tank 200, for detachably holding a substrate W.

Figure 18:
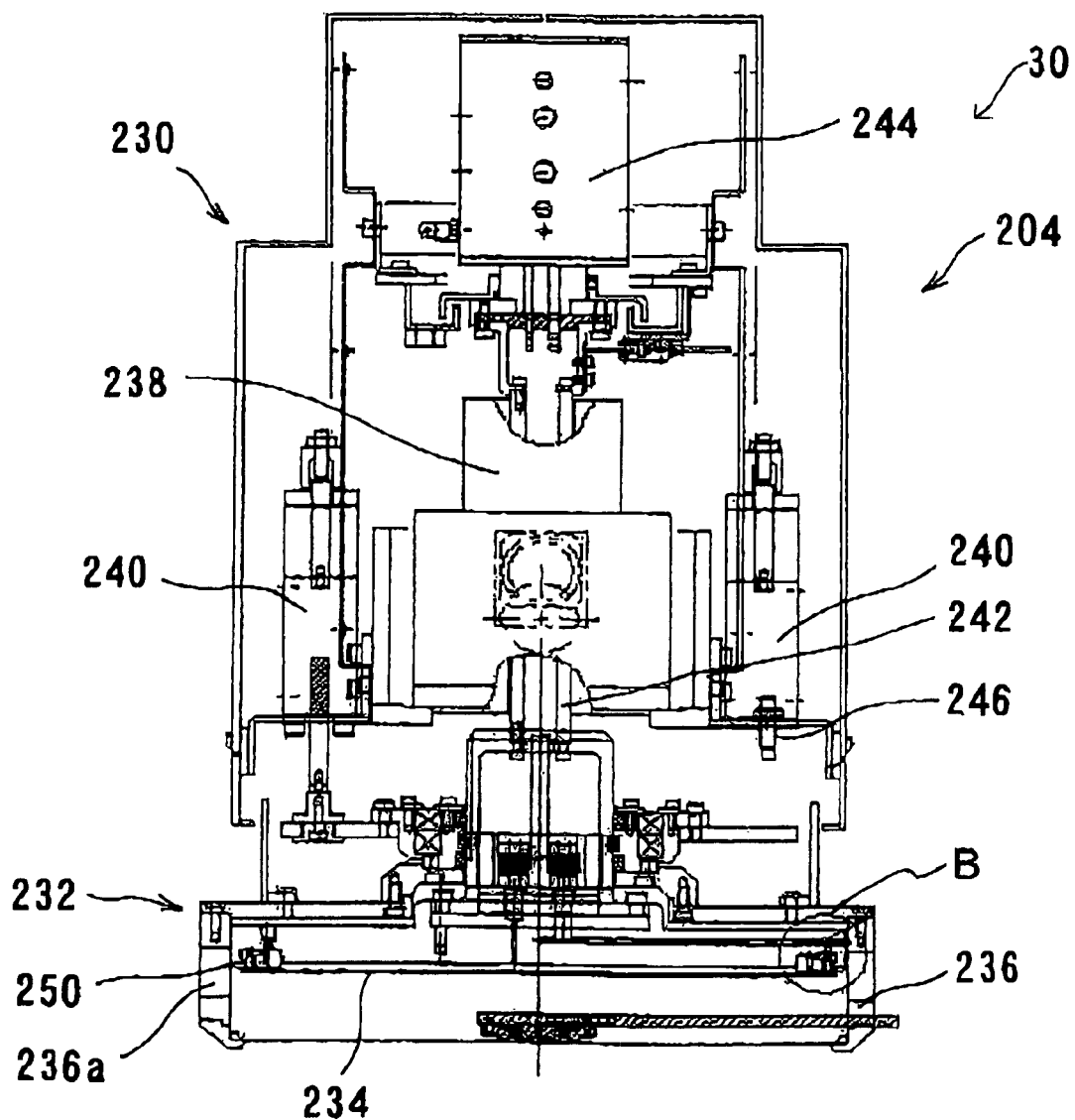
FIG. 18 is a cross-sectional view showing a substrate head of an electroless plating apparatus shown in FIG. 2 at the time of substrate transfer.

As shown in detail in FIG. 18, the processing head 204 has a housing 230 and a head portion 232. The head portion 232 mainly comprises a suction head 234 and a substrate receiver 236 for surrounding the suction head 234. The housing 230 accommodates therein a substrate rotating motor 238 and substrate receiver drive cylinders 240. The substrate rotating motor 238 has an output shaft (hollow shaft) 242 having an upper end coupled to a rotary joint 244 and a lower end coupled to the suction head 234 of the head portion 232. The substrate receiver drive cylinders 240 have respective rods coupled to the substrate receiver 236 of the head portion 232. Stoppers 246 are provided in the housing 230 for mechanically limiting upward movement of the substrate receiver 236.

The suction head 234 and the substrate receiver 236 are operatively connected to each other by a splined structure such that when the substrate receiver drive cylinders 240 are actuated, the substrate receiver 236 vertically moves relative to the suction head 234, and when the substrate rotating motor 238 is driven, the output shaft 242 thereof is rotated to rotate the suction head 234 with the substrate receiver 236.

Figure 19:
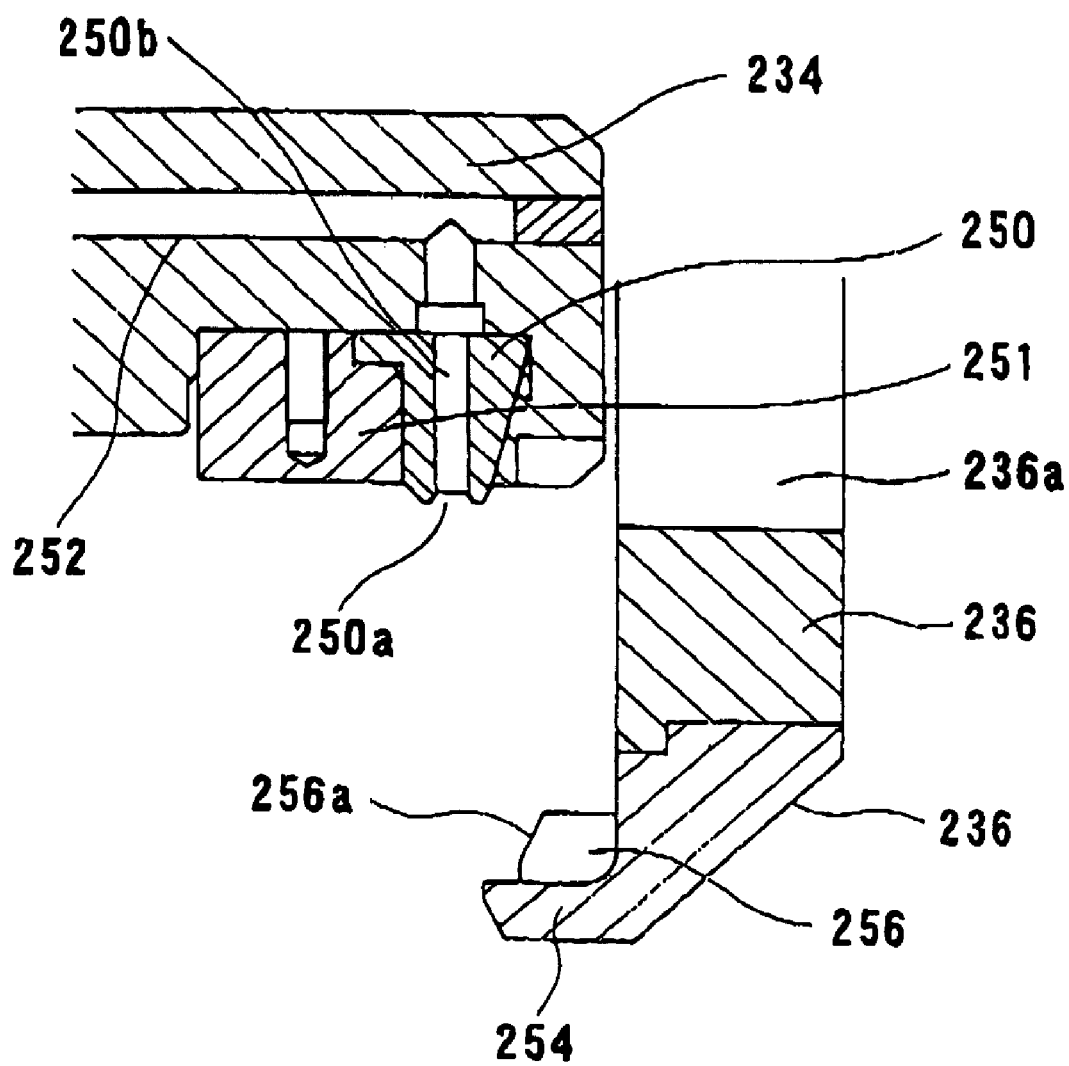
FIG. 19 is an enlarged view of B portion of FIG. 18.
Figure 20:
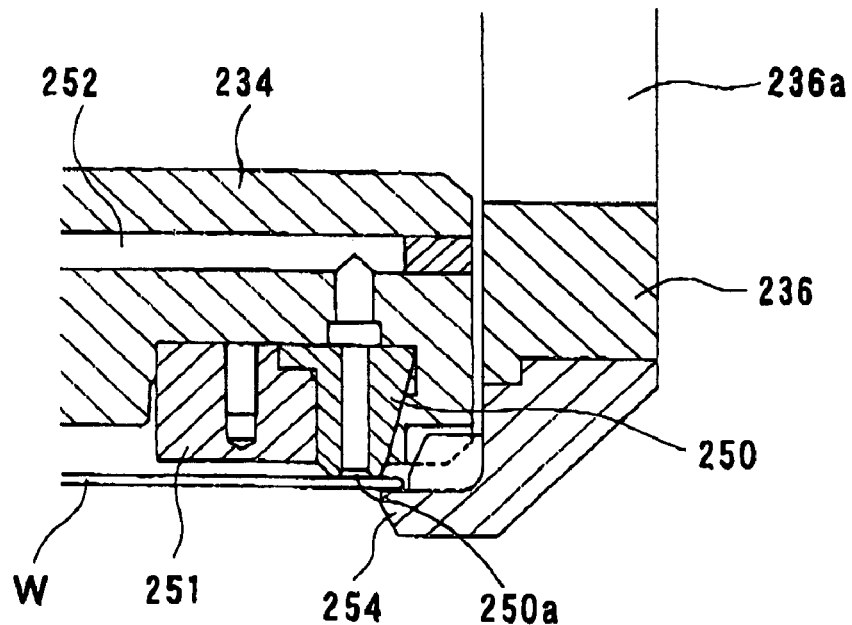
FIG. 20 is a view corresponding to FIG. 19 showing the substrate head at the time of substrate fixing.
Figure 21:
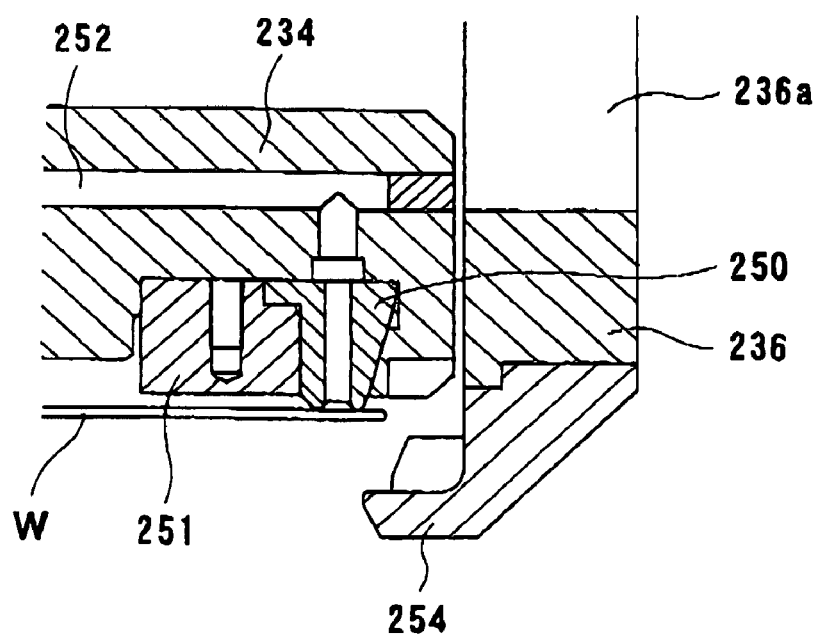
FIG. 21 is a view corresponding to FIG. 19 showing the substrate head at the time of plating process.

As shown in detail in FIGS. 19 through 21, a suction ring 250 for attracting and holding a substrate W against its lower surface to be sealed is mounted on a lower circumferential edge of the suction head 234 by a presser ring 251. The suction ring 250 has a recess 250a continuously defined in a lower surface thereof in a circumferential direction and in communication with a vacuum line 252 extending through the suction head 234 by a communication hole 250b that is defined in the suction ring 250. When the recess 250a is evacuated, the substrate W is attracted to and held by the suction ring 250. Because the substrate W is attracted under vacuum to the suction ring 250 along a radially narrow circumferential area provided by the recess 250a, any adverse effects such as flexing caused by the vacuum on the substrate W are minimized. When the suction ring 250 is dipped in the plating solution (treatment liquid), not only the surface (lower surface) of the substrate W, but also its circumferential edge, can be dipped in the plating solution. The substrate W is released from the suction ring 250 by introducing $N_2$ into the vacuum line 252.

The substrate receiver 236 is in the form of a downwardly open, hollow bottomed cylinder having substrate insertion windows 236a defined in a circumferential wall thereof for inserting therethrough the substrate W into the substrate receiver 236, The substrate receiver 236 also has an annular ledge 254 projecting inwardly from its lower end, and annular protrusions 256 disposed on an upper surface of the annular ledge 254 and each having a tapered inner circumferential surface 256a for guiding the substrate W.

As shown in FIG. 19, when the substrate receiver 236 is lowered, the substrate W is inserted through the substrate insertion window 236a into the substrate receiver 236. The substrate W thus inserted is guided by the tapered surfaces 256a of the protrusions 256 and positioned thereby onto the upper surface of the ledge 254 in a predetermined position thereon. The substrate receiver 236 is then elevated until it brings the upper surface of the substrate W placed on the ledge 254 into abutment against the suction ring 250 of the suction head 234, as shown in FIG. 20. Then, the recess 250a in the vacuum ring 250 is evacuated through the vacuum line 252 to attract the substrate W while sealing the upper peripheral edge surface of the substrate W against the lower surface of the suction ring 250. When plating is performed, as shown in FIG. 20, the substrate receiver 236 is lowered several mm to space the substrate W from the ledge 254, keeping the substrate W attracted only by the suction ring 250. The substrate W now has its lower peripheral edge surface prevented from not being plated because it is held out of contact with the ledge 254.

Figure 22:
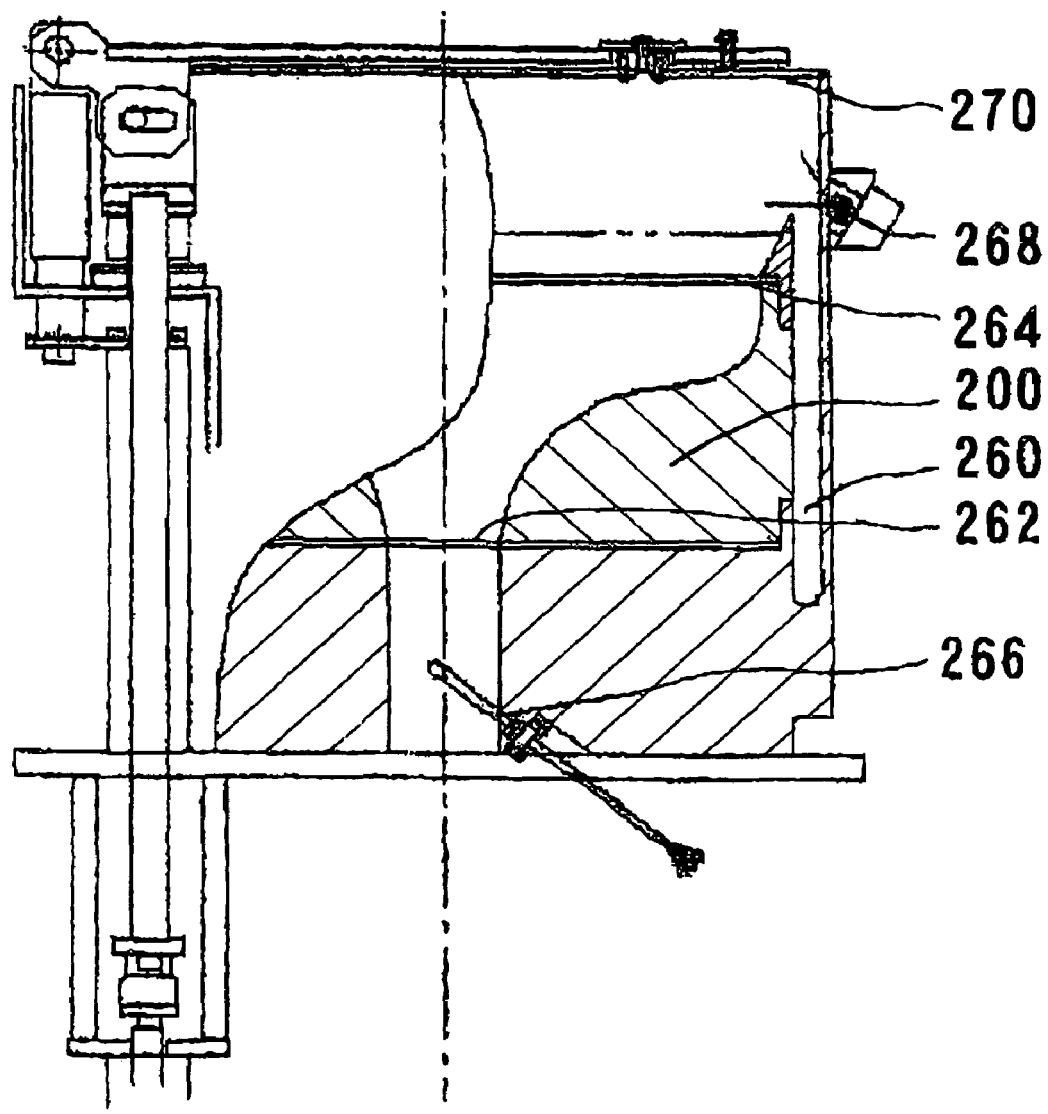
FIG. 22 is a front view, with partially cross-section, showing a plating tank of the electroless plating apparatus shown in FIG. 2 when a plating tank cover is closed.

FIG. 22 shows the details of the plating tank 200. The plating tank 200 is connected at the bottom to a plating solution supply pipe 308 (see FIG. 24), and is provided in the peripheral wall with a plating solution recovery groove 260. In the plating tank 200, there are disposed two current plates 262, 264 for stabilizing the flow of a plating solution flowing upward. A thermometer 266 for measuring the temperature of the plating solution introduced into the plating tank 200 is disposed at the bottom of the plating tank 200. Further, on the outer surface of the peripheral wall of the plating tank 200 and at a position slightly higher than the liquid level of the plating solution held in the plating tank 200, there is provided a jet nozzle 268 for jetting a stop liquid which is a neutral liquid having a pH of 6 to 7.5, for example, pure water, inwardly and slightly upwardly in the normal direction. After plating, the substrate W held in the head portion 232 is raised and stopped at a position slightly above the surface of the plating solution. In this state, pure water (stop liquid) is immediately jetted from the jet nozzle 268 toward the substrate W to cool the substrate W, thereby preventing progress of plating by the plating solution remaining on the substrate W.

Further, at the top opening of the plating tank 200, there is provided a plating tank cover 270 capable of opening and closing for closing the top opening of the plating tank 200 in a non-plating time, such as idling time, so as to prevent unnecessary evaporation of the plating solution from the plating tank 200.

As shown in FIG. 24, a plating solution supply pipe 308 extending from a plating solution storage tank 302 and having a plating solution supply pump 304 and a three-way valve 306 is connected to the plating tank 200 at the bottom of the plating tank 200. With this arrangement, during a plating process, a plating solution is supplied into the plating tank 200 from the bottom of the plating tank 200, and the overflowing plating solution is recovered by the plating solution storage tank 302 through the plating solution recovery groove 260. Thus, the plating solution can be circulated. A plating solution return pipe 312 for returning the plating solution to the plating solution storage tank 302 is connected to one of the ports of the three-way valve 306. Thus, the plating solution can be circulated even in a standby condition of plating, and a plating solution circulating system is constructed. As described above, the plating solution in the plating solution storage tank 302 is always circulated through the plating solution circulating system, and hence a lowering rate of the concentration of the plating solution can be reduced and the number of the substrates W, which can be processed, can be increased, compared with the case in which the plating solution is simply stored.

Particularly, in this embodiment, by controlling the plating solution supply pump 304, the flow rate of the plating solution which is circulated at a standby of plating or at a plating process can be set individually. Specifically, an amount of circulating plating solution at the standby of plating is in the range of 2 to 20 litter/minute, for example, and an amount of circulating plating solution at the plating process is in the range of 0 to 10 litter/minute, for example. With this arrangement, a large amount of circulating plating solution at the standby of plating can be ensured to keep a temperature of the plating bath in the cell constant, and the flow rate of the circulating plating solution is made smaller at the plating process to form a protective film (plated film) having a more uniform thickness.

The thermometer 266 provided in the vicinity of the bottom of the plating tank 200 measures a temperature of the plating solution introduced into the plating tank 200, and controls a heater 316 and a flow meter 318 described below.

Specifically, in this embodiment, there are provided a heating device 322 for heating the plating solution indirectly by a heat exchanger 320 which is provided in the plating solution in the plating solution storage tank 302 and uses water as a heating medium which has been heated by a separate heater 316 and has passed through the flow meter 318, and a stirring pump 324 for mixing the plating solution by circulating the plating solution in the plating solution storage tank 302. This is because in the plating, in some cases, the plating solution is used at a high temperature (about 80° C.), and the structure should cope with such cases. This method can prevent very delicate plating solution from being mixed with foreign matter or the like unlike an in-line heating method.

Figure 23:
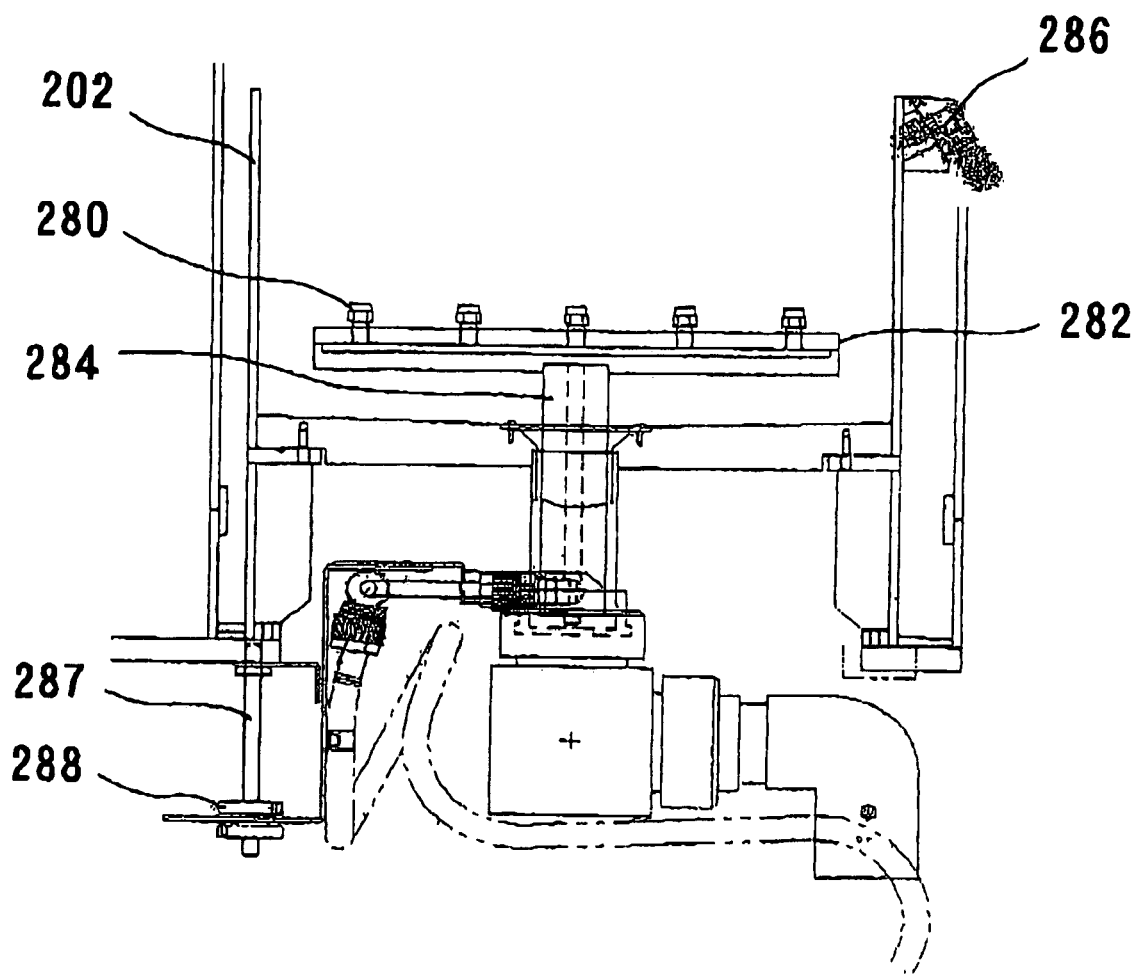
FIG. 23 is a cross-sectional view of a cleaning tank of the electroless plating apparatus shown in FIG. 2.

FIG. 23 shows the details of a cleaning tank 202 provided beside the plating tank 200. At the bottom of the cleaning tank 202, there is provided a nozzle plate 282 having a plurality of jet nozzles 280, attached thereto, for upwardly jetting a rinsing liquid such as pure water. The nozzle plate 282 is coupled to an upper end of a nozzle lifting shaft 284. The nozzle lifting shaft 284 can be moved vertically by changing the position of engagement between a nozzle position adjustment screw 287 and a nut 288 engaging the screw 287 so as to optimize the distance between the jet nozzles 280 and a substrate W located above the jet nozzles 280.

Further, on the outer surface of the peripheral wall of the cleaning tank 202 and at a position above the jet nozzles 280, there is provided a head cleaning nozzle 286 for jetting a cleaning liquid, such as pure water, inwardly and slightly downwardly onto at least a portion, which was in contact with the plating solution, of the head portion 232 of the substrate head 204.

In operating the cleaning tank 202, the substrate W held in the head portion 232 of the substrate head 204 is located at a predetermined position in the cleaning tank 202. A cleaning liquid (rinsing liquid), such as pure water, is jetted from the jet nozzles 280 to clean (rinse) the substrate W, and at the same time, a cleaning liquid such as pure water is jetted from the head cleaning nozzle 286 to clean at least a portion, which was in contact with the plating solution, of the head portion 232 of the substrate head 204, thereby preventing a deposit from accumulating on that portion which was immersed in the plating solution.

According to this electroless plating apparatus 30, when the substrate head 204 is in a raised position, the substrate W is held by vacuum attraction in the head portion 232 of the substrate head 204 as described above, while the plating solution in the plating tank 200 is allowed to circulate.

When plating is performed, the plating tank cover 270 of the plating tank 200 is opened, and the substrate head 204 is lowered, while the substrate head 204 is rotating, so that the substrate W held in the head portion 232 is immersed in the plating solution in the plating tank 200.

After immersing the substrate W in the plating solution for a predetermined time, the substrate head 204 is raised to lift the substrate W from the plating solution in the plating tank 200 and, as needed, pure water (stop liquid) is immediately jetted from the jet nozzle 268 toward the substrate W to cool the substrate W, as described above. The substrate head 204 is further raised to lift the substrate W to a position above the plating tank 200, and the rotation of the substrate head 204 is stopped.

Next, while the substrate W is held by vacuum attraction in the head portion 232 of the substrate head 204, the substrate head 204 is moved to a position right above the cleaning tank 202. While rotating the substrate head 204, the substrate head 204 is lowered to a predetermined position in the cleaning tank 202. A cleaning liquid (rinsing liquid), such as pure water, is jetted from the jet nozzles 280 to clean (rinse) the substrate W, and at the same time, a cleaning liquid such as pure water is jetted from the head cleaning nozzle 286 to clean at least a portion, which was in contact with the plating solution, of the head portion 232 of the substrate head 204.

After completion of cleaning of the substrate w, the rotation of the substrate head 204 is stopped, and the substrate head 204 is raised to lift the substrate W to a position above the cleaning tank 202. Further, the substrate head 204 is moved to the transfer position between the transfer robot 16 and the substrate head 204, and the substrate W is transferred to the transfer robot 16, and is transported to a next process by the transfer robot 16.

As shown in FIG. 24, the electroless plating apparatus 30 is provided with a plating solution management unit 330 for measuring an amount of the plating solution held by the electroless plating apparatus 30 and for analyzing composition of the plating solution by an absorptiometric method, a titration method, an electrochemical measurement, or the like, and replenishing components which are insufficient in the plating solution. In the plating solution management unit 330, signals indicative of the analysis results are processed to replenish insufficient components from a replenishment tank (not shown) to the plating solution storage tank 302 using a metering pump, thereby controlling the amount of the plating solution and composition of the plating solution. Thus, thin film plating can be realized in a good reproducibility.

The plating solution management unit 330 has a dissolved oxygen densitometer 332 for measuring dissolved oxygen in the plating solution held by the electroless plating apparatus 30 by an electrochemical method, for example. According to the plating solution management unit 330, dissolved oxygen concentration in the plating solution can be controlled at a constant value on the basis of indication of the dissolved oxygen densitometer 332 by deaeration, nitrogen blowing, or other methods. In this manner, the dissolved oxygen concentration in the plating solution can be controlled at a constant value, and the plating reaction can be achieved in a good reproducibility.

When the plating solution is used repeatedly, certain components are accumulated by being carried in from the outside or decomposition of the plating solution, resulting in lowering of reproducibility of plating and deteriorating of film quality. By adding a mechanism for removing such specific components selectively, the life of the plating solution can be prolonged and the reproducibility can be improved.

Figure 25:
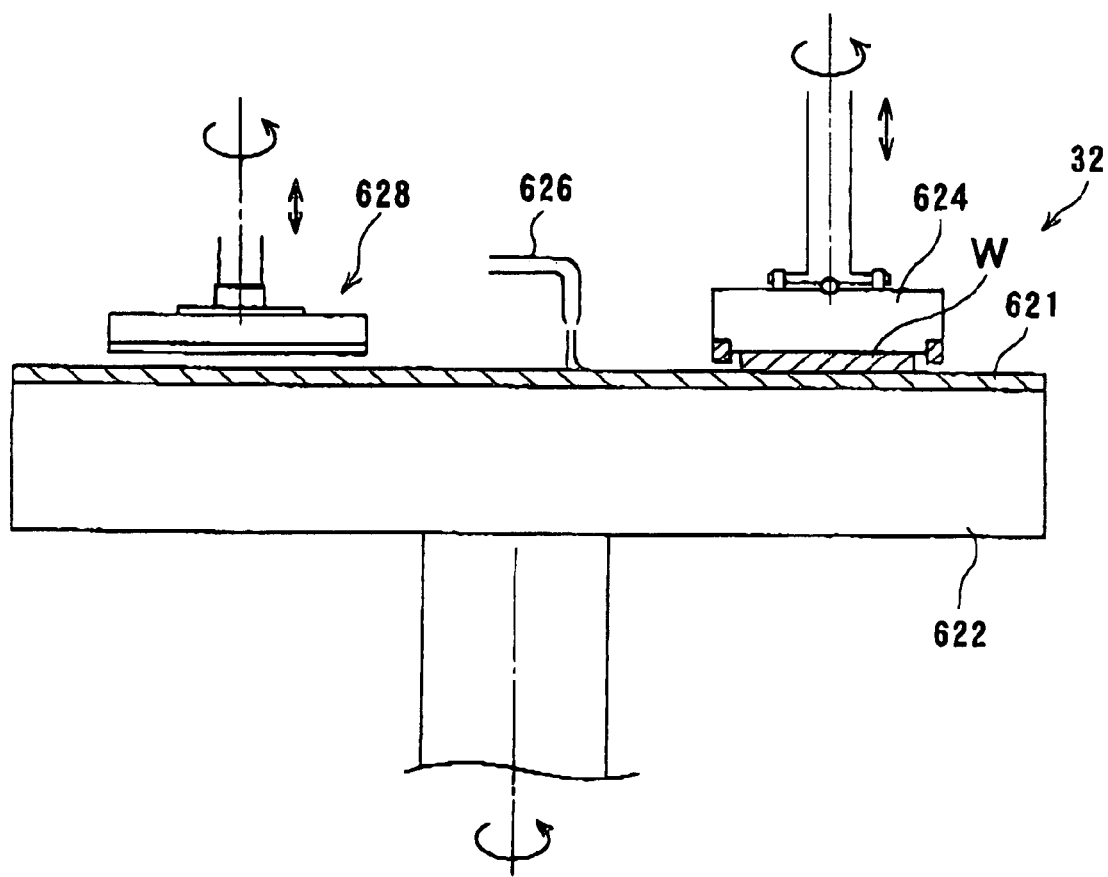
FIG. 25 is a schematic view showing an example of a polishing apparatus shown in FIG. 2.

FIG. 25 shows an example of a polishing apparatus (CMP apparatus) 32. The polishing apparatus 32 comprises a polishing table 622 having a polishing surface composed of a polishing cloth (polishing pad) 620 which is attached to the upper surface of the polishing table 622, and a top ring 624 for holding a substrate W with its to-be-polished surface facing the polishing table 622. In the polishing apparatus 32, the surface of the substrate W is polished by rotating the polishing table 622 and the top ring 624 about their own axes, respectively, and supplying a polishing liquid from a polishing liquid nozzle 626 provided above the polishing table 622 while pressing the substrate W against the polishing cloth 620 of the polishing table 622 at a given pressure by the top ring 624. It is possible to use a fixed abrasive type of pad containing fixed abrasive particles as the polishing pad.

The polishing power of the polishing surface of the polishing cloth 620 decreases with a continuation of a polishing operation of the CMP apparatus 32. In order to restore the polishing power of the polishing surface of the polishing cloth 620, a dresser 628 is provided to conduct dressing of the polishing cloth 620, for example, at the time of replacing the substrate W. In the dressing, while rotating the dresser 628 and the polishing table 622 respectively, the dressing surface (dressing member) of the dresser 628 is pressed against the polishing cloth 620 of the polishing table 622, thereby removing the polishing liquid and chips adhering to the polishing surface and, at the same time, flattening and dressing the polishing surface, whereby the polishing surface is regenerated. The polishing table 622 may be provided with a monitor for monitoring the surface state of the substrate to detect in situ the end point of polishing, or with a monitor for inspecting in situ the finish state of the substrate.

Figure 26:
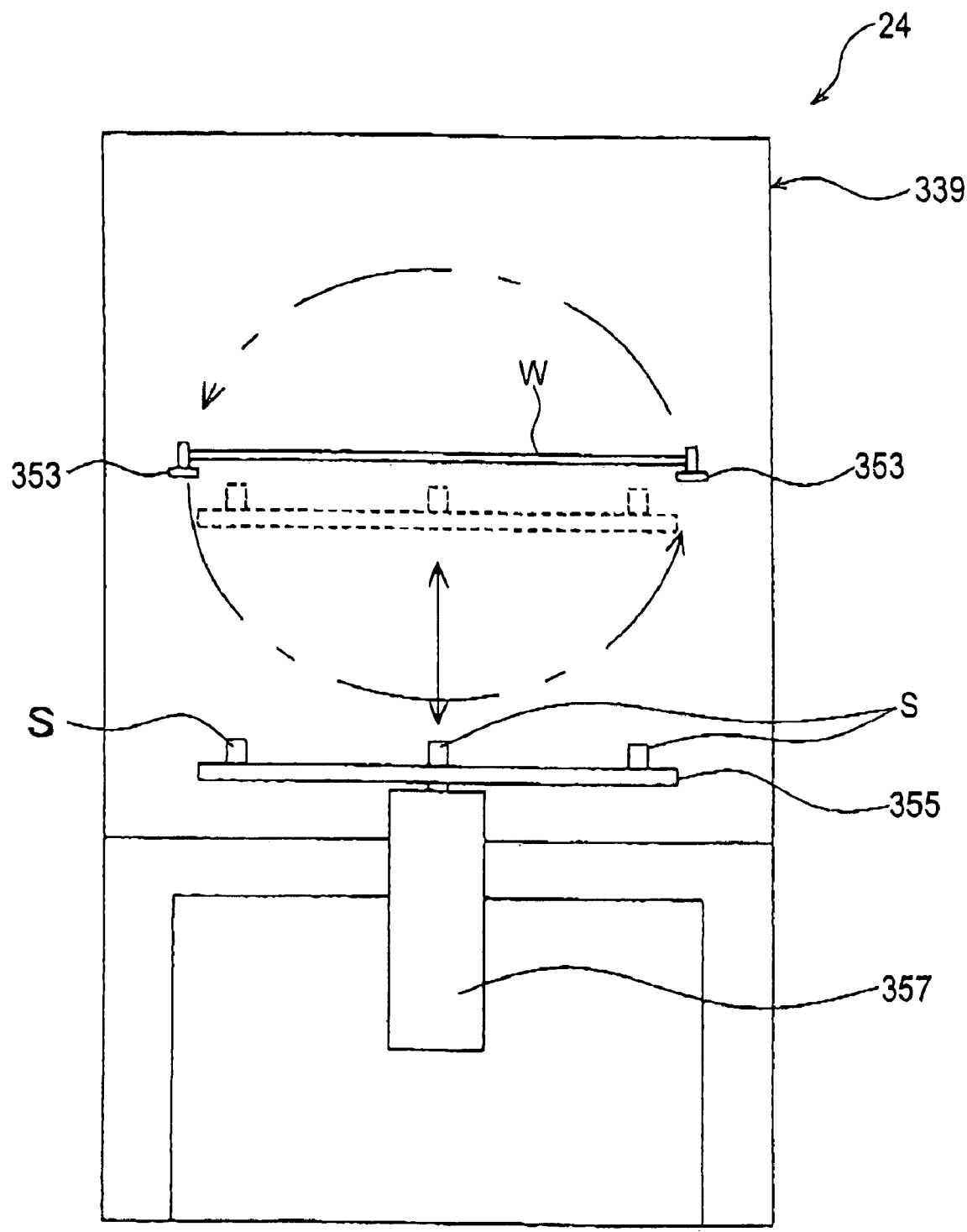
FIG. 26 is a schematic front view of neighborhood of a reversing machine in a film thickness measuring instrument shown in FIG. 2.

FIGS. 26 and 27 show the film thickness measuring instrument 24 provided with a reversing machine. As shown in the FIGS. 26 and 27, the film thickness measuring instrument 24 is provided with a reversing machine 339. The reversing machine 339 includes reversing arms 353, 353. The reversing arms 353, 353 put a substrate W therebetween and hold its outer periphery from right and left sides, and rotate the substrate W through 180°, thereby turning the substrate over. A circular mounting base 355 is disposed immediately below the reversing arms 353, 353 (reversing stage), and a plurality of film thickness sensors S are provided on the mounting base 355. The mounting base 355 is adapted to be movable vertically by a drive mechanism 357.

During reversing of the substrate W, the mounting base 355 waits at a position, indicated by solid lines, below the substrate W. Before or after reversing, the mounting base 355 is raised to a position indicated by dotted lines to bring the film thickness sensors S close to the substrate W gripped by the reversing arms 353, 353, thereby measuring the film thickness.

According to this embodiment, since there is no restriction such as the arms of the transfer robot, the film thickness sensors S can be installed at arbitrary positions on the mounting base 355. Further, the mounting base 355 is adapted to be movable upward and downward, so that the distance between the substrate W and the sensors S can be adjusted at the time of measurement. It is also possible to mount plural types of sensors suitable for the purpose of detection, and change the distance between the substrate W and the sensors each time measurements are made by the respective sensors. However, the mounting base 355 moves upward and downward, thus requiring certain measuring time.

An eddy current sensor, for example, may be used as the film thickness sensors. The eddy current sensor measures a film thickness by generating an eddy current and detecting the frequency or loss of the current that has returned through the substrate W, and is used in a non-contact manner. An optical sensor may also be suitable for the film thickness sensor S. The optical sensor irradiates a light onto a sample, and measures a film thickness directly based on information of the reflected light. The optical sensor can measure a film thickness not only for a metal film but also for an insulating film such as an oxide film. Places for setting the film thickness sensor S are not limited to those shown in the drawings, but the sensor may be set at any desired places for measurement in any desired numbers.

Figure 28:
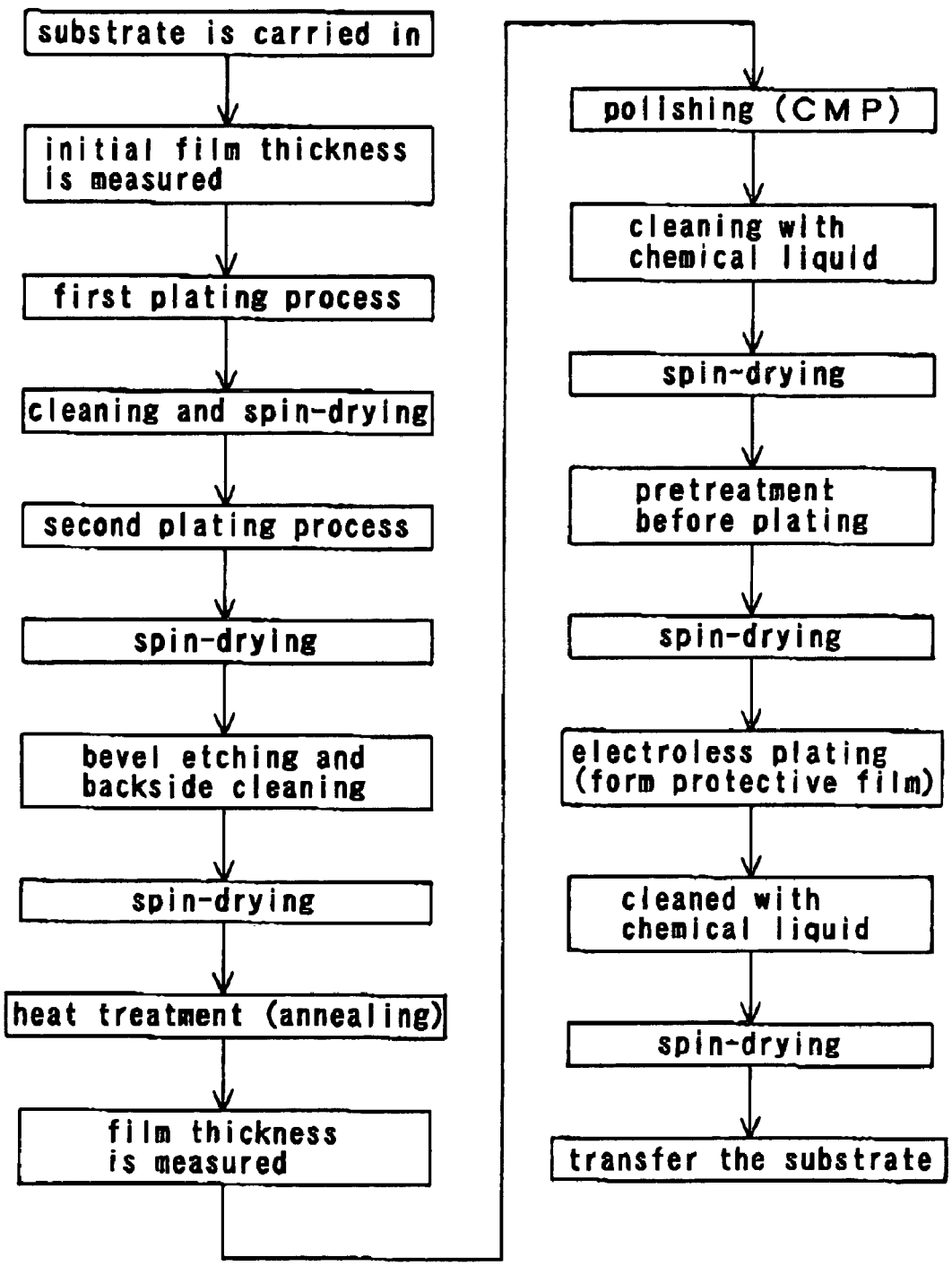
FIG. 28 is a flow chart in a substrate processing apparatus shown in FIG. 2.

Next, a sequence of processing for forming copper interconnects on the substrate having the seed layer 6 formed thereon, as shown in FIG. 1A, which is carried out by the substrate processing apparatus having the above structure will be described with reference to FIG. 28.

First, the substrate W having the seed layer 6 formed in its surface is taken out one by one from a transfer box 10, and is carried in the loading/unloading station 14. The substrate W, which has carried in the loading/unloading station 14, is transferred to the thickness measuring instrument 24 by the transfer robot 16, and an initial film thickness (film thickness of the seed layer 6) is measured by the thickness measuring instrument 24. Thereafter, if necessary, the substrate is inverted and transferred to the first plating apparatus 18a. In the first plating apparatus 18a, the first plating process for achieving excellent embedding properties is performed onto the surface of the substrate W, thereby embedding a copper plated film fully and uniformly in via holes 3 and trenches 4 (see FIG. 1A).

The substrate after the first plating process is transferred to the cleaning and drying apparatus 20 by the transfer robot 16, and the substrate W is cleaned by pure water and spin-dried. Alternatively, in a case where a spin-drying function is provided in the first plating apparatus 18a, the substrate W is spin-dried (removal of liquid) in the first plating apparatus 18a. The dried substrate is then transferred to the second plating apparatus 18b.

In the second plating apparatus 1b, the second plating process for achieving excellent flatness is performed onto the surface of the substrate W, thereby depositing a copper plated film on the surface of the copper plated film formed in the first plating process while controlling the plated film surface to be flattened. The copper film 7 is thus formed on the surface of the substrate W, shown in FIG. 1B.

Then, the substrate W having the copper film 7 formed thereon is transferred to the cleaning and drying apparatus 20 by the transfer robot 16, and the substrate W is cleaned by pure water and spin-dried. Alternatively, in a case where a spin-drying function is provided in the plating apparatus 18b, the substrate W is spin-dried (removal of liquid) in the plating apparatus 18b. The dried substrate is then transferred to the bevel etching and backside cleaning apparatus 22.

In the bevel etching and backside cleaning apparatus 22, unnecessary copper attached to the bevel (edge) portion of the substrate W is removed by etching, and at the same time, the backside surface of the substrate is cleaned by pure water or the like. Thereafter, as described above, the substrate W is transferred to the cleaning and drying apparatus 20 by the transfer robot 16, and the substrate W is cleaned by pure water and spin-dried. Alternatively, in a case where a spin-drying function is provided in the bevel etching and backside cleaning apparatus 22, the substrate W is spin-dried in the bevel etching and backside cleaning apparatus 22. The dried substrate is then transferred to the heat treatment apparatus 26 by the transfer robot 16.

In the heat treatment apparatus 26, heat treatment (annealing) of the substrate W is carried out. Then, the substrate W after the heat treatment is transferred to the film thickness measuring instrument 24 by the transfer robot 16, and the film thickness of copper is measured by the film thickness measuring instrument 24. The film thickness of the copper film 7 (see FIG. 1B) is obtained from the difference between this measured result and the measured result of the above initial film thickness. Then, for example, plating time of a subsequent substrate is adjusted according to the measured film thickness. If the film thickness of the copper film 7 is insufficient, then additional formation of copper film is performed by plating again. Then, the substrate W after the film thickness measurement is transferred to the polishing apparatus 32 by the transfer robot 16.

As shown in FIG. 1C, unnecessary copper film 7 and the seed layer 6 deposited on the surface of the substrate W are polished and removed by the polishing apparatus 32 to flatten the surface of the substrate W. At this time, for example, the film thickness or the finishing state of the substrate W is inspected by a monitor, and when an end point is detected by the monitor, polishing is finished. Then, the substrate W, which has been polished, is transferred to the cleaning and drying apparatus 20 by the transfer robot 16, and the surface of the substrate is cleaned by a chemical liquid and then cleaned (rinsed) with pure water, and then spin-dried by rotating the substrate at a high-speed in the cleaning and drying apparatus 20. After this spin-drying, the substrate W is transferred to the pretreatment apparatus 28 by the transfer robot 16.

In the pretreatment apparatus 28, a pretreatment before plating comprising at least one of attachment of Pd catalyst to the surface of the substrate and removal of oxide film attached to the exposed surface of the substrate, for example, is carried out. Then, the substrate after this pretreatment, as described above, is transferred to the cleaning and drying apparatus 20 by the transfer robot 16, and the substrate W is cleaned by pure water and spin-dried. Alternatively, in a case where a spin-drying function is provided in the pretreatment apparatus 28, the substrate W is spin-dried (removal of liquid) in the pretreatment apparatus 28. The dried substrate is then transferred to the electroless plating apparatus 30 by the transfer robot 16.

In the electroless plating apparatus 30, as shown in FIG. 1D, for example, electroless CoWP plating is applied to the surfaces of the exposed interconnects 8 to form a protective film (plated film) 9 composed of CoWP alloy selectively on the exposed surfaces of the interconnects 8, thereby protecting the interconnects 8. The thickness of the protective film 9 is in the range of 0.1 to 500 nm, preferably in the range of 1 to 200 nm, more preferably in the range of 10 to 100 nm. At this time, for example, the thickness of the protective film 9 is monitored, and when the film thickness reaches a predetermined value, i.e., an end point is detected, the electroless plating is finished.

After the electroless plating, the substrate W is transferred to the cleaning and drying apparatus 20 by the transfer robot 16, and the surface of the substrate is cleaned by a chemical liquid, and cleaned (rinsed) with pure water, and then spin-dried by rotating the substrate at a high speed in the cleaning and drying apparatus 20. After the spin-drying, the substrate W is returned into the transfer box 10 via the loading/unloading station 14 by the transfer robot 16.

In this embodiment, copper is used as an interconnect material. However, besides copper, a copper alloy, silver, a silver alloy, and the like may be used.

EXAMPLE 1

Figure 29:
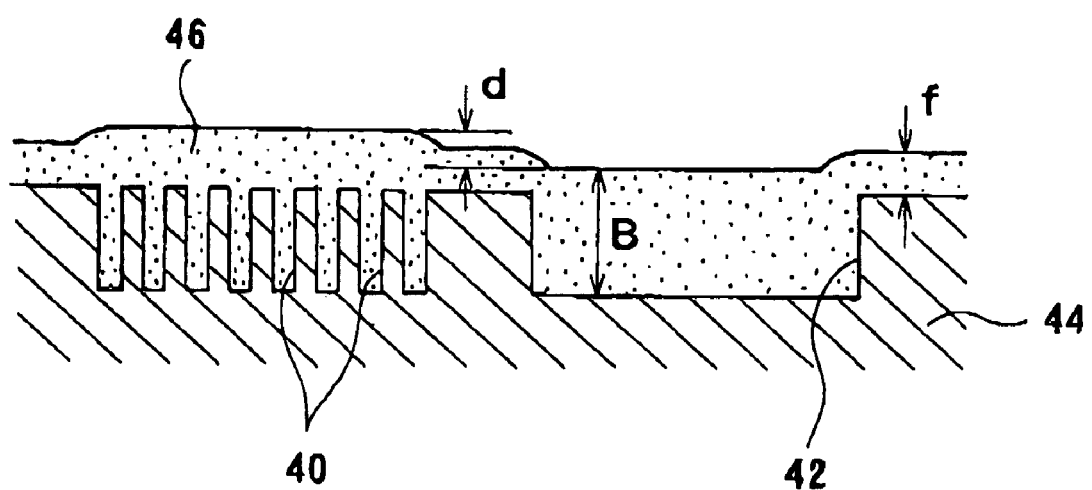
FIG. 29 is a diagram illustrating the flatness index and the surface step for evaluating Examples and Comparative Examples.

As shown in FIG. 29, a number of fine trenches 40 each having a width of 0.18 μm and a depth of 1.0 μm were formed closely at spaced intervals of 0.18 μm, and a single wider trench 42 having a width of 20 μm and a depth of 1.0 μm was formed in the surface of a silicon wafer 44 having a diameter of 200 mm. A sample was prepared by depositing a barrier layer on the surface of the silicon wafer 44 by PVD, and then depositing a copper seed layer as an electrically conductive layer to a thickness of 80 nm on the barrier layer by PVD.

Then, using a copper sulfate plating solution, whose composition is shown below, the first plating process and the second plating process were successively performed onto the surface of the sample by a plating apparatus which is essentially the same as the plating apparatus shown in FIGS. 3 and 4, thereby depositing a copper plated film 46 to a thickness of about 500 nm on the surface of the copper seed layer.

Copper sulfate pentahydrate: 200 g/L
Sulfuric acid: 50 g/L
Chlorine: 60 mg/L
Organic additive: 5 mg/L The first plating process was performed under the following conditions: While the sample was being held by the substrate holder 504 and the copper seed layer on the surface of the sample was positioned closely to the lower pad (porous member) 534a, a current was passed between the copper seed layer on the sample and the anode 525 at a current density of 5 mA/cm$^2$ for 40 seconds, thus depositing an initial copper plated film on the surface of the copper seed layer. After the supply of the current was stopped, the surface of the sample was cleaned with pure water and then dried.

The second plating process was performed under the following conditions: While the sample was being held by the substrate holder 504 and the initial copper plated film formed on the surface of the copper seed layer by the first plating process was kept in contact with the lower pad (porous member) 534*a*, and the sample was rotated for two seconds. After, the sample was stopped against rotation, a current was passed between the initial copper plated film on the sample and the anode 525, and then the supply of the current was stopped. Thereafter, the lower pad 534*a* was released from the initial copper plated film on the sample, which was left to stand for 10 seconds. The above sequence beginning from the contact between the initial copper plated film and the lower pad 534*a* was regarded as one cycle, and the cycle was repeated 15 times.

Recessed regions of the sample on which the plated film was deposited were split apart, and the split surfaces were observed by SEM. The copper plated film 46 was evaluated in terms of a flatness index (=B/f) representing the ratio of a film thickness B of the copper plated film 46 deposited in the wider trench 42 to a film thickness f of the copper plated film 46 deposited on the substrate surface free of interconnects, and also in terms of a surface step d representing the distance (step) between the surface of the copper plated film 46 deposited in the wider trench 42 and the surface of the copper plated film 46 deposited over a region where the fine trenches 40 were closely formed. This process of evaluating the copper plated film 46 with the flatness index and the surface step d was also used in Examples and Comparative Examples shown below.

EXAMPLE 2

The first plating process and the second plating process were performed onto a surface of a sample which was the same as the sample in Example 1 under the same conditions as those in Example 1, depositing a copper plated film 46 (see FIG. 29) to a thickness of about 500 nm on the surface of the copper seed layer. In the second plating process, a plating solution having the composition shown below was used. The deposited copper plated film 46 was evaluated in terms of the flatness index and the surface step d in the same manner as with Example 1.

Copper sulfate pentahydrate: 150 g/L
Sulfuric acid: 100 g/L
Chlorine: 60 mg/L
Organic additive: 10 mg/L

EXAMPLE 3

The first plating process and the second plating process were performed onto a surface of a sample which was the same as the sample in Example 1, depositing a copper plated film 46 (see FIG. 29) to a thickness of about 500 nm on the surface of the copper seed layer. A plating solution which was of the same composition as the plating solution used in Example 1 was used.

The first plating process was performed under the same conditions as those in Example 1. The second plating process was performed under the following conditions: While the initial copper plated film formed on the surface of the copper seed layer by the first plating process was kept in contact with the lower pad (porous member) 534*a*, the lower pad 534*a* was vibrated for three seconds. After the vibration of the lower pad 534*a* was stopped, a current was passed between the initial copper plated film on the sample and the anode 526 at a current density of 10 mA/cm² for 10 seconds. Then, the supply of the current between the initial copper plated film on the sample and the anode 526 was stopped. Thereafter, the lower pad 534*a* was released from the initial copper plated film on the sample, which was left to stand for 10 seconds. The above sequence beginning from the contact between the initial copper plated film and the lower pad 534*a* was regarded as one cycle, and the cycle was repeated 15 times. The deposited copper plated film 46 was evaluated in terms of the flatness index and the surface step d in the same manner as with Example 1.

EXAMPLE 4

The first plating process and the second plating process were performed on a surface of a sample which was the same as the sample in Example 1, depositing a copper plated film 46 (see FIG. 29) to a thickness of about 500 nm on the surface of the copper seed layer. A plating solution which was of the same composition as the plating solution used in Example 1 was used.

The first plating process was performed under the same conditions as those in Example 1. The second plating process was performed under the following conditions: The initial copper plated film formed on the surface of the copper seed layer by the first plating process was kept in contact with the lower pad (porous member) 534*a*, and the sample held by the substrate holder 504 was rotated for two seconds. Thereafter, the sample was stopped against rotation, and a current was passed between the initial copper plated film on the sample and the anode 526 at a current density of 5 mA/cm² for 10 seconds. Then, the supply of the current between the initial copper plated film on the sample and the anode 526 was stopped. Thereafter, the lower pad 534*a* was released from the initial copper plated film on the sample, which was left to stand for 10 seconds. The above sequence beginning from the contact between the initial copper plated film and the lower pad 534*a* was regarded as one cycle, and the cycle was repeated six times. The current density of the current flowing between the initial copper plated film on the sample and the anode 526 changed from 5 mA/cm² to 20 mA/cm², and the above cycle was repeated six times. The deposited copper plated film 46 was evaluated in terms of the flatness index and the surface step d in the same manner as with Example 1.

EXAMPLE 5

The first plating process and the second plating process were performed onto a surface of a sample which was the same as the sample in Example 1, depositing a copper plated film 46 (see FIG. 29) to a thickness of about 500 nm on the surface of the copper seed layer. A plating solution which was of the same composition as the plating solution used in Example 1 was used.

The first plating process was performed under the following conditions: While the copper seed layer on the surface of the sample held by the substrate holder 504 and the lower pad (porous member) 534*a* were positioned closely to each other, a current was passed between the copper seed layer on the surface of the sample and the anode 526 at a current density of 8 mA/cm² for 10 seconds, and subsequently a current was passed between the copper seed layer on the surface of the sample and the anode 526 at a current density of 20 mA/cm² for six seconds, thus depositing an initial plated copper film on the surface of the copper seed layer. After the supply of the current was stopped, the surface of the sample was cleaned with pure water and then dried. The second plating process was performed under the same conditions as those in Example 1. The deposited copper plated film 46 was evaluated in terms of the flatness index and the surface step d in the same manner as with Example 1.

COMPARATIVE EXAMPLE 1

An electroplating process was performed onto a surface of a sample which was the same as the sample in Example 1, depositing a copper plated film 46 (see FIG. 29) to a thickness of about 500 nm on the copper seed layer. A plating solution which was of the same composition as the plating solution used in Example 1 was used. The electroplating process was performed under the following conditions: A current was passed between the copper seed layer on the sample and the anode at a current density of 10 mA/cm$^2$ for 150 seconds. The deposited copper plated film 46 was evaluated in terms of the flatness index and the surface step d in the same manner as with Example 1.

COMPARATIVE EXAMPLE 2

An electroplating process was performed onto the surface of a sample which was the same as the sample in Example 1, depositing a copper plated film 46 (see FIG. 29) to a thickness of about 500 nm on the copper seed layer. A plating solution which was of the same composition as the plating solution used in Example 1 was used. The second plating process in Example 1 was performed as the electroplating process, and the first plating process in Example 1 was not performed. The deposited copper plated film 46 was evaluated in terms of the flatness index and the surface step d in the same manner as with Example 1.

The results of the process of evaluating the samples according to Examples 1 through 5 and Comparative Examples 1, 2 based on the evaluating process details shown in FIG. 29 are given in Table 1 below.

TABLE 1

| Plating conditions | Flatness index | Surface step | Voids |
|---|---|---|---|
| Example 1 | 2.8 | 100 nm | None |
| Example 2 | 2.8 | 80 nm | None |
| Example 3 | 2.9 | 75 nm | None |
| Example 4 | 2.9 | 70 nm | None |
| Example 5 | 2.8 | 100 nm | None |
| Comp. Example 1 | 1.0 | 1300 nm | None |
| Comp. Example 2 | 2.9 | 50 nm | Yes |

It can be seen from Table 1 that in Examples 1 through 5, both the fine trenches 40 and the wider trench 42 were filled up with copper, and the deposited copper plated film 46 was substantially flat without being affected by the shape of the recesses. On the other hand, it can also be seen that in Comparative Example 1, while the fine trenches 40 were filled up with copper, the wider trench 42 was not filled up with copper, and the deposited copper plated film 46 had considerably large steps depending on the shape of the recesses. In Comparative Example 2, the deposited copper plated film was substantially flat without being affected by the shape of the recesses, but voids were observed in the copper plated films (interconnects) embedded in the fine trenches 40.

According to the present invention, a plated film is preferentially precipitated fully and uniformly in fine interconnect recesses such as trenches and via holes to prevent voids from being formed therein, and a plated film having a flatter surface can be deposited without being affected by variations, i.e., different sizes and widths, of the shape of trenches and via holes.

Figure 30:
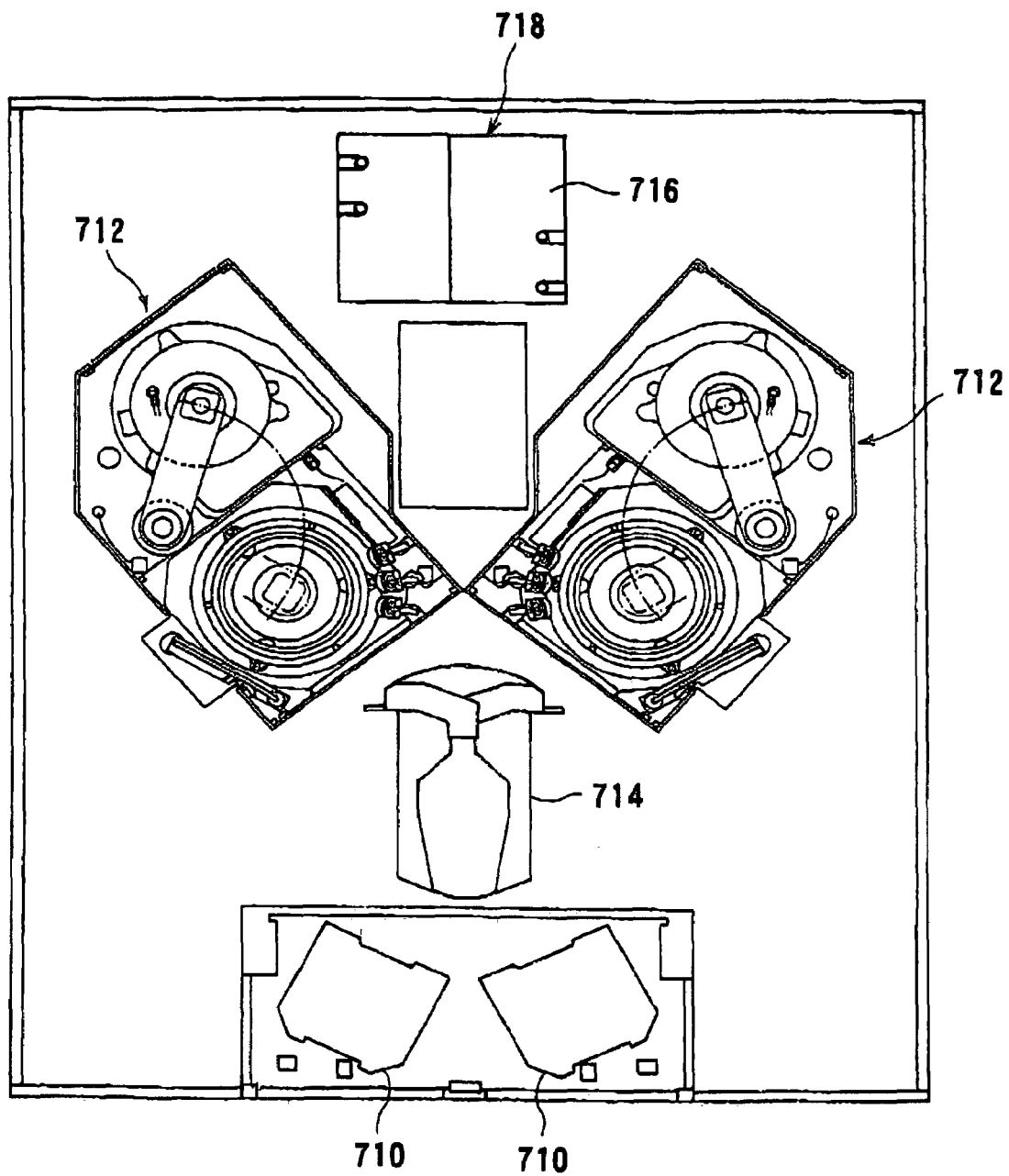
FIG. 30 is an overall plan view of a substrate processing apparatus incorporating a plating apparatus according to another embodiment of the present invention.

FIG. 30 is an overall plan view showing a substrate processing apparatus incorporating a plating apparatus according to another embodiment of the present invention. As shown in FIG. 30, this substrate processing apparatus has a rectangular facility which houses therein two loading/unloading stations 710 for housing a plurality of substrates W therein, two plating apparatuses 712 for performing plating process and processing incidental thereto, a transfer robot 714 for transferring substrates W between the loading/unloading stations 710 and the plating apparatuses 712, and plating solution supply equipment 718 having a plating solution tank 716.

Figure 31:
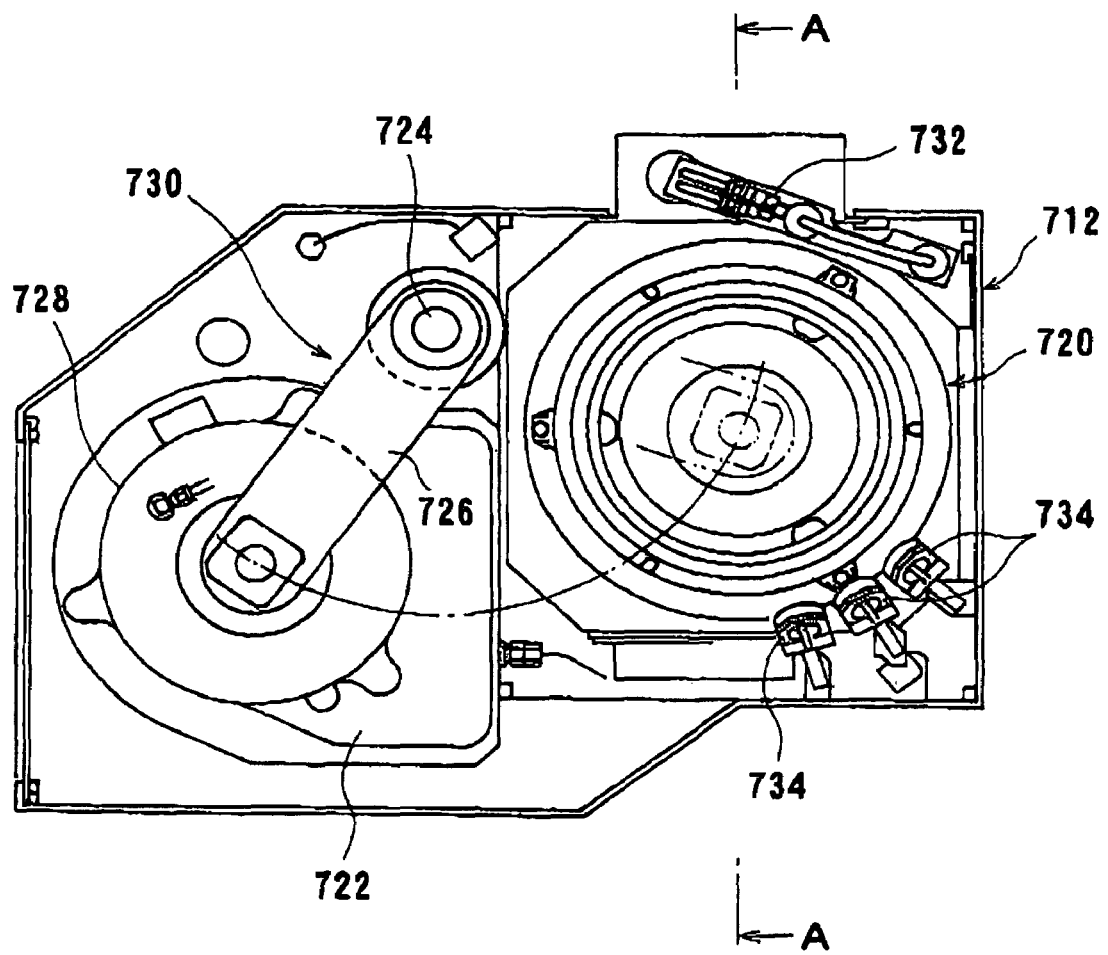
FIG. 31 is a plan view of the plating apparatus shown in FIG. 30.

The plating apparatus 712, as shown in FIG. 31, is provided with a substrate processing section 720 for performing plating process and processing incidental thereto, and a plating solution tray 722 for storing a plating solution is disposed adjacent to the substrate processing section 720. There is also provided an electrode arm portion 730 having an electrode head 728 which is held at the front end of a swing arm 726 swingable about a rotating shaft 724 and which is swung between the substrate processing section 720 and the plating solution tray 722. Furthermore, a pre-coating/recovering arm 732, and fixed nozzles 734 for ejecting pure water or a chemical liquid such as ion water, and further a gas or the like toward a substrate are disposed laterally of the substrate processing section 720. In this embodiment, three of the fixed nozzles 734 are disposed, and one of them is used for supplying pure water.

Figure 32:
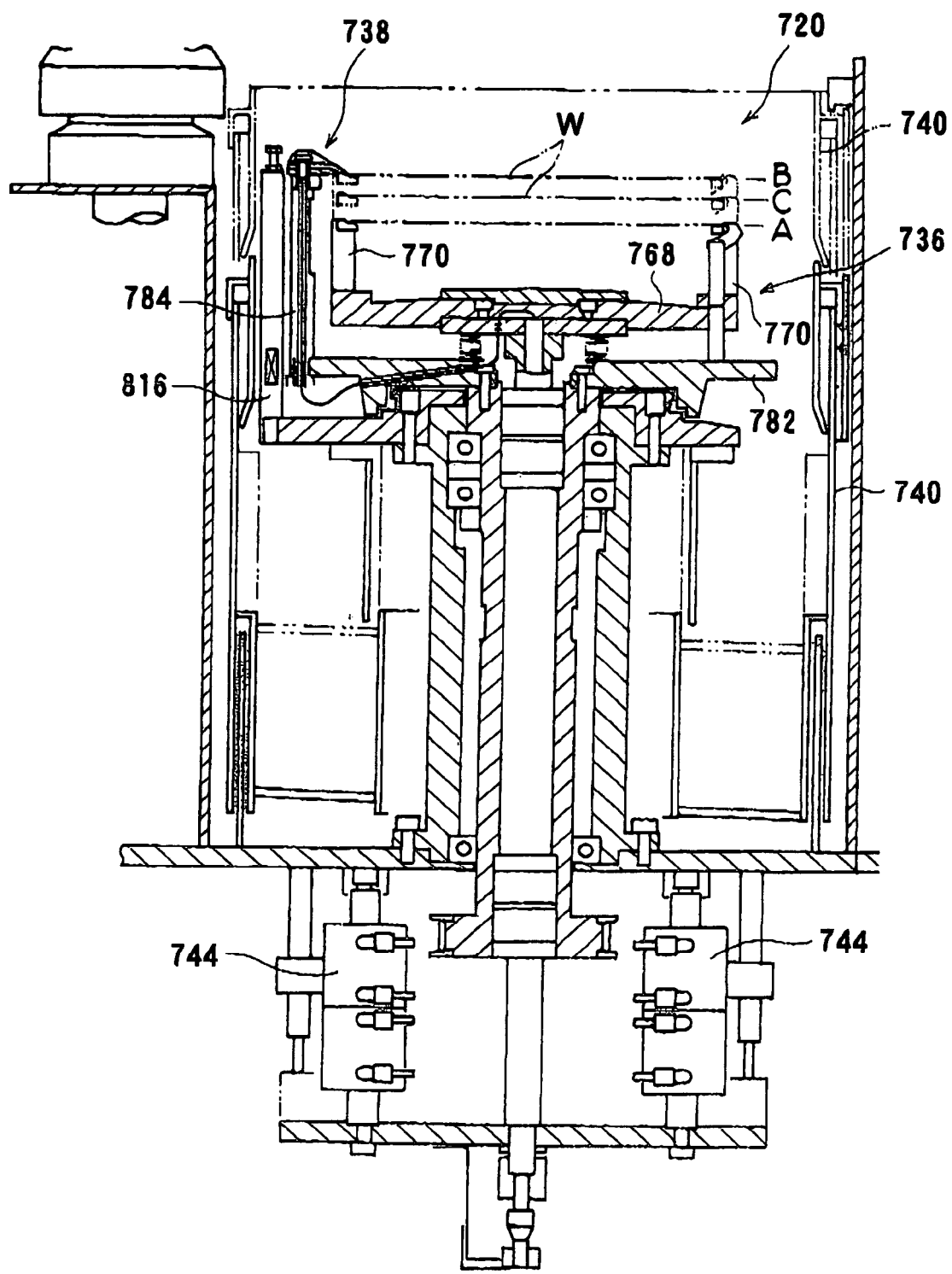
FIG. 32 is an enlarged sectional view of the substrate holder and the electrode portion of the plating apparatus shown in FIG. 30.

The substrate processing section 720, as shown in FIG. 32, has a substrate holder 736 for holding a substrate W with its surface (surface to be plated) facing upward, and a cathode portion 738 located above the substrate holder 736 so as to surround a peripheral portion of the substrate holder 736. Further, a substantially cylindrical bottomed splash prevention cup 740 surrounding the periphery of the substrate holder 736 for preventing scatter of various chemical liquids used during processing is provided so as to be vertically movable by an air cylinder (not shown).

The substrate holder 736 is adapted to be raised and lowered by the air cylinder 744 between a lower substrate transfer position A, an upper plating position B, and a pretreatment/cleaning position C intermediate between these positions. The substrate holder 736 is also adapted to rotate at an arbitrary acceleration and an arbitrary velocity integrally with the cathode portion 738 by a rotating motor and a belt (not shown). Substrate carry-in and carry-out openings (not shown) are provided in confrontation with the substrate transfer position A in a side panel of the plating apparatus 712 facing the transfer robot 714. When the substrate holder 736 is raised to the plating position B, a sealing member 790 and cathodes 788 (to be described below) of the cathode portion 738 are brought into contact with the peripheral portion of the substrate W held by the substrate holder 736. On the other hand, the splash prevention cup 740 has an upper end located below the substrate carry-in and carry-out openings, and when the splash prevention cup 740 ascends, the upper end of the splash prevention cup 740 reaches a position above the cathode portion 738 closing the substrate carry-in and carry-out openings, as shown by imaginary lines in FIG. 32.

The plating solution tray 722 serves to wet a porous member 808 and an anode 798 of the electrode arm portion 730 with a plating solution, when plating has not been performed. The plating solution tray 722 is set at a size in which the porous member 808 can be accommodated, and the plating solution tray 722 has a plating solution supply port and a plating solution drainage port (not shown). A photo-sensor is attached to the plating solution tray 722, and can detect brimming with the plating solution in the plating solution tray 722, i.e., overflow, and drainage.

Figure 40:
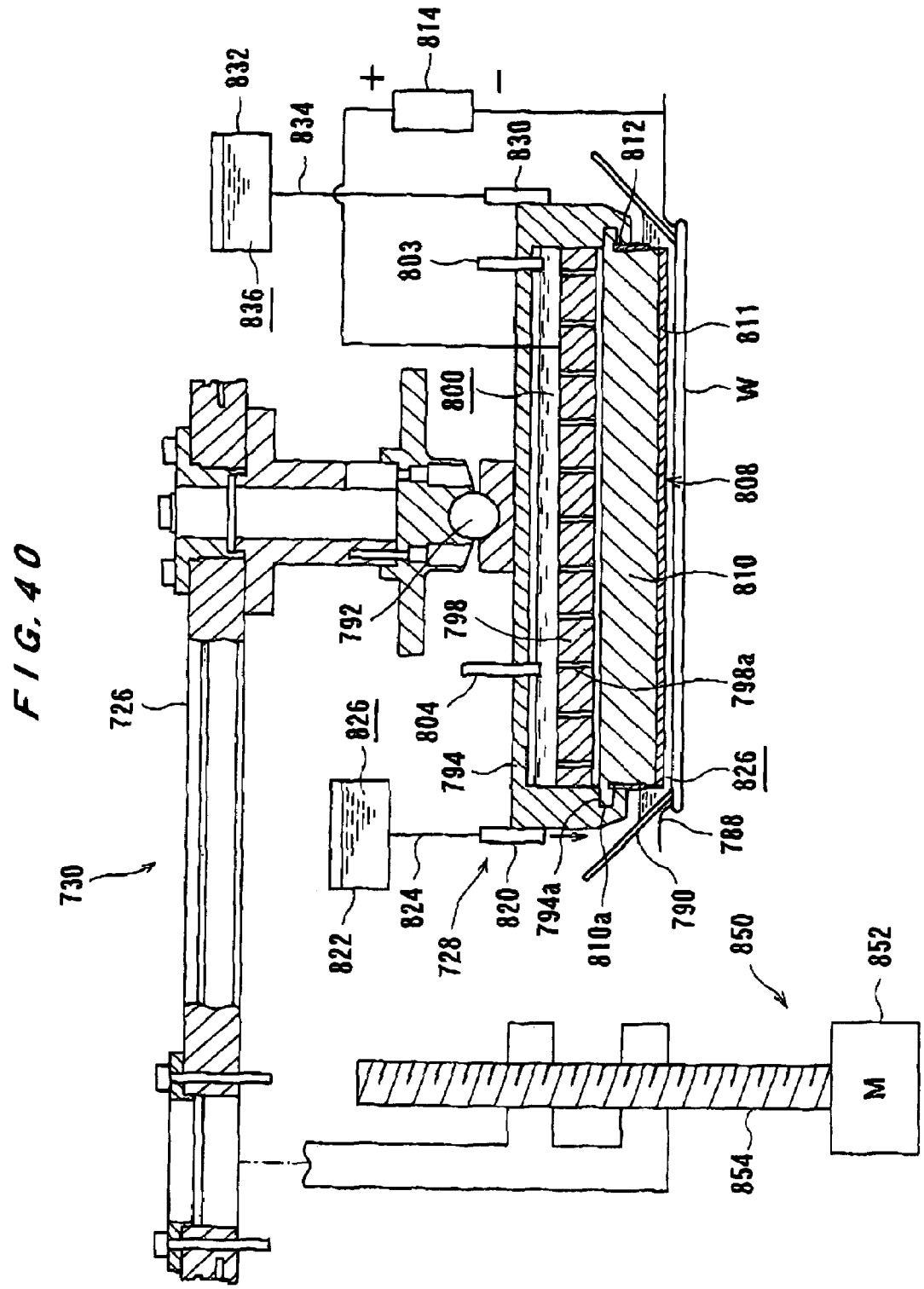
FIG. 40 is a schematic sectional view illustrating the electrode head and the substrate holder of the plating apparatus shown in FIG. 30 when the plating apparatus performs a first plating process.

As shown in FIG. 40, the electrode arm portion 730 is vertically movable by a vertical movement motor 852 and a ball screw 854, which make up a pressing actuator mechanism 850 for changing the pressed state of the porous member 808 against the surface of the substrate W which is held by the substrate holder 736, and swingable (pivotable) between the plating solution tray 722 and the substrate processing section 720 by a swing motor (not shown).

Figure 33:
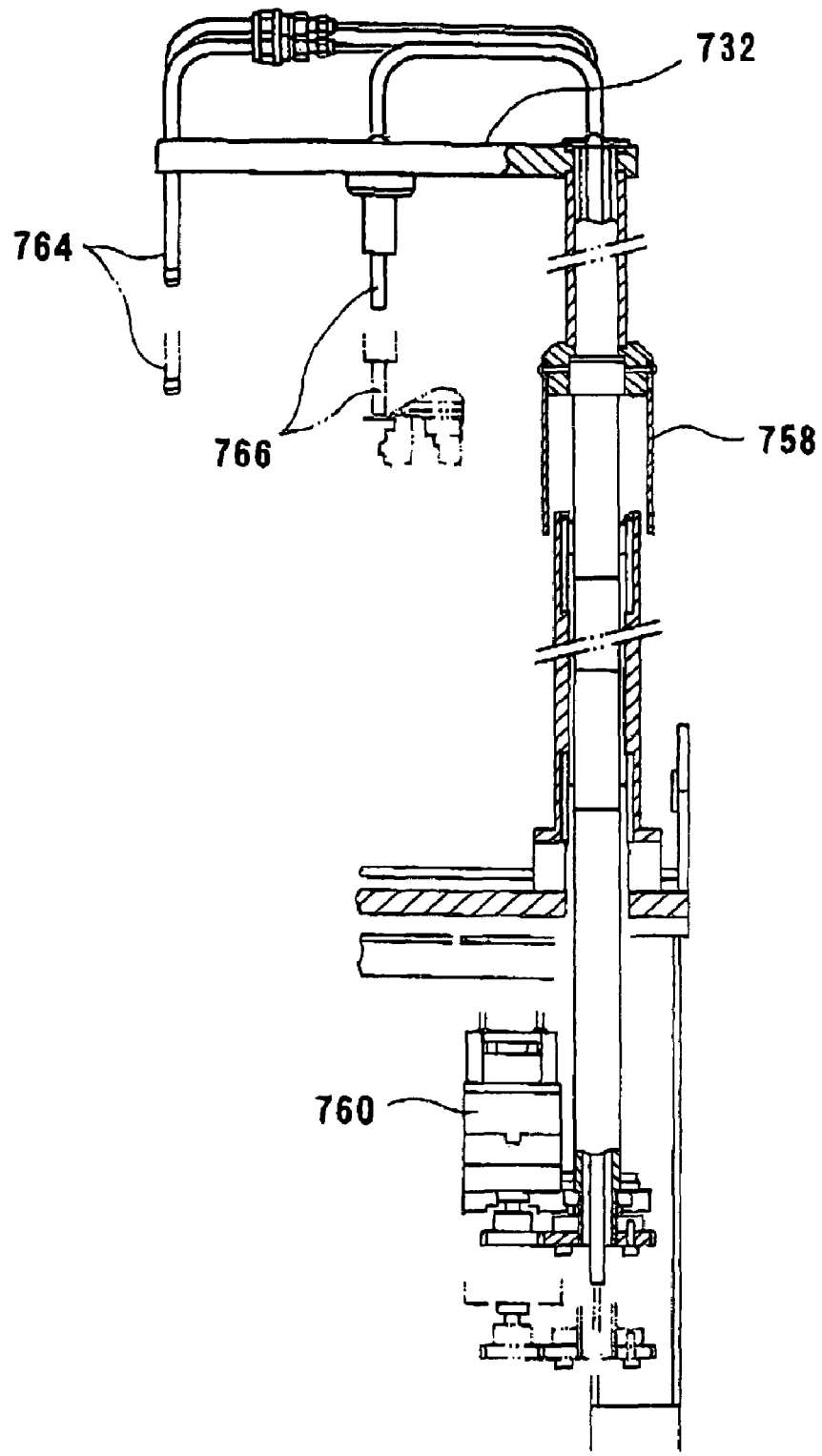
FIG. 33 is a front view of the pre-coating/recovering arm of the plating apparatus shown in FIG. 30.

As shown in FIG. 33, the pre-coating/recovering arm 732 is coupled to an upper end of a vertical support shaft 758. The pre-coating/recovering arm 732 is swingable by a rotary actuator 760 and is also vertically moveable by an air cylinder (not shown). The pre-coating/recovering arm 732 supports a pre-coating nozzle 764 for discharging a pre-coating liquid, on its free end side, and a plating solution recovering nozzle 766 for recovering the plating solution, on a portion closer to its proximal end. The pre-coating nozzle 764 is connected to a syringe that is actuatable by an air cylinder, for example, for intermittently discharging a pre-coating liquid from the pre-coating nozzle 764. The plating solution recovering nozzle 766 is connected to a cylinder pump or an aspirator, for example, to draw the plating solution on the substrate from the plating solution recovering nozzle 766.

Figure 34:
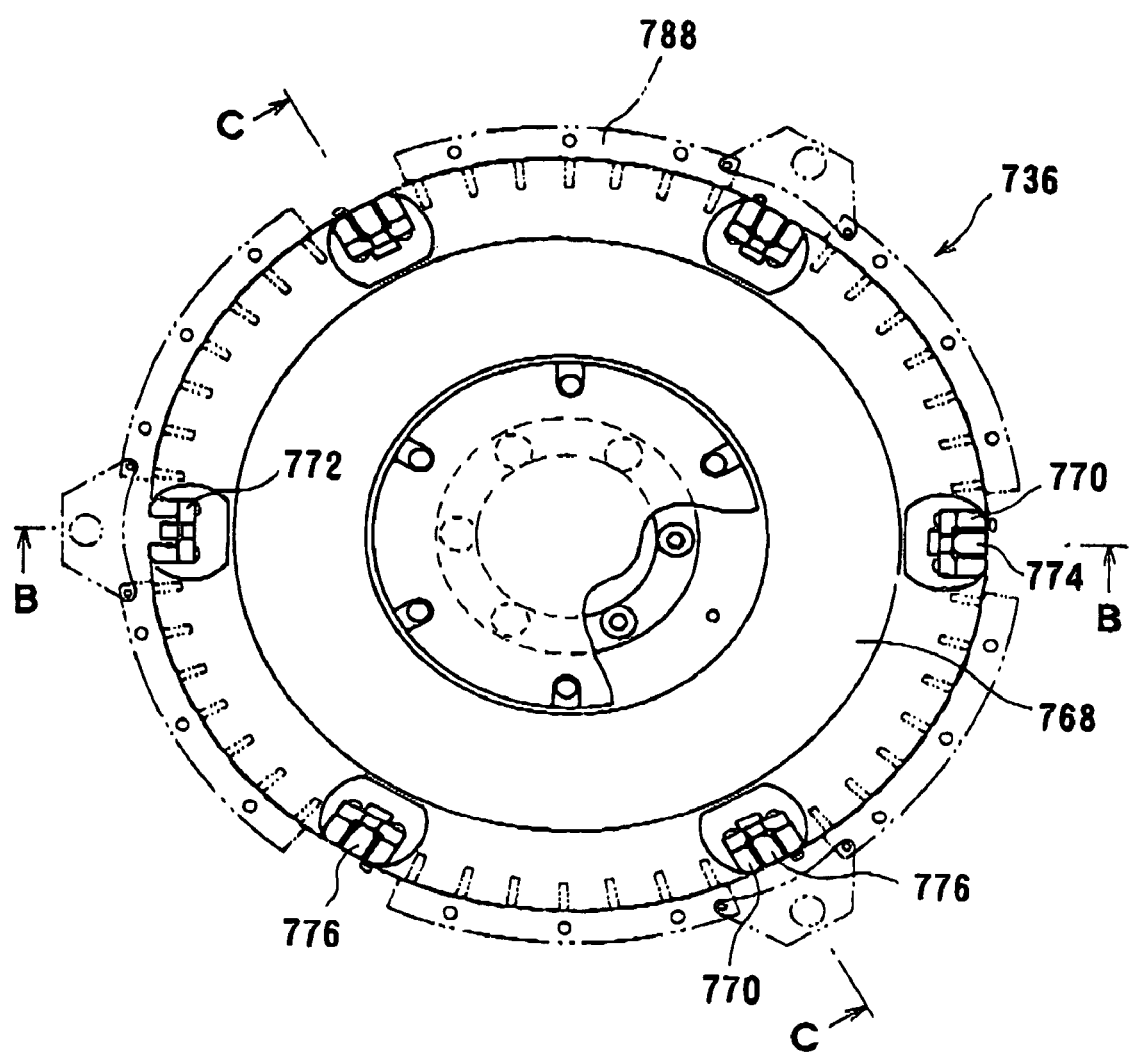
FIG. 34 is a plan view of the substrate holder of the plating apparatus shown in FIG. 30.
Figure 35:
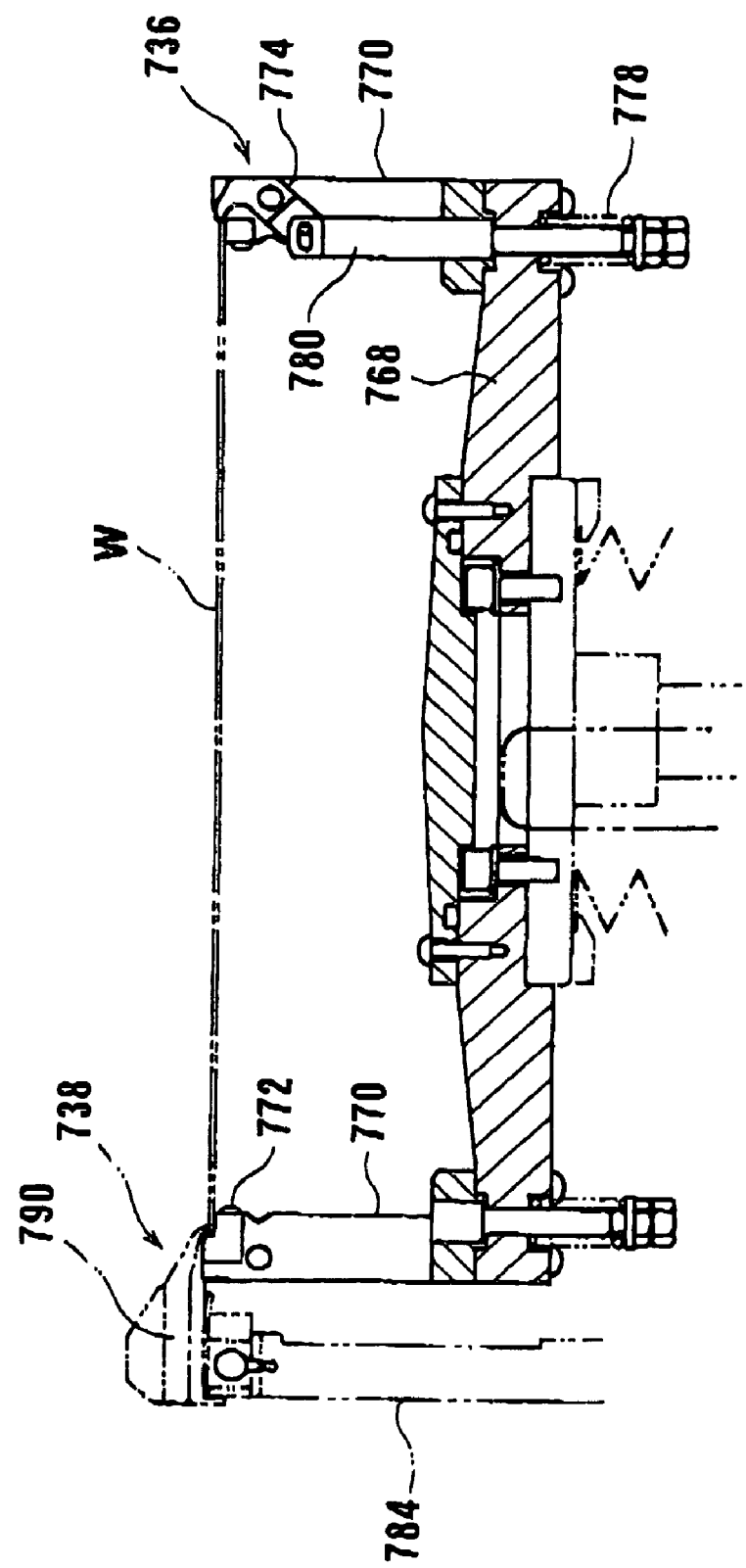
FIG. 35 is a cross-sectional view taken along the line B-B of FIG. 34.
Figure 36:
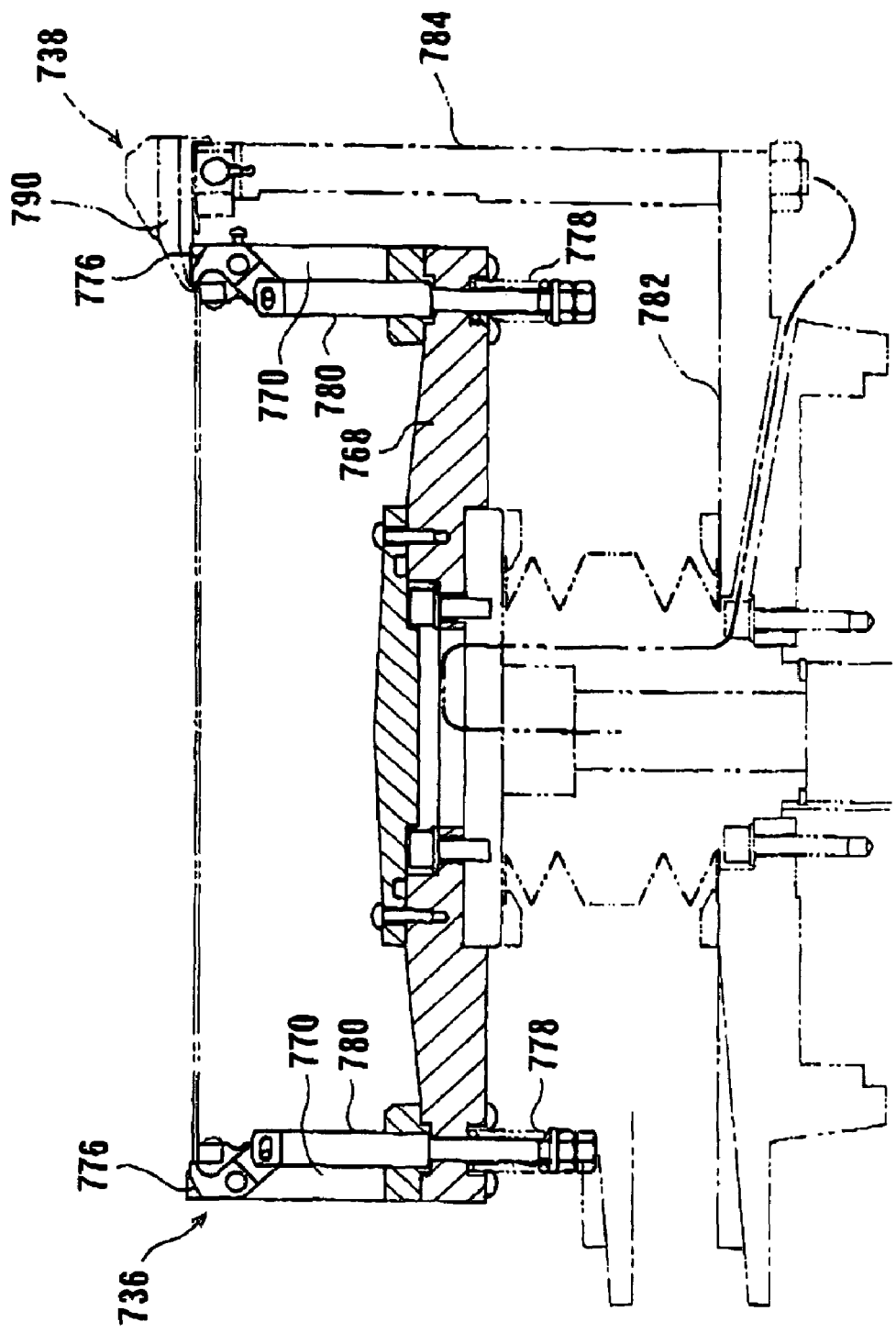
FIG. 36 is a cross-sectional view taken along the line C-C of FIG. 34.

As shown in FIGS. 34 through 36, the substrate holder 736 has a disk-shaped substrate stage 768 and six vertical support arms 770 disposed at spaced intervals on the circumferential edge of the substrate stage 768 for holding a substrate W in a horizontal plane on respective upper surfaces of the support arms 770. A positioning plate 772 is mounted on an upper end one of the support arms 770 for positioning the substrate by contacting the end face of the substrate. A pressing finger 774 is rotatably mounted on an upper end of the support arm 770, which is positioned opposite to the support arm 770 having the positioning plate 772, for abutting against an end face of the substrate W and pressing the substrate W to the positioning plate 772 when rotated. Chucking fingers 776 are rotatably mounted on upper ends of the remaining four support arms 770 for pressing the substrate W downwardly and gripping the circumferential edge of the substrate W.

The pressing finger 774 and the chucking fingers 776 have respective lower ends coupled to upper ends of pressing pins 780 that are normally urged to move downwardly by coil springs 778. When the pressing pins 780 are moved downwardly, the pressing finger 774 and the chucking fingers 776 are rotated radially inwardly into a closed position. A support plate 782 is disposed below the substrate stage 768 for engaging lower ends of the opening pins 780 and pushing them upwardly.

When the substrate holder 736 is located in the substrate transfer position A shown in FIG. 32, the pressing pins 780 are engaged and pushed upwardly by the support plate 782, so that the pressing finger 774 and the chucking fingers 776 rotate outwardly and open. When the substrate stage 768 is elevated, the opening pins 780 are lowered under the resiliency of the coil springs 778, so that the pressing finger 774 and the chucking fingers 776 rotate inwardly and close.

Figure 37:
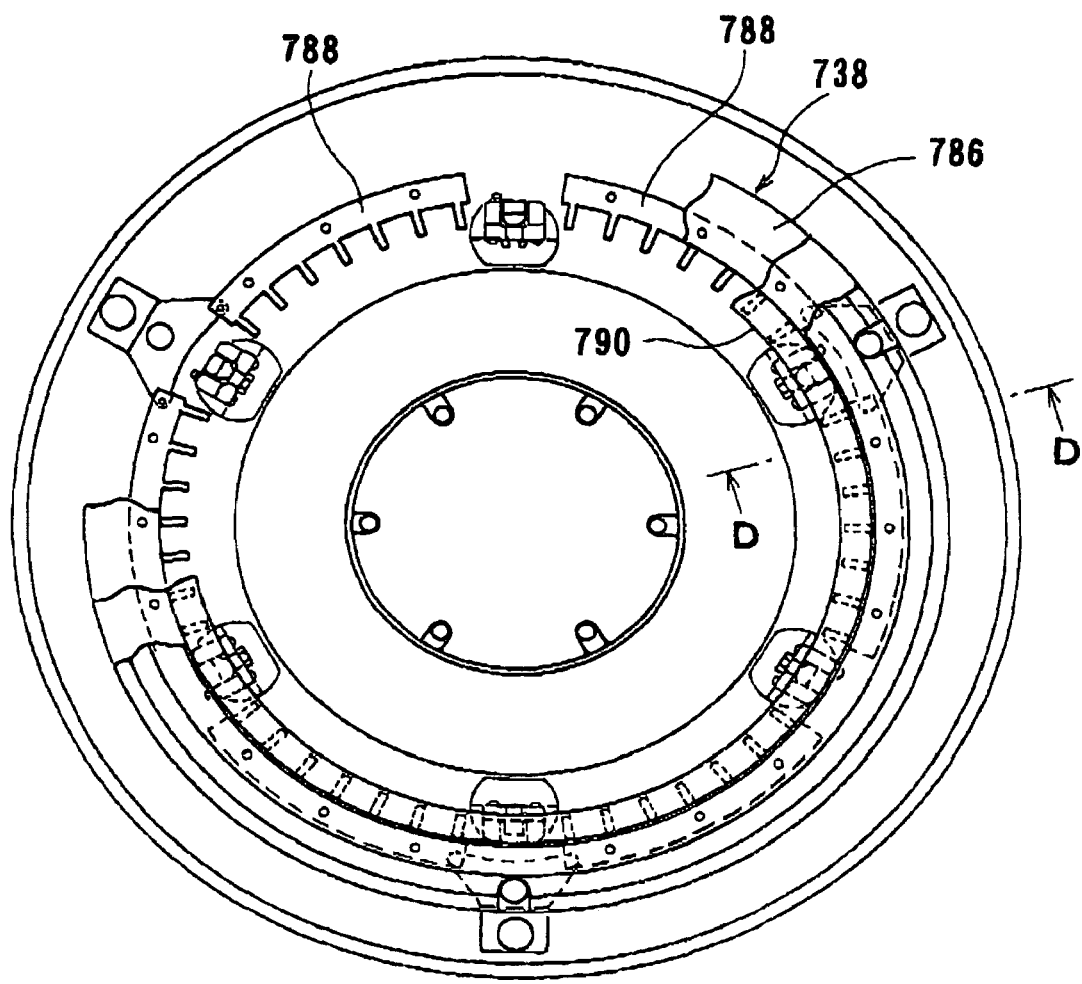
FIG. 37 is a plan view of the electrode portion of the plating apparatus shown in FIG. 30.
Figure 38:
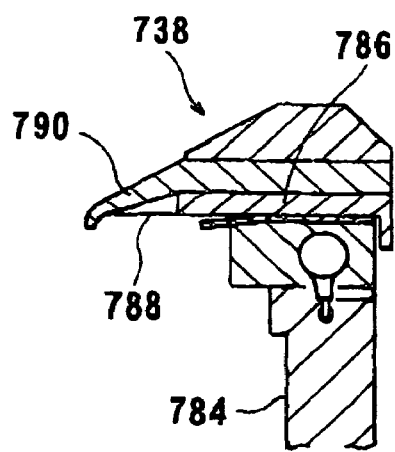
FIG. 38 is a cross-sectional view taken along the line D-D of FIG. 37.

As shown in FIGS. 37 and 38, the cathode portion 738 comprises an annular frame 786 fixed to upper ends of vertical support columns 784 mounted on the peripheral portion of the support plate 782 (see FIG. 36), a plurality of, six in this embodiment, cathodes 788 attached to a lower surface of the annular frame 786 and projecting inwardly, and an annular sealing member 790 mounted on an upper surface of the annular frame 786 in covering relation to upper surfaces of the cathodes 788. The sealing member 790 is adapted to have an inner peripheral portion inclined inwardly downwardly and progressively thin-walled, and to have an inner peripheral end suspending downwardly.

When the substrate holder 736 has ascended to the plating position B, as shown in FIG. 32, the cathodes 788 are pressed against the peripheral portion of the substrate W held by the substrate holder 736 for thereby allowing electric current to pass through the substrate W. At the same time, an inner peripheral portion of the sealing member 790 is brought into contact with an upper surface of the peripheral portion of the substrate W under pressure to seal its contact portion in a watertight manner. As a result, the plating solution supplied onto the upper surface (surface to be plated) of the substrate W is prevented from seeping from the end portion of the substrate W, and the plating solution is prevented from contaminating the cathodes 788.

In the present embodiment, the cathode portion 738 is vertically immovable, but rotatable in a body with the substrate holder 736. However, the cathode portion 738 may be arranged such that it is vertically movable and the sealing member 790 is pressed against the surface, to be plated, of the substrate W when the cathode portion 738 is lowered.

Figure 39:
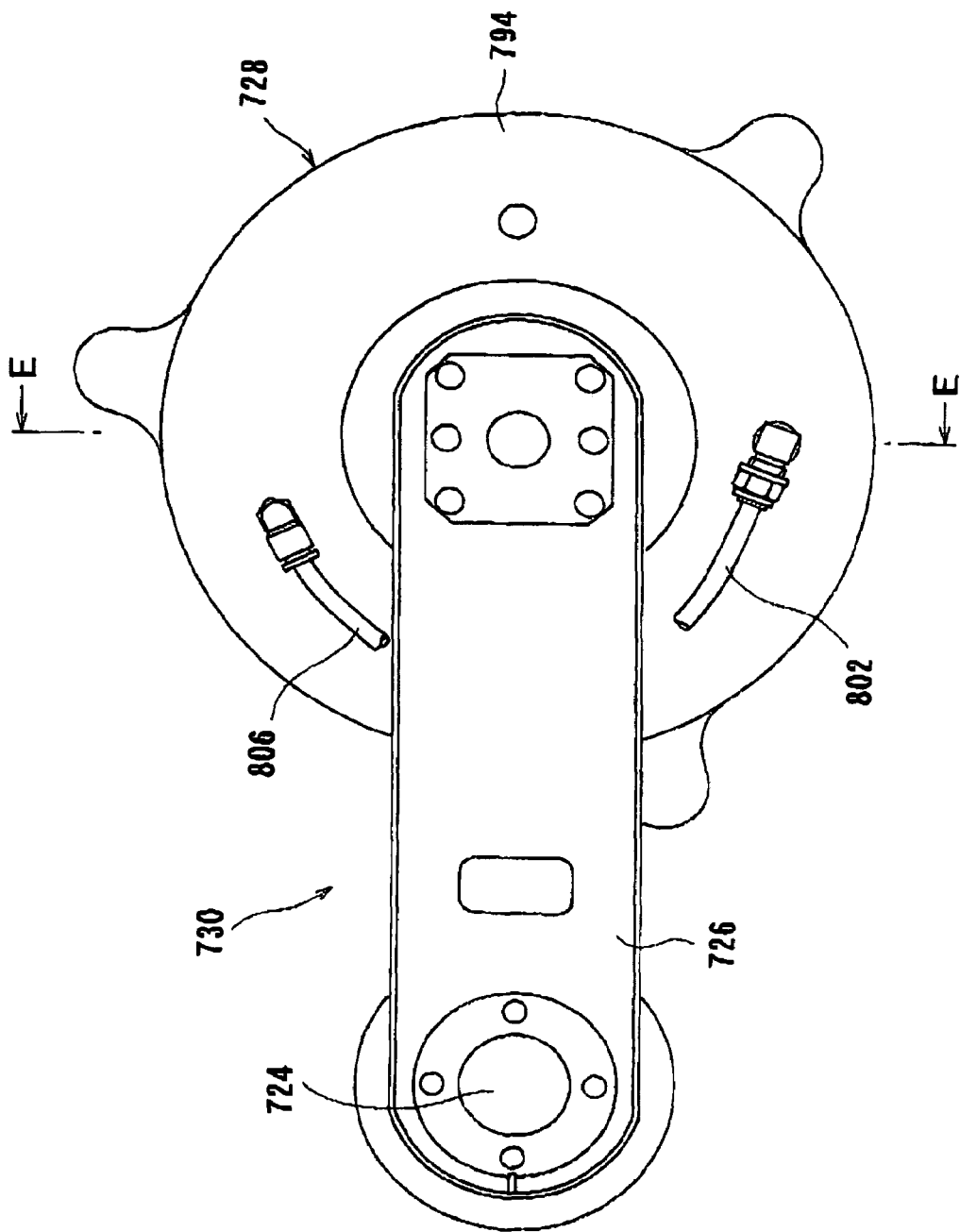
FIG. 39 is a plan view of the electrode arm section of the plating apparatus shown in FIG. 30.

As shown in FIGS. 39 and 40, the electrode head 728 of the electrode arm portion 730 includes an electrode holder 794 which is coupled via a ball bearing 792 to the free end of the swing arm 726, and a porous member 808 which is disposed such that it closes the bottom opening of the electrode holder 794. The porous member 808 comprises a plating solution impregnated material 810 serving to hold a plating solution mainly, and a porous pad 811 attached to a lower surface of the plating solution impregnated material 810. The electrode holder 794 has a downward-open and cup-like bottomed configuration having at its lower inside surface a recess portion 794a, while the plating solution impregnated material 810 has at its top a flange portion 810a which can engage with the recess portion 794a. The flange portion 810a is inserted into the recess portion 794a. The plating solution impregnated material 810 is thus held with the electrode holder 794, while a hollow plating solution chamber 800 is defined in the electrode holder 794.

As described above, since the porous member 808 has a multi-layered structure, it is possible to use the porous pad 811 which contacts the substrate, for example, and has a flatness enough to flatten irregularities on the surface, to be plated, of the substrate W.

On the other hand, the plating solution impregnated material 810, in this embodiment, is composed of porous ceramics of alumina having a porosity of 30%, and an average pore diameter of 100 µm, as with the preceding embodiment.

The plating solution impregnated material 810, which has the high resistance, is disposed in the plating solution chamber 800. Hence, the influence of the resistance of the seed layer 6 (see FIG. 1A) serving the feeding layer becomes a negligible degree. Consequently, the difference in current density over the surface of the substrate due to electrical resistance on the surface of the substrate W becomes small, and the uniformity of the plated film over the surface of the substrate improves.

An anode 798, which has a number of vertical pores 798a defined therein, is disposed in the plating solution chamber 800 above the porous member 808.

The electrode holder 794 supports on its upper portion a plating solution supply port 803 for supplying the plating solution into the plating solution chamber 800 and a plating solution discharge port 804 for discharging, under suction, the plating solution from the plating solution chamber 800. The plating solution supply port 803 is connected to a plating solution supply pipe 802 extending from the plating solution supply equipment 718 (see FIG. 30), and the plating solution discharge port 804 is connected to a plating solution discharge pipe 806 extending from the plating solution supply equipment 718.

A plating solution-pouring portion 820 is mounted on a peripheral wall of the electrode holder 794 at a position laterally of the anode 798 and the porous member 808. The plating solution-pouring portion 820, in this embodiment, comprises a tube having a lower end shaped as a nozzle, and is connected to a plating solution-pouring pipe 824 extending from a plating solution supply tank 822 of the plating solution supply equipment 718 (see FIG. 30). The plating solution supply tank 822 stores therein a plating solution (first plating solution) 826 that has been adjusted to a predetermined composition.

In this embodiment, the plating solution (first plating solution) 826 which is stored in the plating solution supply tank 822 and which is to be poured from the plating solution-pouring portion 820 is of such a composition that it has an increased additive concentration for excellent embedding properties on fine interconnect patterns. For example, the plating solution 826 comprises a solution (basic plating solution) containing a supporting electrolyte of sulfuric acid, sulfonic acid, pyrophosphoric acid, or chloride, or the like and a plating metal (copper), with the addition of various additives at predetermined concentrations such as a sulfide called an accelerator for accelerating the size reduction of deposited particles, a polymer called a suppressor for increasing an over voltage for depositing a plated metal such as copper or the like for more uniform electrodeposition, and a nitrogen compound called a leveler for retarding the deposition on raised regions to produce a flat plated layer. The plating solution 826 of such a composition is effective to increase the uniform electrodeposition and the leveling capability in the plating process.

The plating metal (copper) is made of copper sulfate, copper sulfide, copper chloride, or copper fluoride, for example.

When the substrate holder 736 is in plating position B (see FIG. 21), the electrode head 728 is lowered until the region between the substrate W held by the substrate holder 736 and the porous member 808 becomes about 0.5 to 3 mm, for example. Then the plating solution-pouring portion 820 pours the plating solution (first plating solution) 826 whose composition has been controlled in advance into a region between the substrate W and the porous member 808 from laterally of the anode 798 and the porous member 808. The nozzle at the lower end of the plating solution-pouring portion 820 is open toward a region between the sealing member 790 and the porous member 808. A shield ring 812 of rubber is mounted on the outer circumferential surface of the porous member 808 for electrically shielding the porous member 808.

The plating solution 826 poured from the plating solution-pouring portion 820 flows in one direction along the surface of the substrate W, as shown in FIG. 41. The flow of the plating solution 826 pushes and discharges the air out of the region between the substrate W and the porous member 808, filling the region with the fresh plating solution 826 whose composition has been adjusted that is poured from the plating solution-pouring portion 820. The plating solution 826 is now retained in the region defined between the substrate W and the sealing member 790.

Since the plating solution 826 is poured into the region between the substrate W and the porous member 808 from laterally of the anode 798 and the porous member 808, the plating solution 826 is introduced over the substrate W without the need for any parts responsible for disturbing the electric field distribution, such as an electrolyte supply tube made of an insulating material, within the porous member 808. Even if the substrate W has a large area, the electric field distribution over the entire surface of the substrate W is made more uniform, and when the plating solution 826 is poured, the plating solution 826 retained by the porous member 808 is prevented from leaking from the porous member 808. Therefore, the region across which the substrate W held by the substrate holder 736 and the porous member 808 facing each other is supplied with the fresh plating solution 826 whose composition has been adjusted.

In the plating apparatus 712, when the plating solution 826 is introduced, a reaction may occur which tends to prevent a plated film from being embedded or partially change the properties of a plated film. To prevent such a reaction, it is desirable to pour the plating solution 826 at a linear speed in the range from 0.1 to 10 m/sec. to complete the introduction of the plating solution over a wafer having a diameter of 300 mm, for example, within 5 seconds. The plating solution-pouring portion 820 should preferably be shaped to meet such a demand.

A basic plating solution-pouring portion 830 is mounted on the peripheral wall of the electrode holder 794 at a position laterally of the anode 798 and the porous member 808. The basic plating solution-pouring portion 830, in this embodiment, comprises a tube having a lower end shaped as a nozzle, and is connected to a basic plating solution-pouring pipe 834 extending from a basic plating solution supply tank 832. The basic plating solution supply tank 832 stores therein a solution (basic plating solution) 836 containing a supporting electrolyte of sulfuric acid, sulfonic acid, pyrophosphoric acid, or chloride, or the like and a plating metal (copper).

The basic plating solution-pouring portion 830 prepares a plating solution (second plating solution) 828 (see FIGS. 42A and 42B) which has additive concentrations, i.e., accelerator, suppressor, and leveler concentrations, lower than those of the plating solution (first plating solution) 826 by pouring the basic plating solution 836 into the plating solution (first plating solution) 826 that has been poured into the region between the substrate W held by the substrate holder 736 and the porous member 808, as described above. The nozzle at the lower end of the basic plating solution-pouring portion 830 is open toward the region between the sealing member 790 and the porous member 808.

The plating solution (second plating solution) 828, which has accelerator, suppressor, and leveler concentrations lower than those of the first plating solution 826, can easily be prepared simply by pouring the basic plating solution 836 into the plating solution (first plating solution) 826. The second plating solution 828 can be introduced into the region between the substrate W held by the substrate holder 736 and the porous member 808 for performing plating using the second plating solution 828.

In this embodiment, the second plating solution 828 whose accelerator, suppressor, and leveler concentrations are lower than those of the first plating solution 826 is prepared. However, only a desired additive of the accelerator, the suppressor, and the leveler, e.g., the leveler, may be added to the basic plating solution 836, and when the basic plating solution 836 is poured into the first plating solution 826, the concentration of the additive, e.g., the leveler, in the second plating solution 828 is prevented from being reduced, so that only the concentration of a particular additive may be reduced.

Since the second plating solution 828, which has the concentration of at least one of the accelerator, the suppressor, and the leveler lower than the first plating solution 826, is used, even if a plating solution having a composition for excellent embedding properties is used as the first plating solution 826, a plated film having higher surface flatness can be formed by plating using the second plating solution 828.

Operation of the substrate processing apparatus incorporating the plating apparatus 712 according to the above embodiment will be described below.

First, a substrate W to be plated is taken out from one of the loading/unloading stations 710 by the transfer robot 714, and transferred, with the surface to be plated facing upwardly, into one of the plating apparatus 712 through a substrate carry-in and carry-out opening defined in a side panel. At this time, the substrate holder 736 is in lower substrate transfer position A. After the hand of the transfer robot 714 has reached a position directly above the substrate stage 768, the transfer robot 714 lowers the hand to place the substrate W on the support arms 770. The hand of the transfer robot 714 is then retracted through the substrate carry-in and carry-out opening.

After the hand of the transfer robot 714 is retracted, the splash prevention cup 740 is elevated. Then, the substrate holder 736 is lifted from lower substrate transfer position A to pretreatment/cleaning position C. As the substrate holder 736 is lifted, the substrate w placed on the support arms 770 is positioned by the positioning plate 772 and the pressing finger 774, and then reliably gripped by the chucking fingers 776.

On the other hand, the electrode head 728 of the electrode arm portion 730 is in a normal position over the plating solution tray 722 now, and the porous member 808 or the anode 798 is positioned in the plating solution tray 722. At the same time that the splash prevention cup 740 ascends, plating solution starts being supplied to the plating solution tray 722 and the electrode head 728. Until the step of plating the substrate W is initiated, the new plating solution is supplied, and the plating solution discharge pipe 806 is evacuated to replace the plating solution in the porous member 808 and remove air bubbles from the plating solution in the porous member 808. When the ascending movement of the splash prevention cup 740 is completed, the substrate carry-in and carry-out openings in the side panel is closed by the splash prevention cup 740, isolating the atmosphere in the side panel and the atmosphere outside of the side panel from each other.

When the splash prevention cup 740 is elevated, the pre-coating step is initiated. Specifically, the substrate holder 736 that has received the substrate W is rotated, and the pre-coating/recovering arm 732 is moved from the retracted position to a position confronting the substrate W. When the rotational speed of the substrate holder 736 reaches a preset value, the pre-coating nozzle 764 mounted on the tip end of the pre-coating/recovering arm 732 intermittently discharges a pre-coating liquid which comprises a surfactant, for example, toward the surface (surface to be plated) of the substrate W. At this time, since the substrate holder 736 is rotating, the pre-coating liquid spreads all over the surface of the substrate W. Then, the pre-coating/recovering arm 732 is returned to the retracted position, and the rotational speed of the substrate holder 736 is increased to spin the pre-coating liquid off and dry the surface to be plated of the substrate W.

After the completion of the pre-coating step, the plating step is initiated. First, the substrate holder 736 is stopped against rotation, or the rotational speed thereof is reduced to a preset rotational speed for plating. In this state, the substrate holder 736 is lifted to plating position B. Then, the peripheral portion of, the substrate W is brought into contact with the cathodes 788, when it is possible to pass an electric current, and at the same time, the sealing member 790 is pressed against the upper surface of the peripheral portion of the substrate W, thus sealing the peripheral portion of the substrate W in a water-tight manner.

Based on a signal indicating that the pre-coating step for the loaded substrate W is completed, the electrode arm portion 730 is swung in a horizontal direction to displace the electrode head 728 from a position over the plating solution tray 722 to a position over the plating processing position. After the electrode head 728 reaches this position, the electrode head 728 is lowered toward the cathode portion 738 and stopped. At this time, the porous member 808 does not contact with the surface of the substrate W, but is held closely to the surface of the substrate W at a distance ranging from 0.5 mm to 3 mm. When the descent of the electrode head 728 is completed, a plating power source 814 is connected between the cathodes 788 and the anode 798. The plating solution (first plating solution) 826 is poured from the plating solution-pouring portion 820 into the region between the substrate W and the porous member 808, filling the region with the plating solution 826, thereby performing first plating onto the surface (surface to be plated) of the substrate W. If necessary, the substrate W is rotated with the substrate holder 736 for stirring the plating solution 826.

In this embodiment, the substrate holder 736 is rotated. However, the electrode head 794 may be rotated, or both the substrate holder 736 and the electrode head 794 may be rotated.

The first plating process which uses the first plating solution 826 is preferably carried out for an electrolyzing time and/or at a current density which is determined based on the size and density of the interconnect pattern formed on the surface of the substrate W. From the size and density of the interconnect pattern formed on the surface of the substrate W, an amount of electrolysis required to embed the interconnect pattern is calculated, and the electrolyzing time and/or the current density is changed to perform plating the substrate W to achieve better embedding properties and flatness.

Figure 42A:
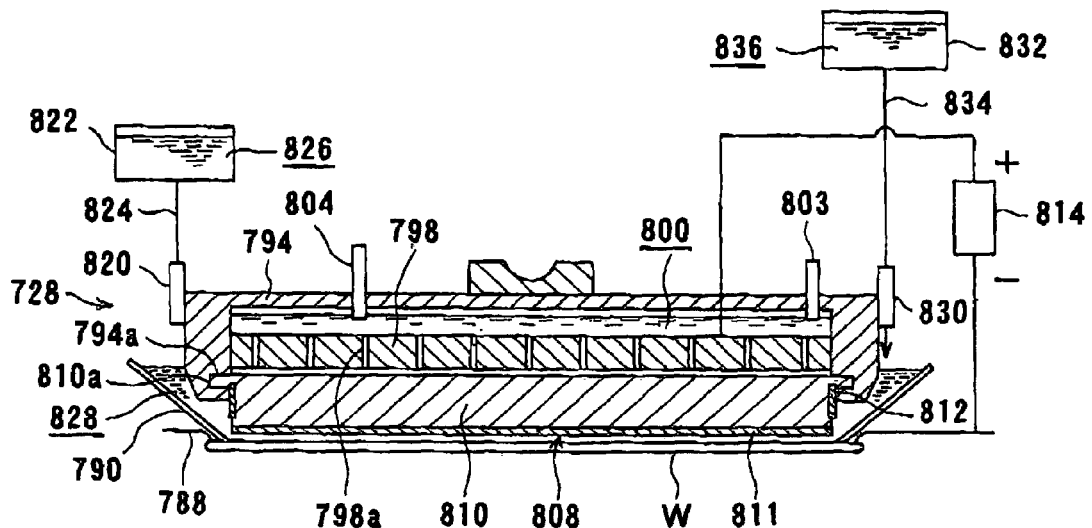
FIG. 42A is a cross-sectional view showing the plating apparatus as it prepares a second plating solution by pouring a basic plating solution into a first plating solution.

After the first plating process is finished, the plating power source 814 is disconnected form the cathodes 788 and the anode 798. Then, the basic plating solution 836 is poured from the basic plating solution-pouring portion 830 into the plating solution (first plating solution) 826 which has been poured into the region between the substrate W held by the substrate holder 736 and the porous member 808. In this manner, as shown in FIG. 42A, the plating solution (second plating solution) 828, which has additive concentrations, i.e., accelerator, suppressor, and leveler concentrations, lower than those of the plating solution (first plating solution) 826, is prepared and introduced into the region between the substrate W held by the substrate holder 736 and the porous member 808.

Figure 42B:
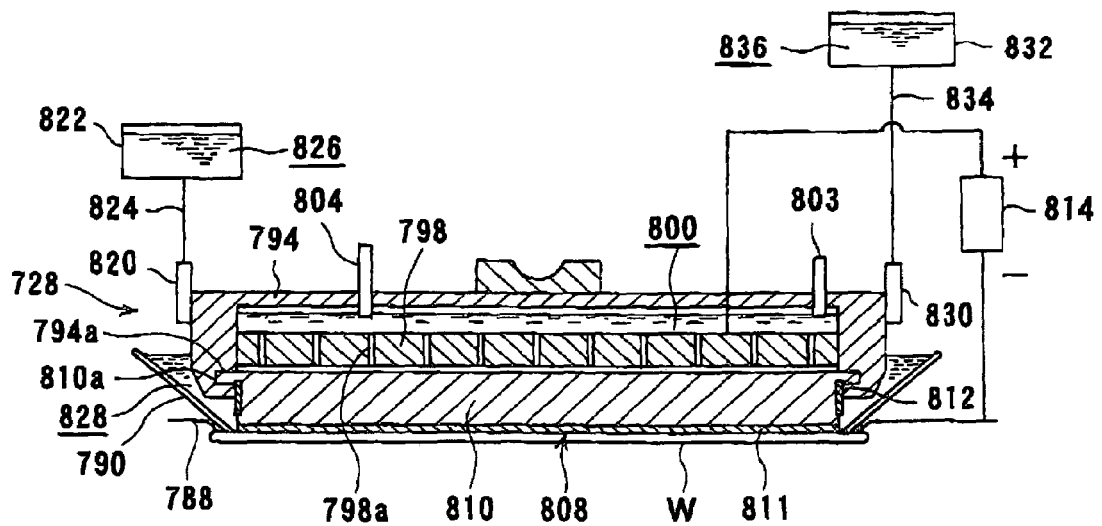
FIG. 42B is a cross-sectional view showing the plating apparatus as it performs a second plating process using the second plating solution.

Next, as shown in FIG. 42B, the cathode of the plating power source 814 is connected to the cathodes 788 and the anode of the plating power source 814 is connected to the anode 798. The electrode head 728 is lowered by the pressing actuator mechanism 850 to press the lower surface of the porous pad 811 of the porous member 808 against the upper surface (face side) of the substrate W held by the substrate holder 736, thereby plating the surface of the substrate W with the second plating solution 828 in a second plating process. At this time, if necessary, the substrate W may be rotated together with the substrate holder 736 to plate the substrate W while holding the porous pad 811 in close contact with the surface of the substrate W.

By thus plating the substrate W with the second plating solution 828 which has the concentration of at least one of the accelerator, the suppressor, and the leveler lower than the first plating solution 826, even if a plating solution having a composition for excellent embedding properties is used as the first plating solution 826, a plated film having higher surface flatness can be formed by a plating process using the second plating solution 828. Furthermore, the flatness of the surface of the plated film can be increased by holding the porous pad 811 in contact with the surface of the substrate W held by the substrate holder 736.

The second plating process using the second plating solution 828 is preferably performed while monitoring a film thickness of the plated film deposited on a particular interconnect pattern on the surface of the substrate W. Better embedding properties and flatness can be achieved by thus monitoring the film thickness of the plated film deposited on a particular interconnect pattern, controlling an amount of electrolysis, and confirming the deposition of a plated film having a particular film thickness.

When the plating process is completed, the electrode arm portion 730 is raised and then swung to return to the position above the plating solution tray 722 and to lower to the ordinary position. Then, the pre-coating/recovering arm 732 is moved from the retreat position to the position confronting to the substrate W, and lowered to recover the remainder of the plating solution on the substrate W by a plating solution recovering nozzle 766. After recovering of the remainder of the plating solution is completed, the pre-coating/recovering arm 732 is returned to the retreat position, and pure water is supplied from the fixed nozzle 734 for supplying pure water toward the central portion of the substrate W for rinsing the plated surface of the substrate. At the same time, the substrate holder 736 is rotated at an increased speed to replace the plating solution on the surface of the substrate W with pure water. Rinsing the substrate W in this manner prevents the splashing plating solution from contaminating the cathodes 788 of the cathode portion 738 during descent of the substrate holder 736 from plating position B.

After completion of the rinsing, the washing with water step is initiated. That is, the substrate holder 736 is lowered from plating position B to pretreatment/cleaning position C. Then, while pure water is supplied from the fixed nozzle 734 for supplying pure water, the substrate holder 736 and the cathode portion 738 are rotated to perform washing with water. At this time, the sealing member 790 and the cathodes 788 can also be cleaned, simultaneously with the substrate W, by pure water directly supplied to the cathode portion 738, or pure water scattered from the surface of the substrate W.

After washing with water is completed, the drying step is initiated. That is, supply of pure water from the fixed nozzle 734 is stopped, and the rotational speed of the substrate holder 736 and the cathode portion 738 is further increased to remove pure water on the surface of the substrate w by centrifugal force and to dry the surface of the substrate W. The sealing member 790 and the cathodes 788 are also dried at the same time. Upon completion of the drying, the rotation of the substrate holder 736 and the cathode portion 738 is stopped, and the substrate holder 736 is lowered to substrate transfer position A. Thus, the gripping of the substrate W by the chucking fingers 776 is released, and the substrate W is just placed on the upper surfaces of the support arms 770. At the same time, the splash prevention cup 740 is also lowered.

All the steps including the plating step, the pretreatment step accompanying the plating step, the cleaning step, and the drying step are now finished. The transfer robot 714 inserts its hand through the substrate carry-in and carry-out opening into the position beneath the substrate W, and raises the hand to receive the plated substrate W from the substrate holder 736. Then, the transfer robot 714 returns the plated substrate W received from the substrate holder 736 to one of the loading/unloading stations 710.

In this embodiment, the plating process which uses the plating solution (first plating solution) 826 poured into the region between the substrate W held by the substrate holder 736 and the porous member 808, and the plating process which uses the plating solution (second plating solution) 828 having lower additive concentrations that is prepared by pouring the basic plating solution 836 into the plating solution 826 poured into the region between the substrate W held by the substrate holder 736 and the porous member 808 are successively performed in the same plating cell. Since the plating process which uses the plating solution having higher additive concentrations for better embedding properties with respect to fine interconnect patterns and the plating process which uses the plating solution having lower additive concentrations for better flatness are successively performed in the same plating cell, the footprint is reduced and the processing period is shortened for forming a plated film having good embedding properties and a flat surface efficiently within a small space.

Figure 43:
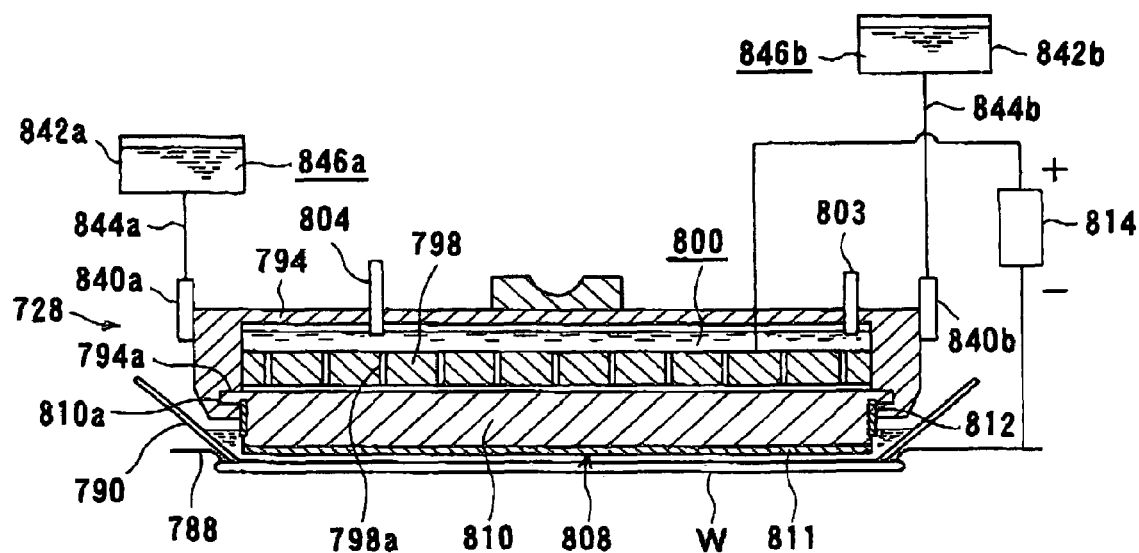
FIG. 43 is a cross-sectional view of essential parts of a plating apparatus according to still another embodiment of the present invention.

FIG. 43 shows a plating apparatus according to still another embodiment of the present invention. The plating apparatus according to the present embodiment differs from the plating apparatus according to the previous embodiment as follows:

A first plating solution-pouring portion 840a is mounted on the peripheral wall of the electrode holder 794 at a position laterally of the anode 798 and the porous member 808. The first plating solution-pouring portion 840a, in this embodiment, comprises a tube having a lower end shaped as a nozzle, and is connected to a plating solution-pouring pipe 844a extending from a first plating solution supply tank 842a. The first plating solution supply tank 842a stores therein a first plating solution 146a that has been adjusted to a predetermined composition.

A second plating solution-pouring portion 840b is mounted on the peripheral wall of the electrode holder 794 at a position laterally of the anode 798 and the porous member 808. The second plating solution-pouring portion 840b, in this embodiment, comprises a tube having a lower end shaped as a nozzle, and is connected to a plating solution-pouring pipe 844b extending from a second plating solution supply tank 842b. The second plating solution supply tank 842b stores therein a second plating solution 846b that has been adjusted to a predetermined composition which is different from the composition of the first plating solution 846a.

The second plating solution 846b is of such a composition that the concentration of an additive, i.e., the concentration of at least one of an accelerator, a suppressor, and a leveler, is lower than that of the first plating solution 846a.

In the plating apparatus according to this embodiment shown in FIG. 43, as with the preceding embodiment, the porous member 808 is lowered out of contact with the surface of the substrate W, but positioned closely thereto at a distance ranging from 0.5 mm to 3 mm. The plating power source 814 is connected between the cathodes 788 and the anode 798. The first plating solution 846a is poured from the first plating solution-pouring portion 840a into the region between the substrate W and the porous member 808. If necessary, the substrate W is rotated. The surface to be plated of the substrate W is now plated by a first plating process using the first plating solution 846a.

After the first plating process is finished, as with the preceding embodiment, the plating solution (first plating liquid) remaining on the surface of the substrate W is recovered, the surface of the substrate W is washed and dried. If necessary, the surface of the substrate W is treated to make itself hydrophilic or etched or the like.

Thereafter, the porous member 808 is lowered to a predetermined position, and the plating power source 814 is connected between the cathodes 788 and the anode 798. The second plating solution-pouring portion 840b pours the second plating solution 846b into the region between the substrate W and the porous member 808. The electrode head 728 is further lowered by the pressing actuator mechanism 850 to press the lower surface of the porous pad 811 of the porous member 808 against the upper surface (face side) of the substrate W held by the substrate holder 736, and the substrate W is rotated if necessary, thereby plating the surface of the substrate W with the second plating solution 828 in a second plating process.

The subsequent processing operation is the same as with the previous embodiment.

In this embodiment, the first plating process which uses the first plating solution 846a poured into the region between the substrate W held by the substrate holder 736 and the porous member 808, and the second plating process which uses the second plating solution 846b, which has a composition different from the first plating solution 846a, poured into the region between the substrate W held by the substrate holder 736 and the porous member 808 are successively performed in the same plating cell. Since the first plating process which uses the first plating solution 846a for better embedding properties with respect to fine interconnect patterns and the second plating process which uses the second plating solution 846b for better flatness are successively performed in the same plating cell, the footprint is reduced and the processing period is shortened for forming a plated film having good embedding properties and a flat surface efficiently within a small space. In addition, plating solutions of different compositions which are suited to the characteristics of the first and second plating processes, respectively, can be used as desired in the first and second plating processes, respectively.

According to the present invention, both embedding properties and plated film surface flatness can be achieved at the time a metal (interconnect material) such as copper is embedded in dense fine interconnect patterns and wide interconnect patterns. The footprint is reduced and the processing period is shortened for forming a plated film having good embedding properties and a flat surface efficiently within a small space.

What is claimed is:

1. A method of embedding an interconnect material in an interconnect recess formed in a surface of a substrate by electroplating, comprising:
    performing a first plating process on the surface of the substrate, including:
        (i) filling a plating solution between an anode and the surface of the substrate which is disposed so as to face the anode, and
        (ii) passing a current between the anode and the surface of the substrate to form an initially-plated surface of the substrate; and then
    performing a second plating process on the initially-plated surface of the substrate, including:
        (i) filling a plating solution between the anode and the initially-plated surface of the substrate which is disposed so as to face the anode, with a porous member placed in the plating solution,
        (ii) repeatedly bringing the porous member and the initially-plated surface of the substrate into and out of contact with each other, and
        (iii) passing a current between the anode and the initially-plated surface of the substrate only when the porous member is being held in contact with the initially-plated surface of the substrate so as to form a plated surface of the substrate.

2. A method according to claim 1, wherein the interconnect material comprises copper, and the plating solution used in the first plating process is of the same composition as the plating solution used in the second plating process.

3. A method according to claim 1, wherein the interconnect material comprises copper, the first plating process is performed using a plating solution having better embedding properties than the plating solution of the second plating process, and the second plating process is performed using a plating solution having better leveling capability than the plating solution of the first plating process.

4. A method according to claim 1, wherein in the first plating process, the current passed between the anode and the surface of the substrate is changed stepwise.

5. A method according to claim 1, wherein in the second plating process, a process of passing a current having a current density ranging from 1 to 50 mA/cm2 between the initially-plated surface of the substrate and the anode for a period of time ranging from 0.1 to 100 seconds while the initially-plated surface of the substrate is being held in contact with the porous member, and a process of stopping the current from flowing between the initially-plated surface of the substrate and the anode and releasing the initially-plated surface of the substrate from the porous member for a period of time ranging from 0.1 to 100 seconds are alternately repeated.

6. A method according to claim 5, wherein after the initially-plated surface of the substrate and the porous member are moved relatively to each other while being held in contact with each other, the current is passed between the initially-plated surface of the substrate and the anode.

7. A method according to claim 5, wherein the current density of the current flowing between the surface of the substrate and the anode is increased with time.

8. A method according to claim 7, wherein after the initially-plated surface of the substrate and the porous member are moved relatively to each other while being held in contact with each other, the current is passed between the initially-plated surface of the substrate and the anode.

9. A method according to claim 1, further comprising:
    cleaning the initially-plated surface of the substrate between the first plating process and the second plating process.

10. A plating method of embedding an interconnect material in an interconnect recess formed in a surface of a substrate by electroplating, said method comprising:
    performing a first plating process on the surface of the substrate with a first plating solution while spacing the substrate and a porous member made of a water-retentive material from each other by a predetermined distance so as to form an initially-plated surface of the substrate; and then
    performing a second plating process on the initially-plated surface of the substrate with a second plating solution, which has a composition different from the first plating solution, while bringing the substrate and the porous member into contact with each other.

11. A plating method according to claim 10, wherein the first plating process is performed while the substrate and the porous member are being moved relatively to each other.

12. A plating method according to claim 10, wherein the second plating process is performed while the substrate and the porous member are being moved relatively to each other.

13. A plating method according to claim 10, wherein the first plating solution contains an accelerator, a suppressor, and a leveler added as additives thereto.

14. A plating method according to claim 13, wherein the second plating solution contains an additive which comprises, at a reduced concentration, at least one of the additives added to the first plating solution, or does not contain at least one of the additives added to the first plating solution.

15. A plating method according to claim 14, wherein after the first plating process is finished, a basic plating solution is poured into the first plating solution, which has been used, to prepare the second plating solution.

16. A plating method according to claim 15, wherein the first plating solution and the basic plating solution contain a supporting electrolyte comprising sulfuric acid, sulfonic acid, pyrophosphoric acid, or chloride.

17. A plating method according to claim 15, wherein the basic plating solution contains an optional one of the additives contained in the first plating solution.

18. A plating method according to claims 10, wherein switching the first plating solution for the second plating solution is performed between the first plating process and the second plating process.

19. A plating method according to claim 18, wherein the initially-plated surface of the substrate is washed with water and dried when switching of plating solutions is performed between the first plating process and the second plating process.

20. A plating method according to claim 19, wherein the initially-plated surface of the substrate is chemically treated after the surface of the substrate is washed with water and dried.

21. A plating method according to claim 10, wherein the first plating process is performed for an electrolyzing time and/or at a current density which is determined based on the size and density of an interconnect pattern formed on the surface of the substrate.

22. A plating method according to claim 10, wherein the second plating process is performed while monitoring the film thickness of a plated film deposited on a particular interconnect pattern on the initially-plated surface of the substrate.

23. A plating method according to claim 10, wherein the interconnect material comprises copper and is made of copper sulfate, copper sulfide, copper chloride, or copper fluoride.

* * * * *